US 12,052,854 B2

(12) United States Patent
Okajima

(10) Patent No.: US 12,052,854 B2
(45) Date of Patent: Jul. 30, 2024

(54) SEMICONDUCTOR MEMORY DEVICE

(71) Applicant: Kioxia Corporation, Tokyo (JP)

(72) Inventor: Mutsumi Okajima, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/466,573

(22) Filed: Sep. 3, 2021

(65) Prior Publication Data
US 2022/0310612 A1 Sep. 29, 2022

(30) Foreign Application Priority Data
Mar. 23, 2021 (JP) ................. 2021-049320

(51) Int. Cl.
*H10B 12/00* (2023.01)
*H01L 21/02* (2006.01)
*H01L 29/24* (2006.01)

(52) U.S. Cl.
CPC ....... *H10B 12/30* (2023.02); *H01L 21/02565* (2013.01); *H01L 29/24* (2013.01); *H10B 12/03* (2023.02); *H10B 12/05* (2023.02)

(58) Field of Classification Search
CPC ... H01L 21/02565; H01L 29/24; H10B 12/03; H10B 12/05; H10B 12/30; H10B 12/488; H10B 53/00; H10B 53/30
See application file for complete search history.

(56) References Cited

U.S. PATENT DOCUMENTS

| | | | |
|---|---|---|---|
| 10,600,469 B2 | 3/2020 | Kimura et al. | |
| 10,607,995 B2 | 3/2020 | Roberts et al. | |
| 10,692,869 B2 | 6/2020 | Takemura et al. | |
| 10,784,272 B2 | 9/2020 | Lee et al. | |
| 10,825,815 B2 | 11/2020 | Tang et al. | |
| 10,910,378 B2 | 2/2021 | Lee et al. | |
| 2018/0374529 A1* | 12/2018 | Kimura | H01L 27/1052 |
| 2020/0083225 A1 | 3/2020 | Ma et al. | |
| 2020/0211631 A1 | 7/2020 | Karda et al. | |
| 2020/0212041 A1 | 7/2020 | Machkaoutsan et al. | |

(Continued)

FOREIGN PATENT DOCUMENTS

| | | | |
|---|---|---|---|
| JP | 2018-085508 A | 5/2018 | |
| JP | 2019-008862 A | 1/2019 | |

(Continued)

*Primary Examiner* — Nicholas J Tobergte
*Assistant Examiner* — Kevin Quinto
(74) *Attorney, Agent, or Firm* — Foley & Lardner LLP

(57) ABSTRACT

A semiconductor memory device includes a plurality of memory portions arranged in a first direction, a plurality of semiconductor layers arranged in the first direction and electrically connected to the plurality of memory portions respectively, a plurality of gate electrodes arranged in the first direction and opposed to the plurality of semiconductor layers respectively, a gate insulating film disposed between the plurality of semiconductor layers and the plurality of gate electrodes, a first wiring extending in the first direction and connected to the plurality of gate electrodes, and a plurality of second wirings arranged in the first direction and connected to the plurality of semiconductor layers respectively. The plurality of semiconductor layers are opposed to surfaces on one side and the other side of each of the plurality of gate electrodes in the first direction via the gate insulating film.

20 Claims, 63 Drawing Sheets

(56) References Cited

U.S. PATENT DOCUMENTS

| | | | |
|---|---|---|---|
| 2020/0227416 A1 | 7/2020 | Lilak et al. | |
| 2020/0227418 A1 | 7/2020 | Kim et al. | |
| 2020/0251151 A1 | 8/2020 | Kang et al. | |
| 2020/0279601 A1 | 9/2020 | Kim et al. | |
| 2022/0013524 A1* | 1/2022 | Ryu | H01L 27/13 |
| 2022/0139916 A1* | 5/2022 | Kwak | H10B 12/30 |
| | | | 257/300 |

FOREIGN PATENT DOCUMENTS

| | | | |
|---|---|---|---|
| JP | 2019-096866 A | 6/2019 | |
| JP | 2019-140382 A | 8/2019 | |

* cited by examiner

SEMICONDUCTOR MEMORY DEVICE

CROSS-REFERENCE TO RELATED APPLICATIONS

This application is based upon and claims the benefit of Japanese Patent Application No. 2021-049320, filed on Mar. 23, 2021, the entire contents of which are incorporated herein by reference.

BACKGROUND

Field

Embodiments described herein relate generally to a semiconductor memory device.

Description of the Related Art

In accordance with an increasing high integration of a semiconductor memory device, an examination for converting the semiconductor memory device into a three-dimensional form has been in progress.

DETAILED DESCRIPTION

Figure 1:
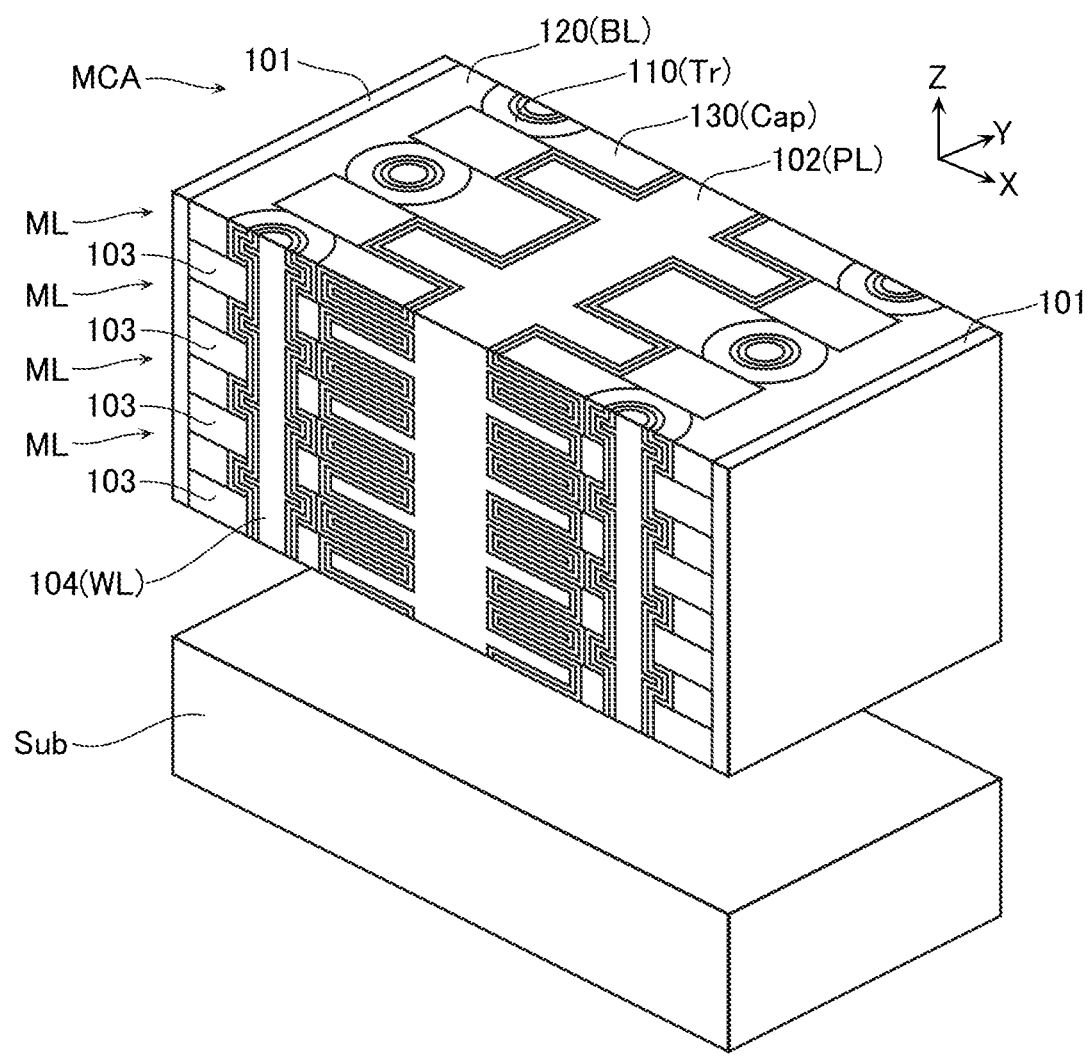
FIG. 1 is a schematic perspective view illustrating a configuration of a part of a semiconductor memory device according to a first embodiment.

A semiconductor memory device according to one embodiment comprises a plurality of memory portions arranged in a first direction, a plurality of semiconductor layers arranged in the first direction and electrically connected to the plurality of memory portions respectively, a plurality of gate electrodes arranged in the first direction and opposed to the plurality of semiconductor layers respectively, a gate insulating film disposed between the plurality of semiconductor layers and the plurality of gate electrodes, a first wiring extending in the first direction and connected to the plurality of gate electrodes, and a plurality of second wirings arranged in the first direction and connected to the plurality of semiconductor layers respectively. The plurality of semiconductor layers are opposed to surfaces on one side and the other side of each of the plurality of gate electrodes in the first direction via the gate insulating film.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, a direction parallel to an upper surface of a substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as aside surface and the like.

First Embodiment

[Configuration]

Figure 2:
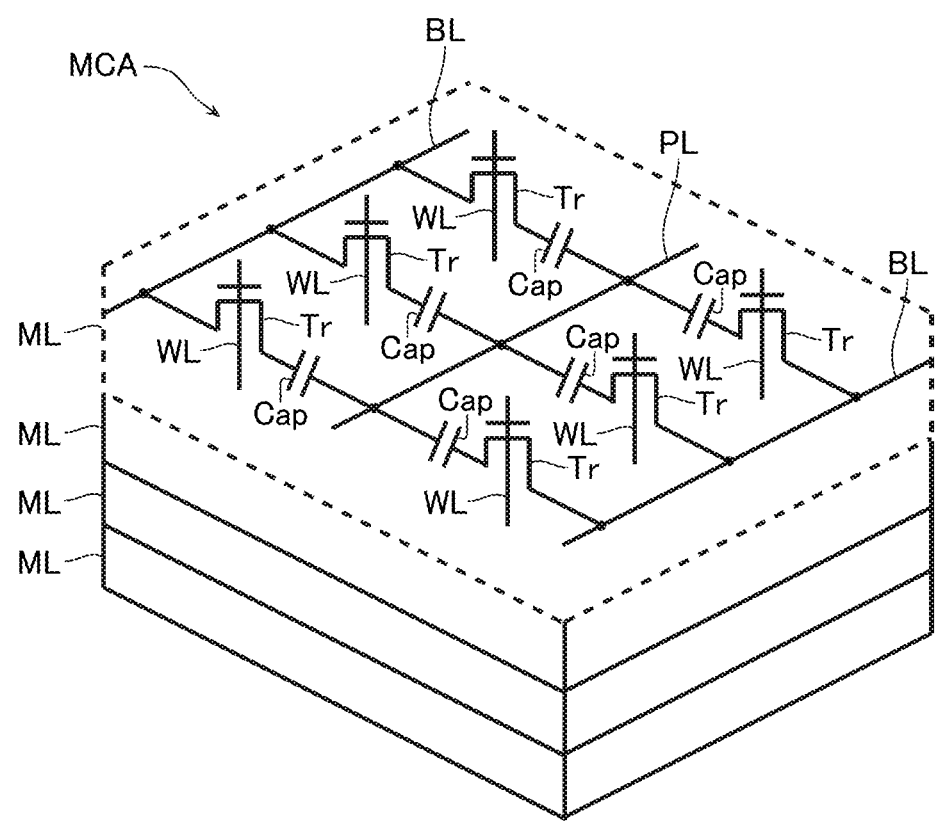
FIG. 2 is a schematic circuit diagram illustrating a configuration of a part of the semiconductor memory device.
Figure 3:
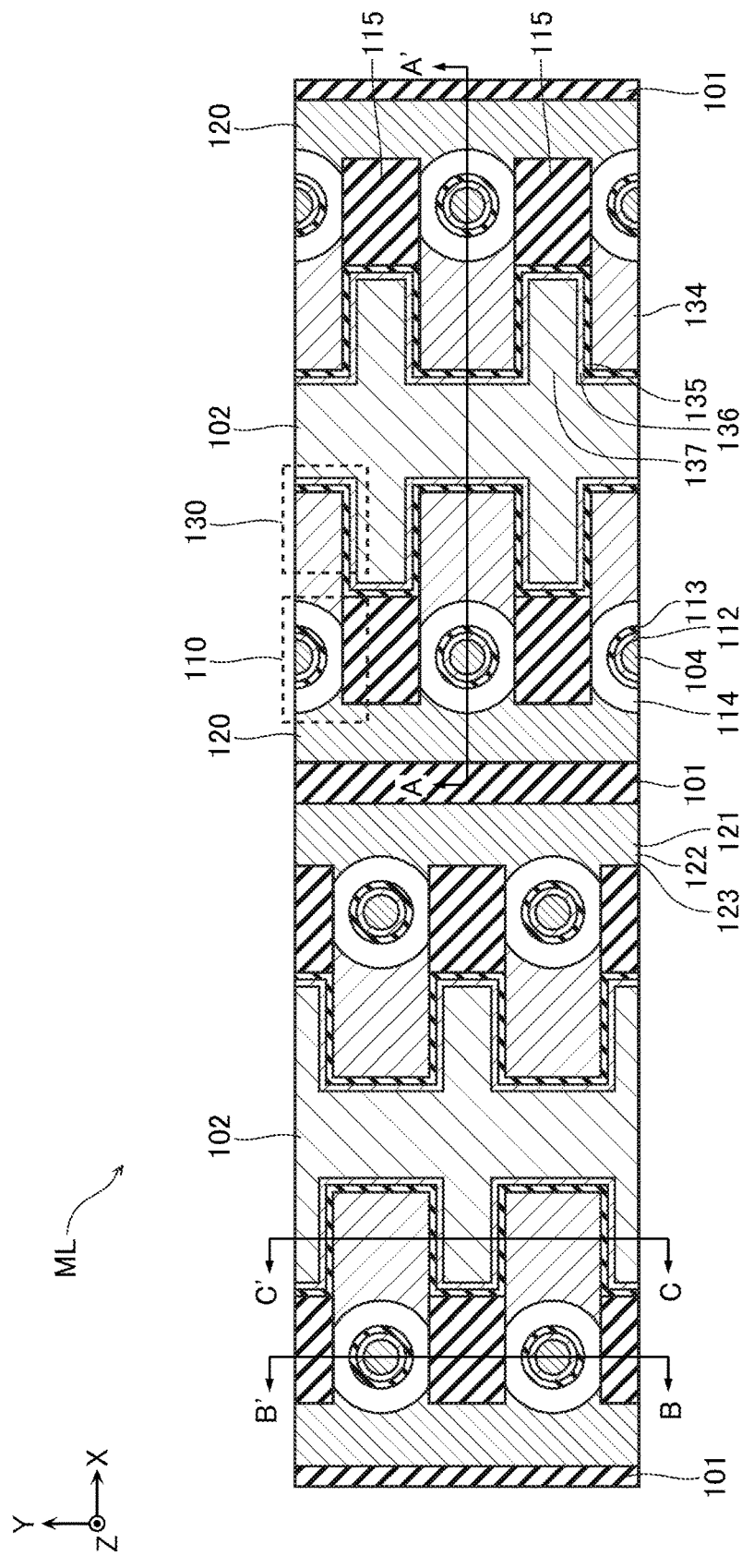
FIG. 3 is a schematic X-Y cross-sectional view illustrating a configuration of a part of the semiconductor memory device.
Figure 4:
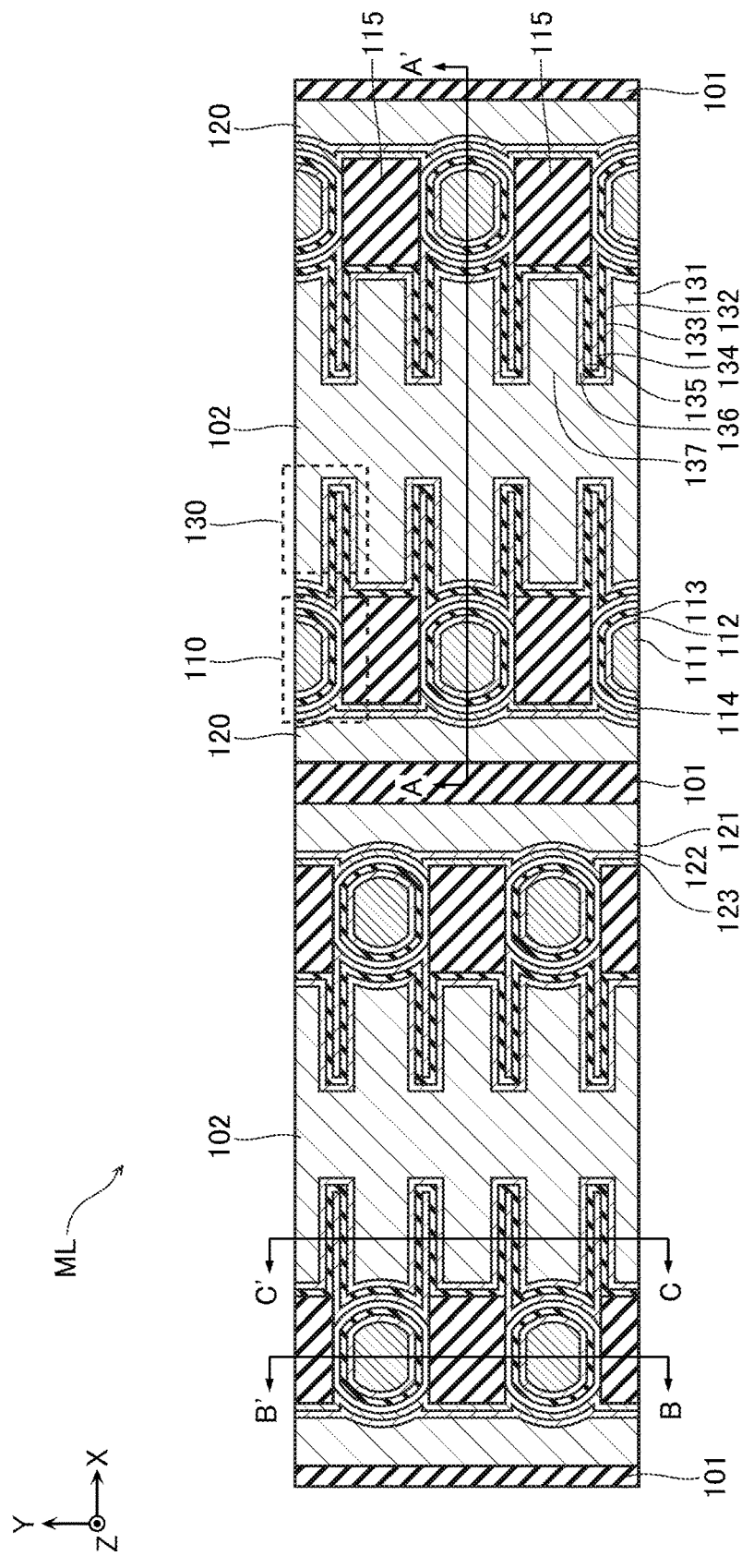
FIG. 4 is a schematic X-Y cross-sectional view illustrating a configuration of a part of the semiconductor memory device.
Figure 5:
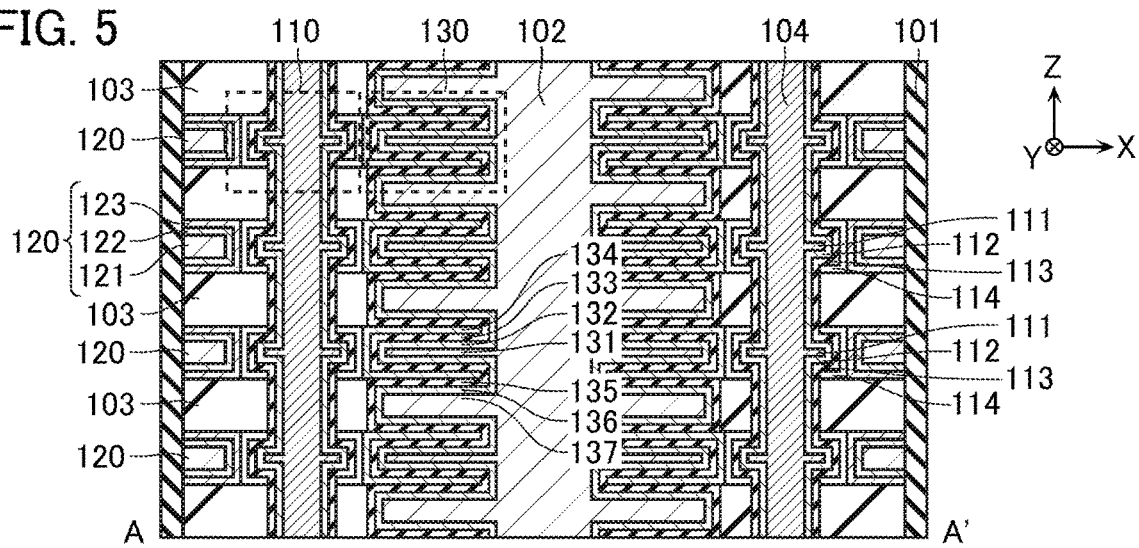
FIG. 5 is a schematic X-Z cross-sectional view of a configuration illustrated in FIG. 3 and FIG. 4 taken along the line A-A' and viewed along an arrow direction.
Figure 6:
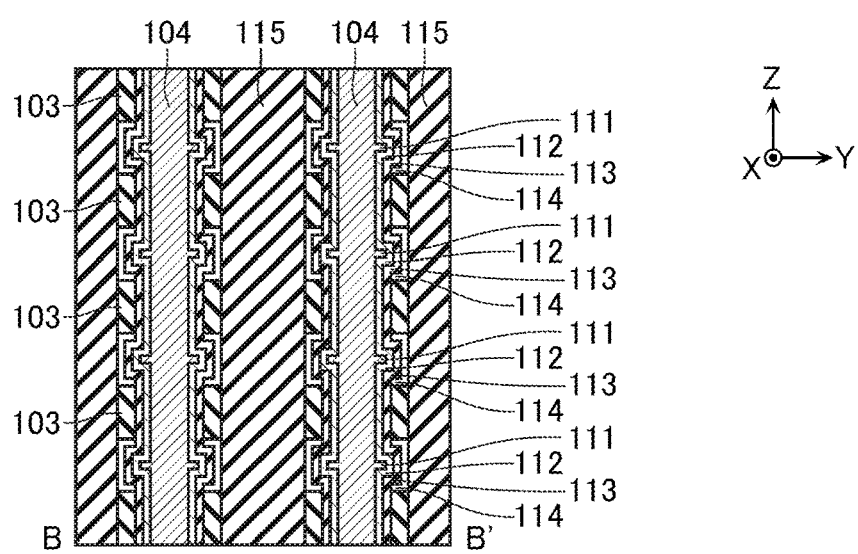
FIG. 6 is a schematic Y-Z cross-sectional view of a configuration illustrated in FIG. 3 and FIG. 4 taken along the line B-B' and viewed along an arrow direction.
Figure 7:
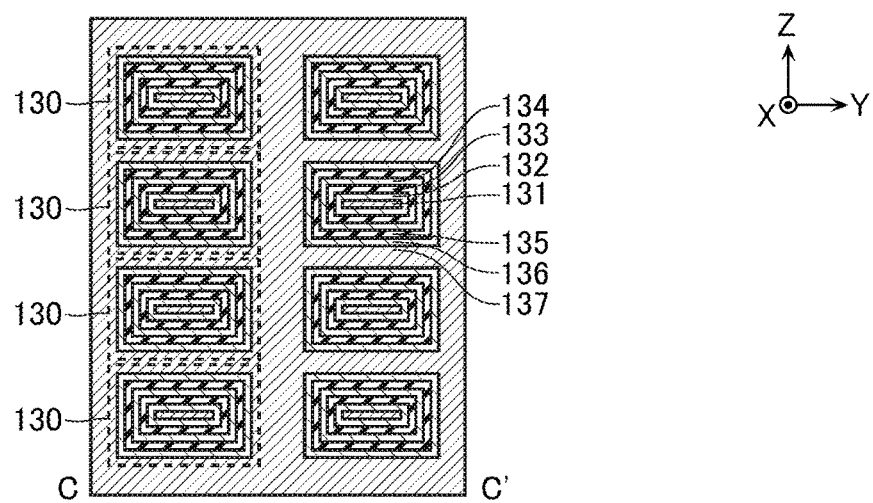
FIG. 7 is a schematic Y-Z cross-sectional view of a configuration illustrated in FIG. 3 and FIG. 4 taken along the line C-C' and viewed along an arrow direction.

FIG. 1 is a schematic perspective view illustrating a configuration of a part of a semiconductor memory device according to a first embodiment. FIG. 2 is a schematic circuit diagram illustrating a configuration of a part of the semiconductor memory device. FIG. 3 and FIG. 4 are schematic X-Y cross-sectional views illustrating configurations of parts of the semiconductor memory device. FIG. 3 and FIG. 4 indicate cross-sectional surfaces of different height positions. FIG. 5 is a schematic X-Z cross-sectional view of a configuration illustrated in FIG. 3 and FIG. 4 taken along the line A-A' and viewed along an arrow direction. FIG. 6 is a schematic Y-Z cross-sectional view of a configuration illustrated in FIG. 3 and FIG. 4 taken along the line B-B' and viewed along an arrow direction. FIG. 7 is a schematic Y-Z cross-sectional view of a configuration illustrated in FIG. 3 and FIG. 4 taken along the line C-C' and viewed along an arrow direction.

FIG. 1 illustrates a part of a semiconductor substrate Sub and a memory cell array MCA disposed above the semiconductor substrate Sub. The semiconductor substrate Sub is, for example, a semiconductor substrate of silicon (Si) containing P-type impurities, such as boron (B).

As illustrated in FIG. 1, the memory cell array MCA includes a plurality of insulating layers 101 and a plurality of conductive layers 102 that are arranged alternately in the X-direction. A plurality of memory layers ML arranged in the Z-direction via insulating layers 103 and a plurality of conductive layers 104 extending in the Z-direction and arranged in the Y-direction are disposed between the insulating layer 101 and the conductive layer 102. The memory layer ML includes a plurality of transistor structures 110 disposed along outer circumferential surfaces of the plurality of conductive layers 104, a conductive layer 120 disposed between the plurality of transistor structures 110 and the insulating layer 101, and a plurality of capacitor structures 130 disposed between the plurality of transistor structures 110 and the conductive layer 102.

The insulating layers 101 and 103 contain, for example, silicon oxide ($SiO_2$).

The conductive layer 102 includes, for example, a stacked structure of titanium nitride (TiN) and tungsten (W). The conductive layer 102 functions as, for example, a plate line PL (FIG. 2). The plate line PL is connected in common to a plurality of capacitors Cap included in the memory layer ML. Furthermore, although omitted in FIG. 2, the plate lines PL are mutually connected in common among the plurality of memory layers ML.

The conductive layer 104 includes, for example, a stacked structure of titanium nitride (TiN) and tungsten (W). The conductive layer 104 functions as, for example, a word line WL (FIG. 2). The plurality of word lines WL are disposed corresponding to a plurality of transistors Tr included in the memory layer ML. Furthermore, the word line WL is connected in common to gate electrodes of the plurality of transistors Tr corresponding to the plurality of memory layers ML.

The transistor structure 110 includes, for example, as illustrated in FIG. 4 to FIG. 6, a conductive layer 111, a conductive layer 112 disposed on an upper surface, a lower surface, and an outer circumferential surface of the conductive layer 111, an insulating layer 113 disposed on an upper surface, a lower surface, and an outer circumferential surface of the conductive layer 112, and a semiconductor layer 114 disposed on an upper surface, a lower surface, and an outer circumferential surface of the insulating layer 113.

In the X-Y cross-sectional surface exemplarily illustrated in FIG. 4, both side surfaces of these configurations in the X-direction may be formed along a circle around a center position of the conductive layer 104 (FIG. 3). Furthermore, both side surfaces of these configurations in the Y-direction may be linearly formed along the side surface of an insulating layer 115.

The conductive layer 111 and the conductive layer 112 function as, for example, the gate electrode of the transistor Tr (FIG. 2). The conductive layer 111 contains, for example, tungsten (W). The conductive layer 112 contains, for example, titanium nitride (TiN). As illustrated in FIG. 5 and FIG. 6, the plurality of conductive layers 111 and 112 arranged in the Z-direction are connected in common to the conductive layer 104 extending in the Z-direction.

The insulating layer 113 functions as, for example, agate insulating film of the transistor Tr (FIG. 2). The insulating layer 113 contains, for example, silicon oxide ($SiO_2$).

The semiconductor layer 114 functions as, for example, a channel region of the transistor Tr (FIG. 2). The semiconductor layer 114 may be, for example, a semiconductor containing at least one element of gallium (Ga) and aluminum (Al), and containing indium (In), zinc (Zn), and oxygen (O), or may be another oxide semiconductor. As illustrated in FIG. 3, an insulating layer 115 of, for example, silicon oxide ($SiO_2$) is disposed between the two semiconductor layers 114 adjacent in the Y-direction.

The conductive layer 120 functions as, for example, a bit line BL (FIG. 2) of the memory cell array MCA. The conductive layer 120, as illustrated in FIG. 3, for example, extends in the Y-direction and is connected to the side surfaces in the X-direction of the plurality of semiconductor layers 114 arranged in the Y-direction. The conductive layer 120 includes, as illustrated in FIG. 5, for example, a conductive layer 121, a conductive layer 122 disposed on an upper surface, a lower surface, and a side surface in the X-direction of the conductive layer 121, and a conductive layer 123 disposed on an upper surface, a lower surface, and a side surface in the X-direction of the conductive layer 122. The conductive layer 121 contains, for example, tungsten (W). The conductive layer 122 contains, for example, titanium nitride (TiN). The conductive layer 123 contains, for example, indium tin oxide (ITO).

As illustrated in FIG. 7, for example, the capacitor structure 130 includes, a conductive layer 131, a conductive layer 132 disposed on an upper surface, a lower surface, and side surfaces in the Y-direction of the conductive layer 131, an insulating layer 133 disposed on an upper surface, a lower surface, and side surfaces in the Y-direction of the conductive layer 132, a conductive layer 134 disposed on an upper surface, a lower surface, and side surfaces in the Y-direction of the insulating layer 133, an insulating layer 135 disposed on an upper surface, a lower surface, and side surfaces in the Y-direction of the conductive layer 134, a conductive layer 136 disposed on an upper surface, a lower surface, and side surfaces in the Y-direction of the insulating layer 135, and a conductive layer 137 disposed on an upper surface, a lower surface, and side surfaces in the Y-direction of the conductive layer 136.

The conductive layers 131, 132, 136, and 137 function as one electrode of the capacitor Cap (FIG. 2). The conductive layers 131 and 137 contain, for example, tungsten (W). The conductive layers 132 and 136 contain, for example, titanium nitride (TiN). As illustrated in FIG. 5, the conductive layers 131, 132, 136, and 137 are connected to the conductive layer 102.

The insulating layers 133 and 135 function as the insulating layers of the capacitor Cap (FIG. 2). The insulating layers 133 and 135 may be, for example, alumina ($Al_2O_3$) or another insulating metal oxide.

The conductive layer 134 functions as, for example, the other electrode of the capacitor Cap (FIG. 2). The conductive layer 134 contains, for example, indium tin oxide (ITO). The conductive layer 134 is insulated from the conductive layers 131, 132, 136, and 137 via the insulating layers 133 and 135. The conductive layer 134 is connected to the side surface of the semiconductor layer 114 in the X-direction.

[Manufacturing Method]

FIG. 8 to FIG. 47 are schematic cross-sectional views for describing the manufacturing method of the semiconductor memory device according to the first embodiment. FIG. 8, FIG. 10, FIG. 14, FIG. 17, FIG. 19, FIG. 21, FIG. 23, FIG. 25, FIG. 27, FIG. 29, FIG. 31, FIG. 33, FIG. 35, FIG. 37, FIG. 39, FIG. 42, FIG. 44, and FIG. 46 indicate a portion corresponding to FIG. 5. FIG. 9, FIG. 11, FIG. 13, FIG. 16, FIG. 21, FIG. 23, FIG. 25, FIG. 27, FIG. 29, FIG. 31, FIG. 33, FIG. 35, FIG. 37, and FIG. 41 indicate a portion corresponding to FIG. 4. FIG. 12, FIG. 15, FIG. 18, FIG. 20, FIG. 40, FIG. 43, FIG. 45, and FIG. 47 indicate a portion corresponding to FIG. 6.

Figure 8:
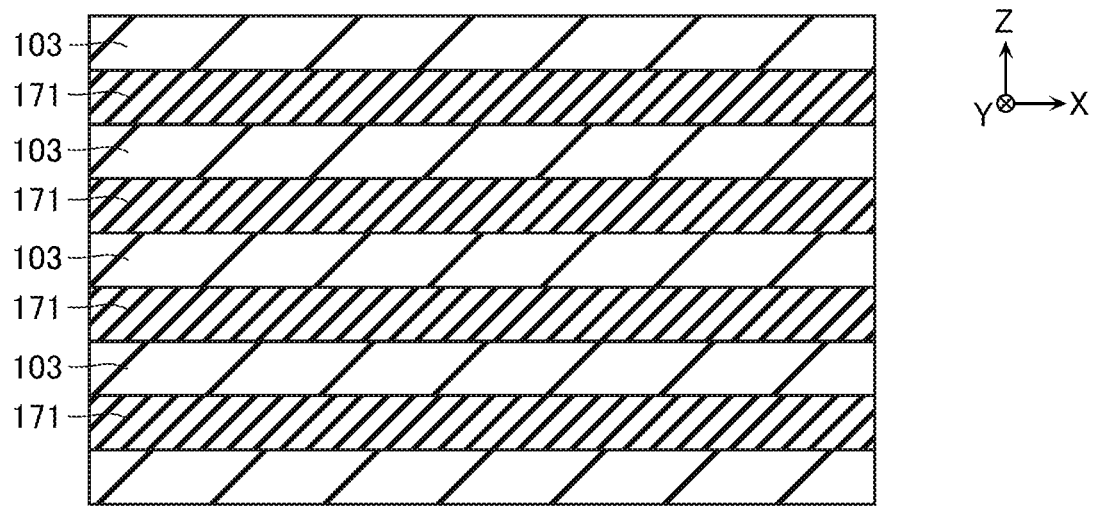
FIG. 8 is a schematic cross-sectional view for describing a manufacturing method of the semiconductor memory device according to the first embodiment.

In the manufacturing method, as illustrated in FIG. 8, for example, a plurality of insulating layers 103 and a plurality of sacrifice layers 171 are formed alternately. The sacrifice layer 171 contains, for example, silicon nitride ($Si_3N_4$). This process is performed by a method, such as Chemical Vapor Deposition (CVD).

Figure 9:
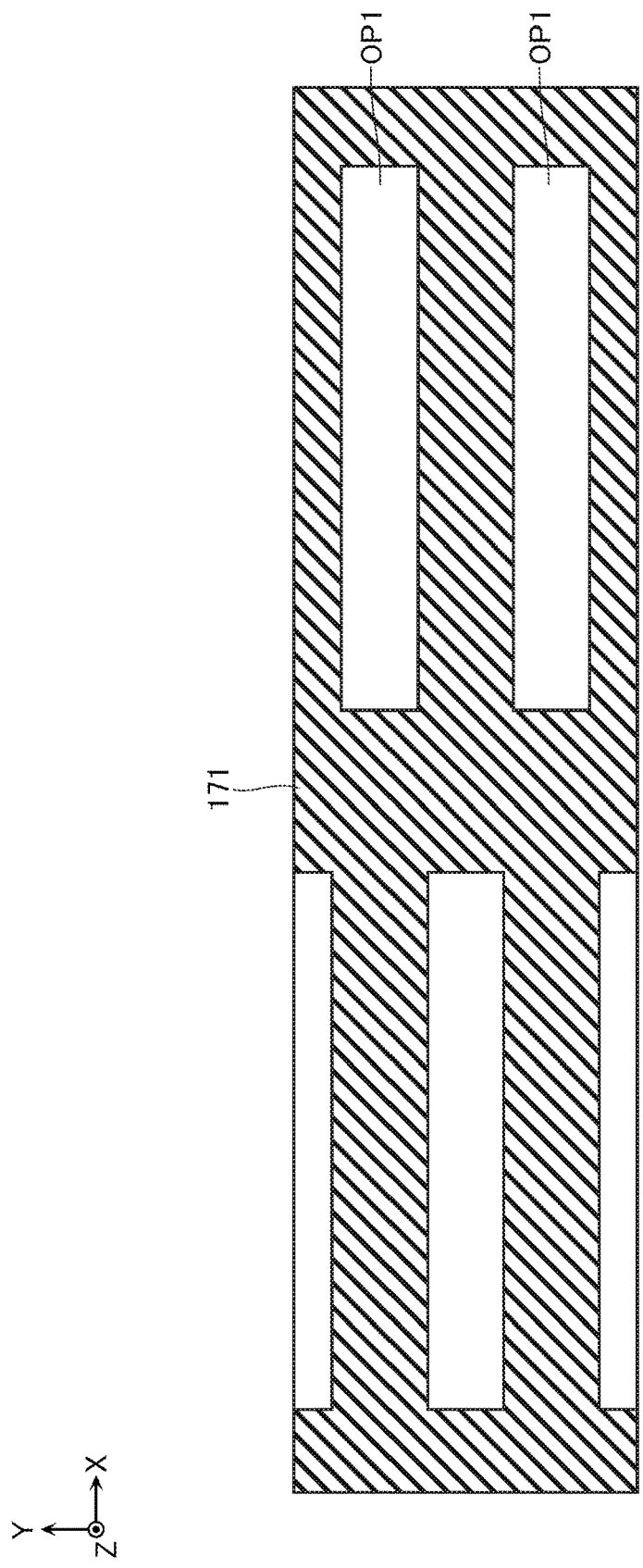
FIG. 9 is a schematic cross-sectional view for describing the manufacturing method.
Figure 10:
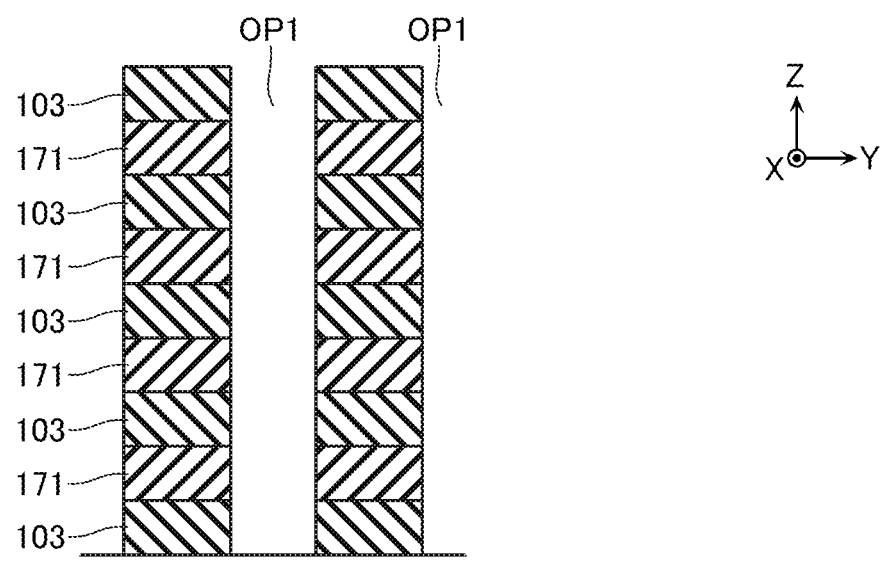
FIG. 10 is a schematic cross-sectional view for describing the manufacturing method.

Next, as illustrated in FIG. 9 and FIG. 10, for example, openings OP1 are formed. The openings OP1, as illustrated in FIG. 9, extend in the X-direction and are arranged in the Y-direction. Furthermore, the opening OP1, as illustrated in FIG. 10, extends in the Z-direction and penetrates a plurality of insulating layers 103 and a plurality of sacrifice layers 171 arranged in the Z-direction. This process is performed by a method, such as Reactive Ion Etching (RIE).

Figure 11:
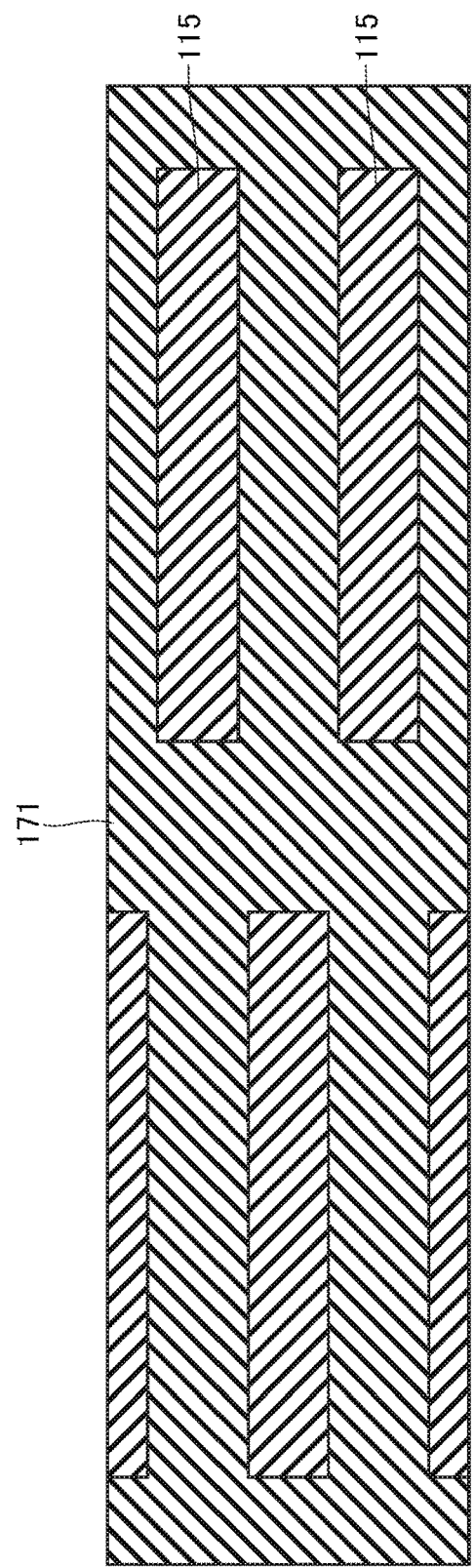
FIG. 11 is a schematic cross-sectional view for describing the manufacturing method.
Figure 12:
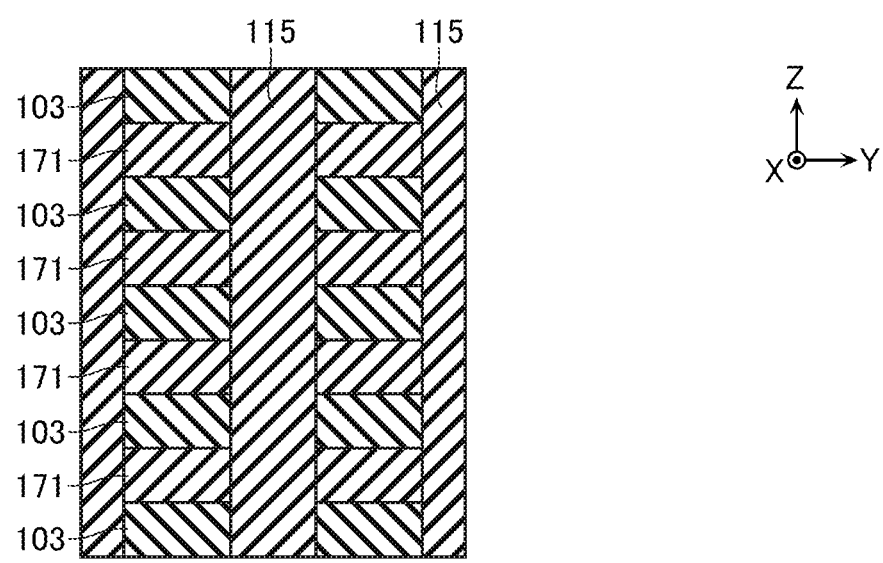
FIG. 12 is a schematic cross-sectional view for describing the manufacturing method.

Next, as illustrated in FIG. 11 and FIG. 12, for example, the insulating layers 115 are formed. This process is performed by a method, such as CVD.

Figure 13:
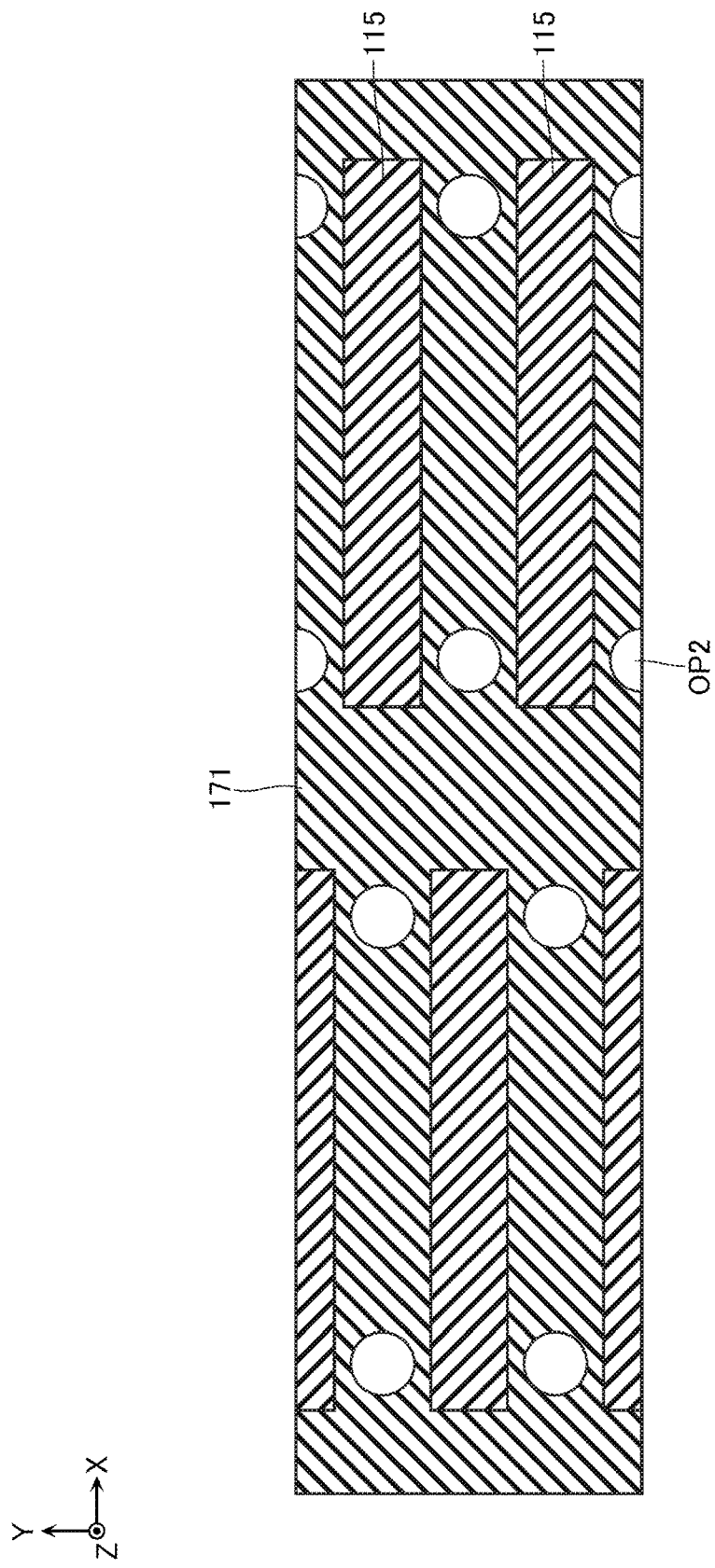
FIG. 13 is a schematic cross-sectional view for describing the manufacturing method.
Figure 14:
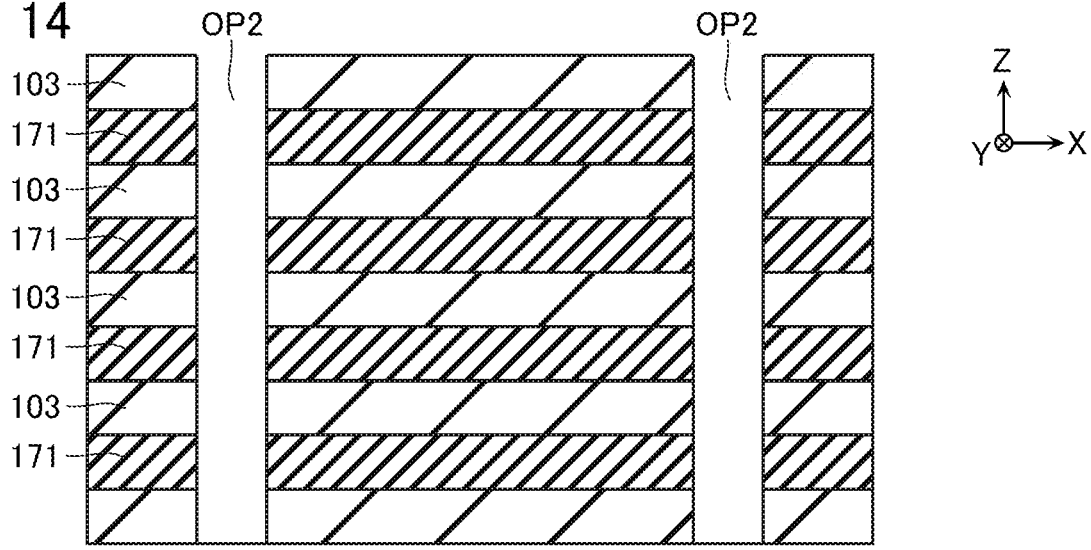
FIG. 14 is a schematic cross-sectional view for describing the manufacturing method.
Figure 15:
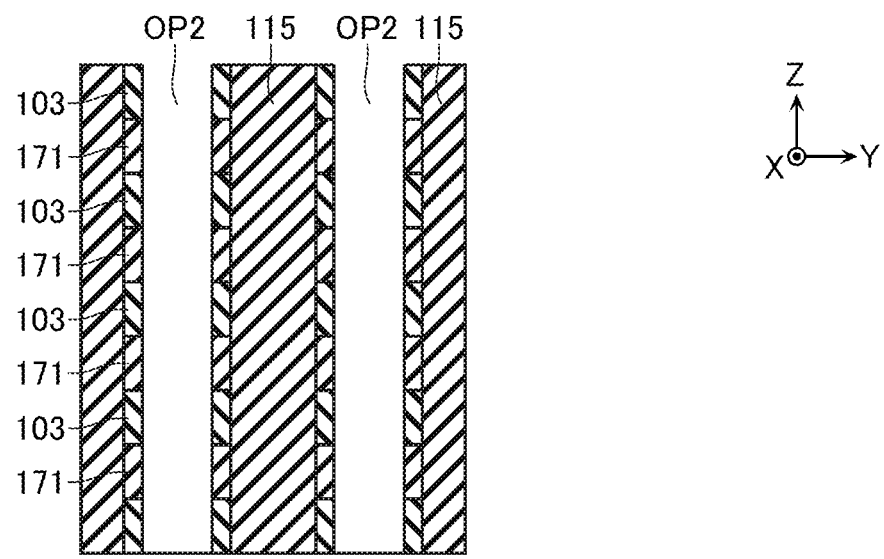
FIG. 15 is a schematic cross-sectional view for describing the manufacturing method.

Next, as illustrated in FIG. 13 to FIG. 15, for example, openings OP2 are formed in positions corresponding to the conductive layers 104. As illustrated in FIG. 14 and FIG. 15, the opening OP2 extends in the Z-direction and penetrates the plurality of insulating layers 103 and the plurality of sacrifice layers 171 arranged in the Z-direction. This process is performed by a method, such as RIE.

Figure 16:
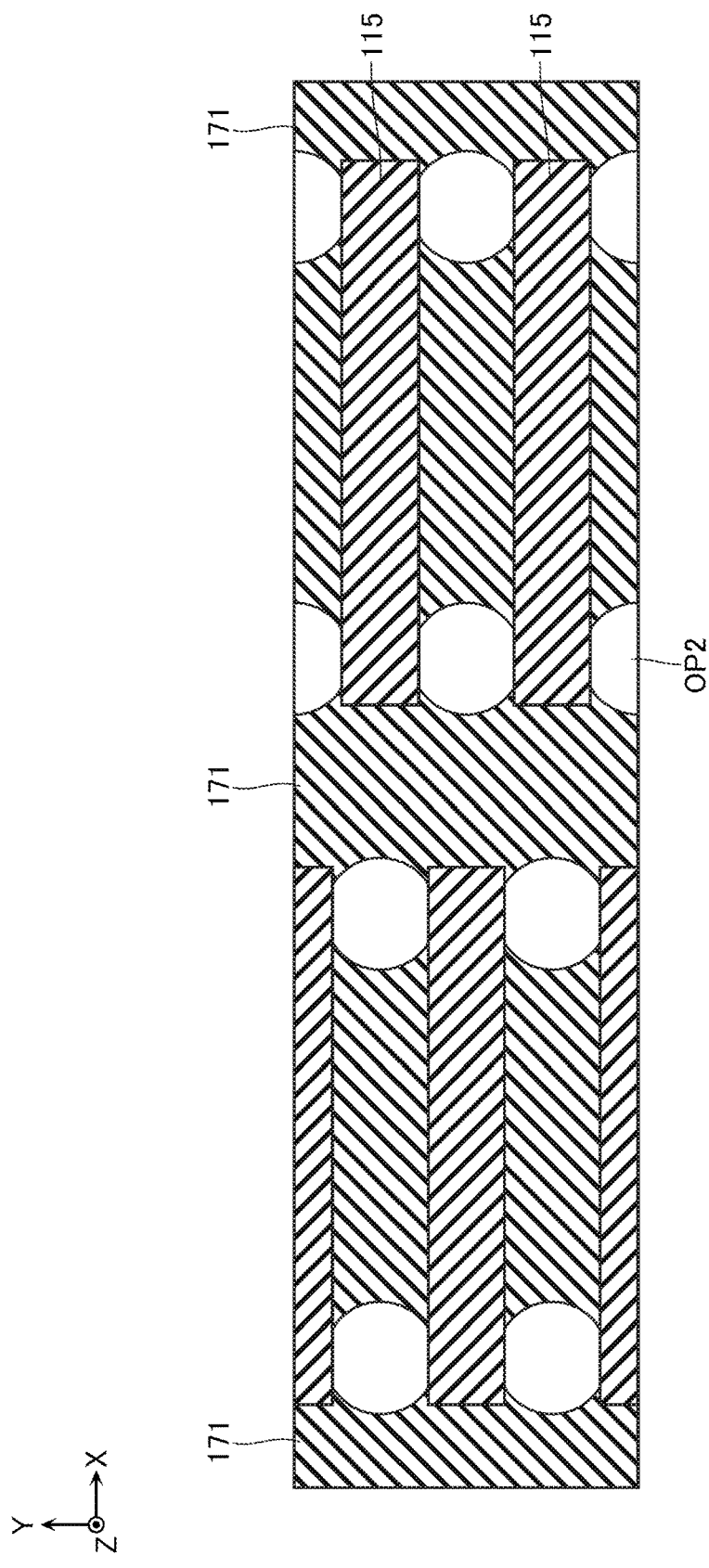
FIG. 16 is a schematic cross-sectional view for describing the manufacturing method.
Figure 17:
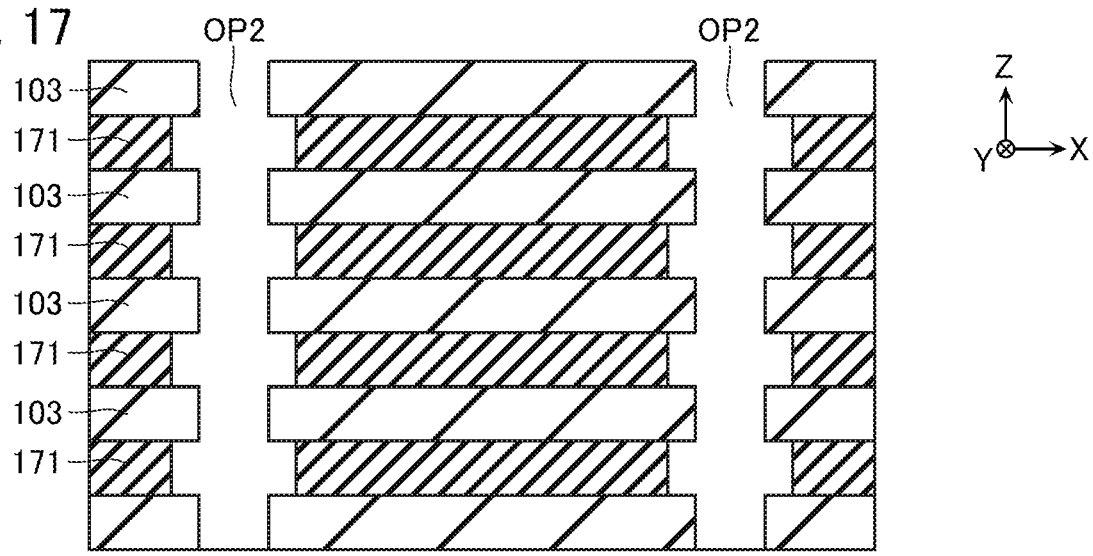
FIG. 17 is a schematic cross-sectional view for describing the manufacturing method.
Figure 18:
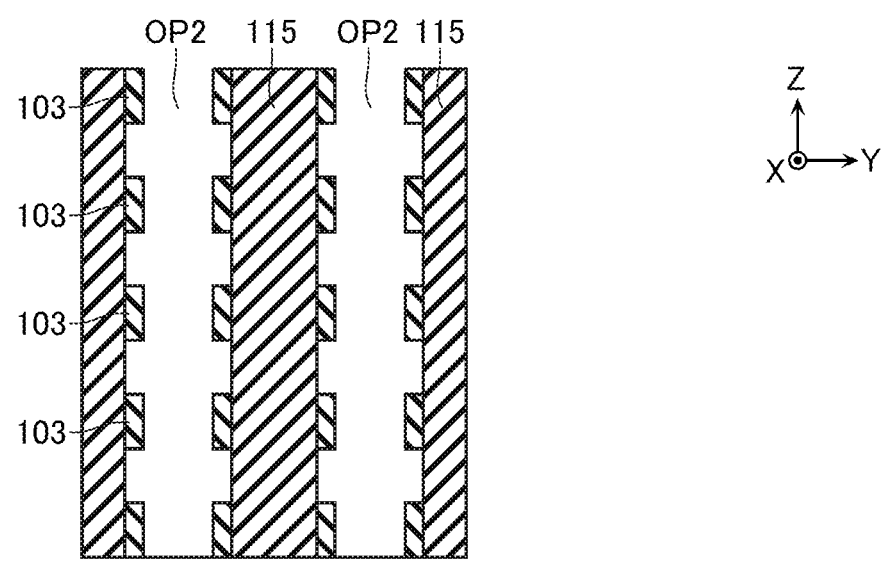
FIG. 18 is a schematic cross-sectional view for describing the manufacturing method.

Next, as illustrated in FIG. 16 to FIG. 18, for example, the sacrifice layer 171 is partially and selectively removed via the opening OP2. In this process, the side surface of the insulating layer 115 in the Y-direction is exposed inside the opening OP2 and thus the sacrifice layer 171 is separated in the X-direction. This process is performed by a method, such as wet etching.

Figure 19:
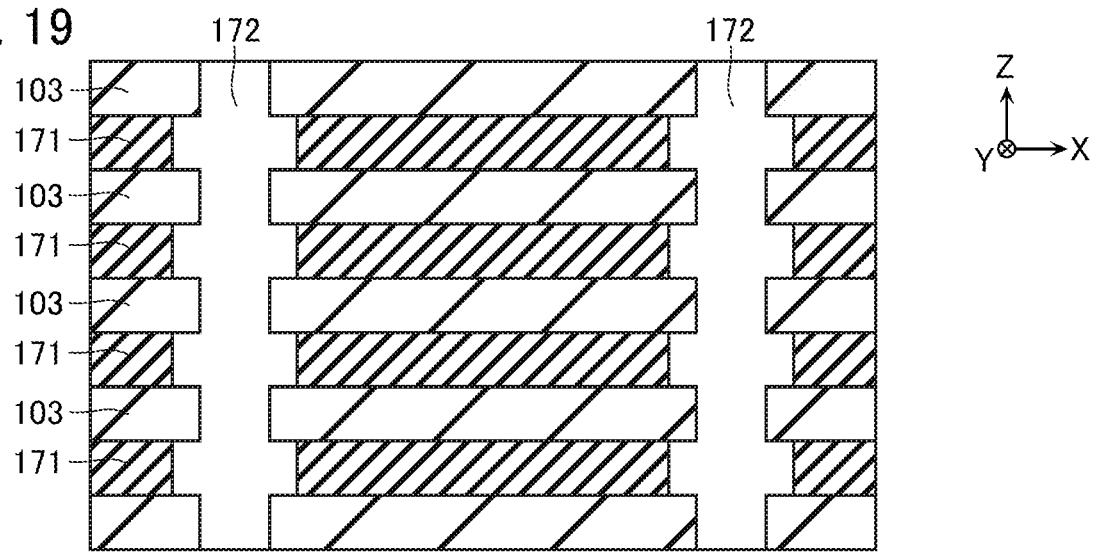
FIG. 19 is a schematic cross-sectional view for describing the manufacturing method.
Figure 20:
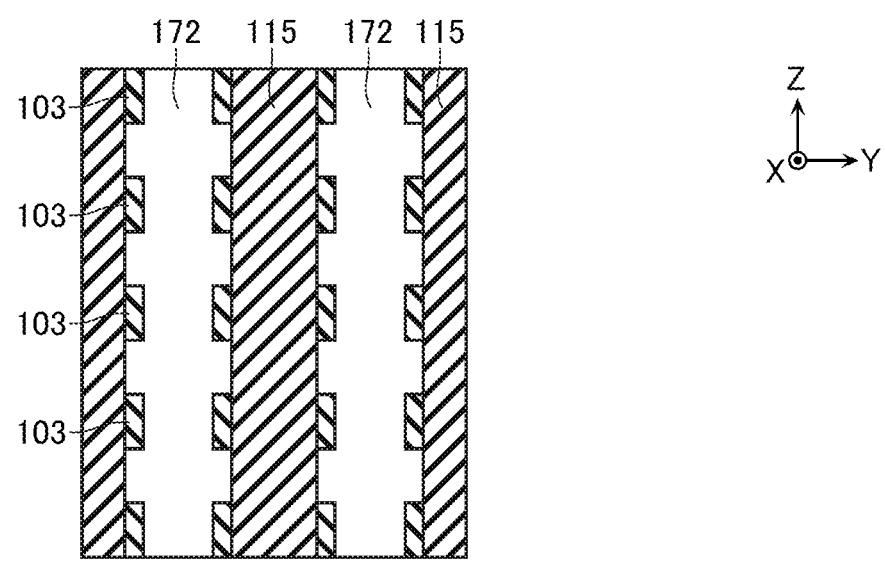
FIG. 20 is a schematic cross-sectional view for describing the manufacturing method.

Next, as illustrated in FIG. 19 and FIG. 20, for example, a sacrifice layer 172 is formed inside the opening OP2. The sacrifice layer 172 contains, for example, silicon (Si). This process is performed by a method, such as CVD.

Figure 21:
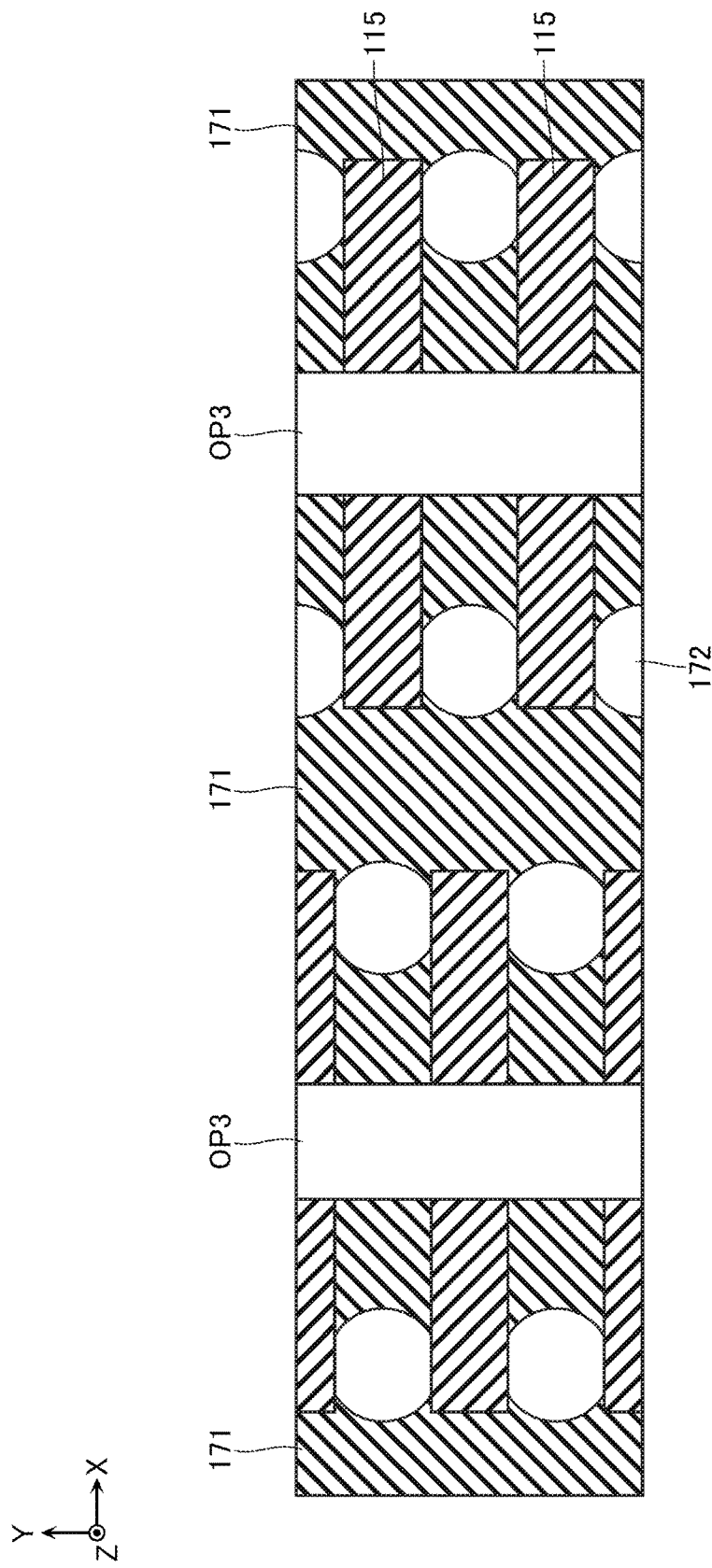
FIG. 21 is a schematic cross-sectional view for describing the manufacturing method.
Figure 22:
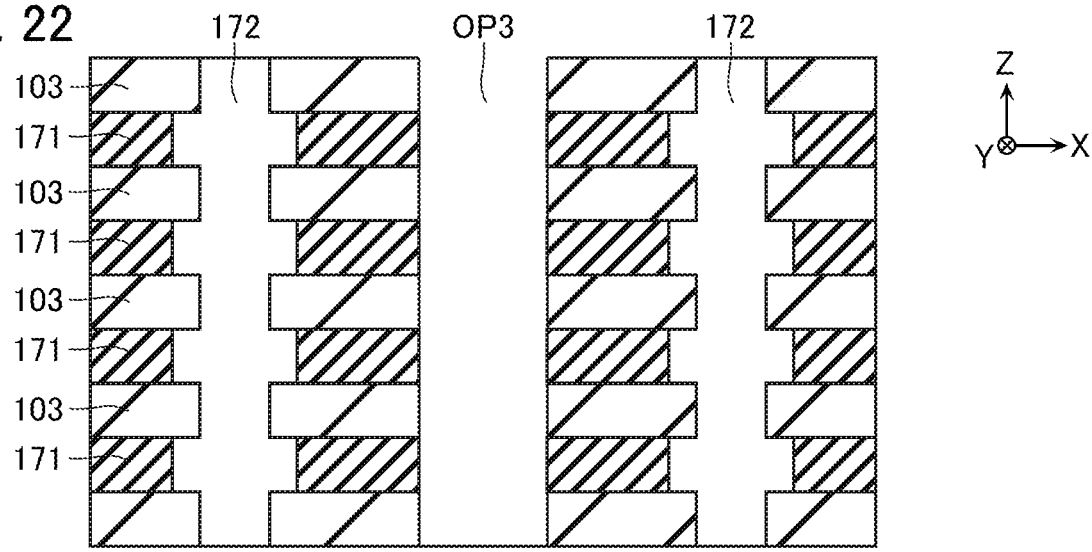
FIG. 22 is a schematic cross-sectional view for describing the manufacturing method.

Next, as illustrated in FIG. 21 and FIG. 22, for example, openings OP3 are formed in positions corresponding to the conductive layers 102. As illustrated in FIG. 21, the openings OP3 extend in the Y-direction and are arranged in the X-direction. Furthermore, as illustrated in FIG. 22, the opening OP3 extends in the Z-direction, penetrates the plurality of insulating layers 103 and the plurality of sacrifice layers 171 arranged in the Z-direction, and separates these configurations in the X-direction. This process is performed by a method, such as RIE.

Figure 23:
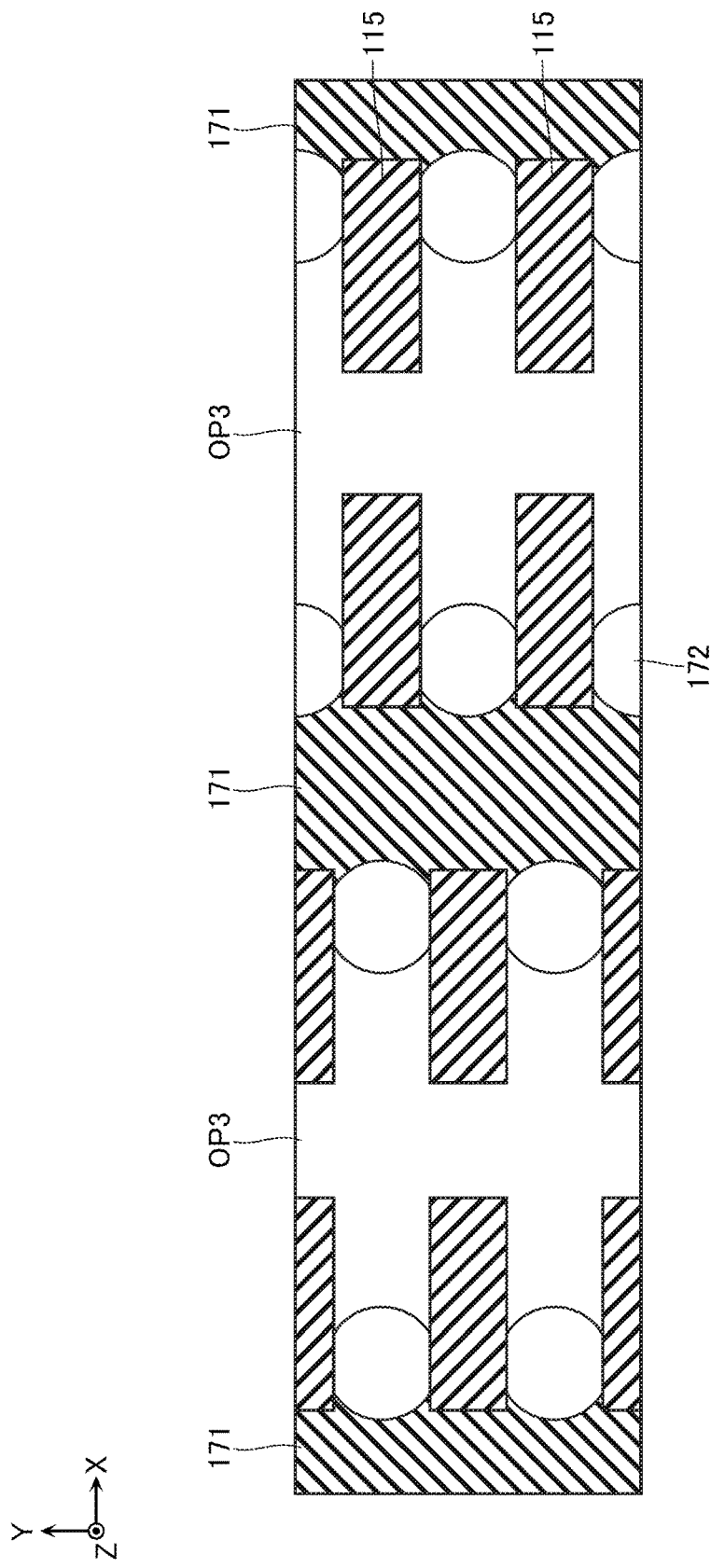
FIG. 23 is a schematic cross-sectional view for describing the manufacturing method.
Figure 24:
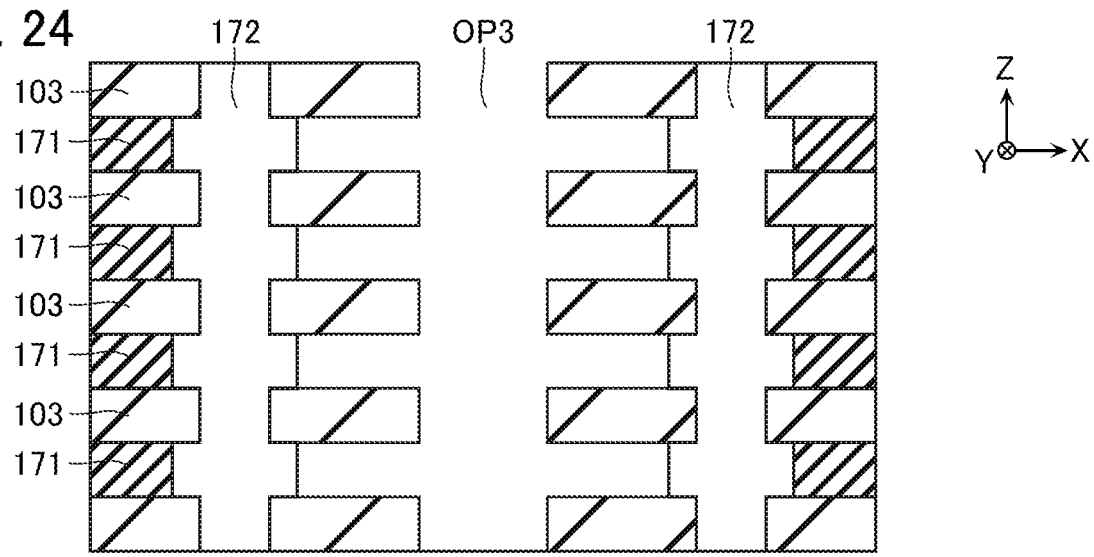
FIG. 24 is a schematic cross-sectional view for describing the manufacturing method.

Next, as illustrated in FIG. 23 and FIG. 24, for example, the sacrifice layers 171 are partially and selectively removed via the openings OP3. In this process, the side surfaces of the sacrifice layers 172 in the X-direction are exposed inside the openings OP3. This process is performed by a method, such as wet etching.

Figure 25:
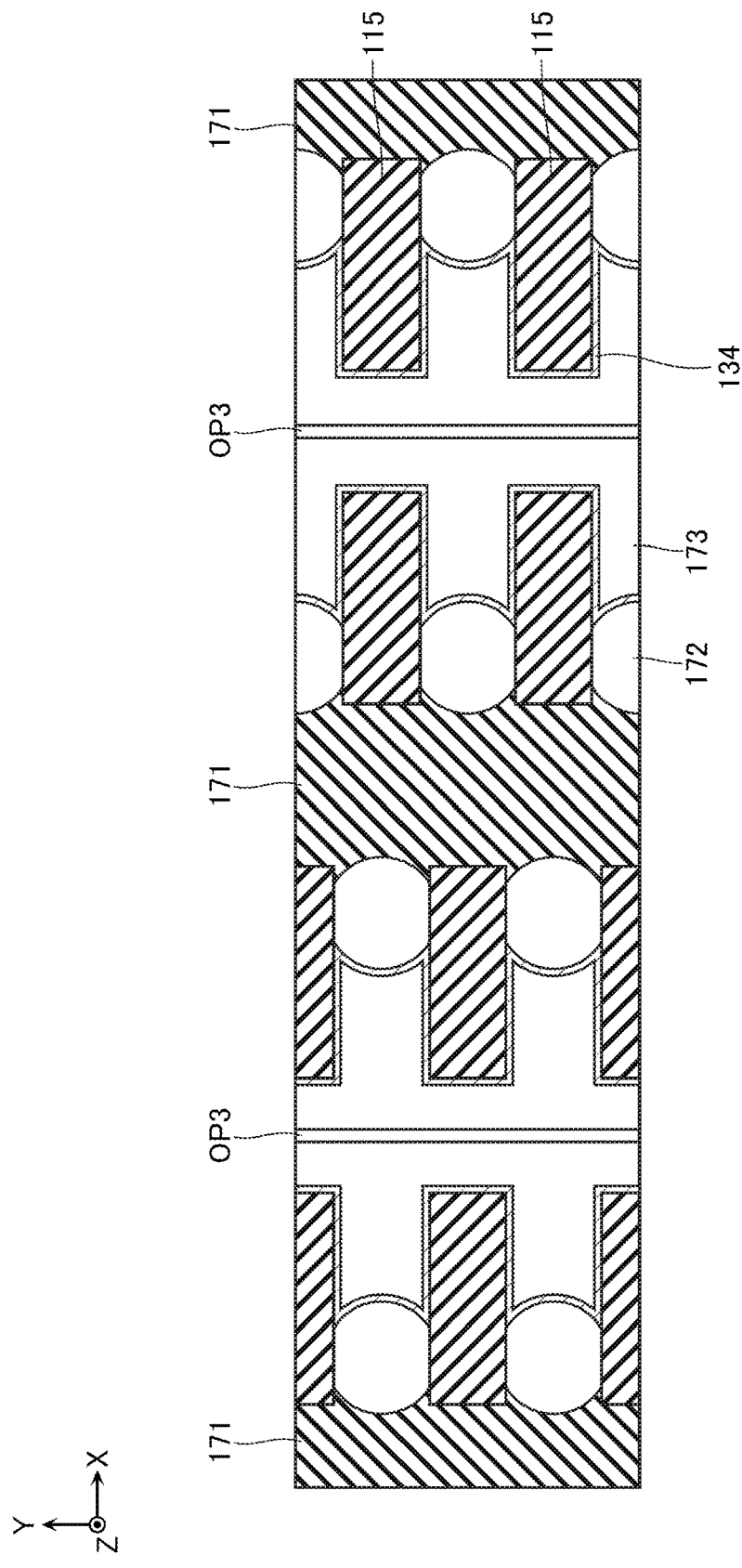
FIG. 25 is a schematic cross-sectional view for describing the manufacturing method.
Figure 26:
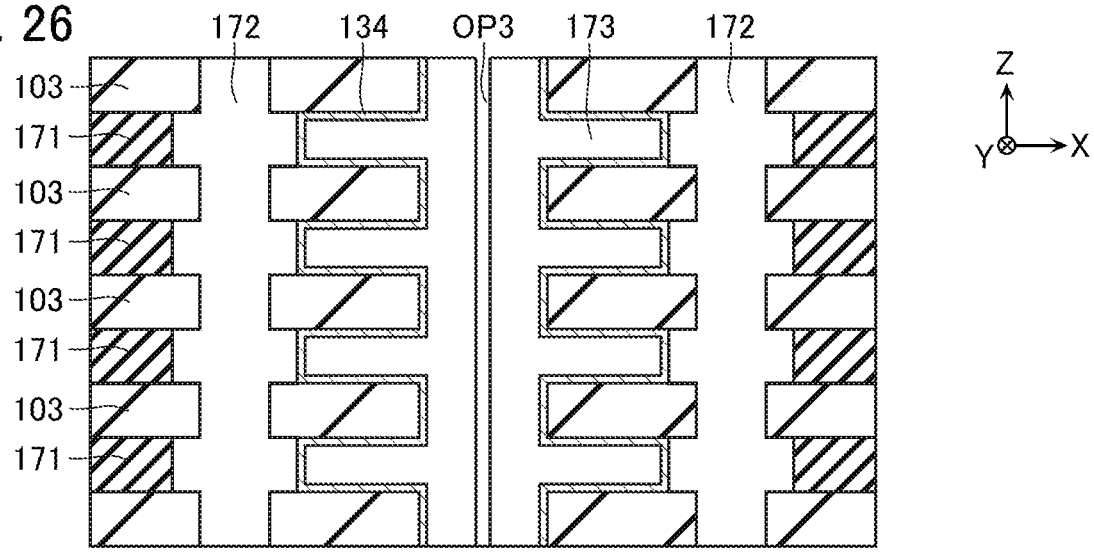
FIG. 26 is a schematic cross-sectional view for describing the manufacturing method.

Next, as illustrated in FIG. 25 and FIG. 26, for example, the conductive layer 134 is formed on the side surface of the sacrifice layer 172 in the X-direction, the side surfaces of the insulating layer 115 in the X-direction and the Y-direction, and an upper surface, a lower surface and a side surface in the X-direction of the insulating layer 103 (FIG. 26) via the opening OP3. Furthermore, a sacrifice layer 173 is formed inside the opening OP3. The sacrifice layer 173 contains, for example, silicon (Si). In this process, as illustrated in FIG. 26, for example, a region between the two insulating layers 103 adjacent in the Z-direction are embedded with the sacrifice layer 173. On the other hand, a region between the two insulating layers 103 adjacent in the X-direction are not embedded with the sacrifice layer 173. This process is performed by a method, such as Atomic Layer Deposition (ALD) and CVD.

Figure 27:
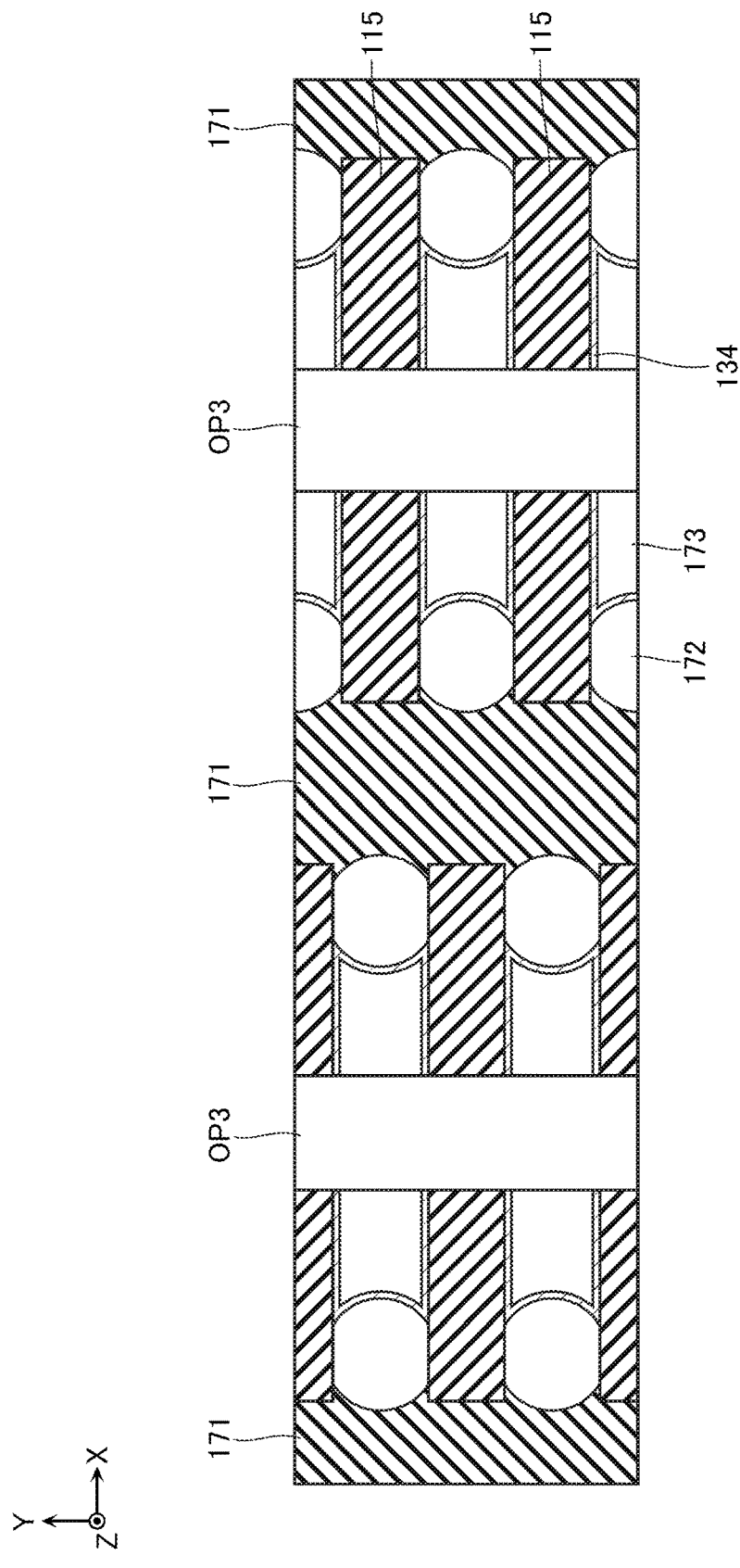
FIG. 27 is a schematic cross-sectional view for describing the manufacturing method.
Figure 28:
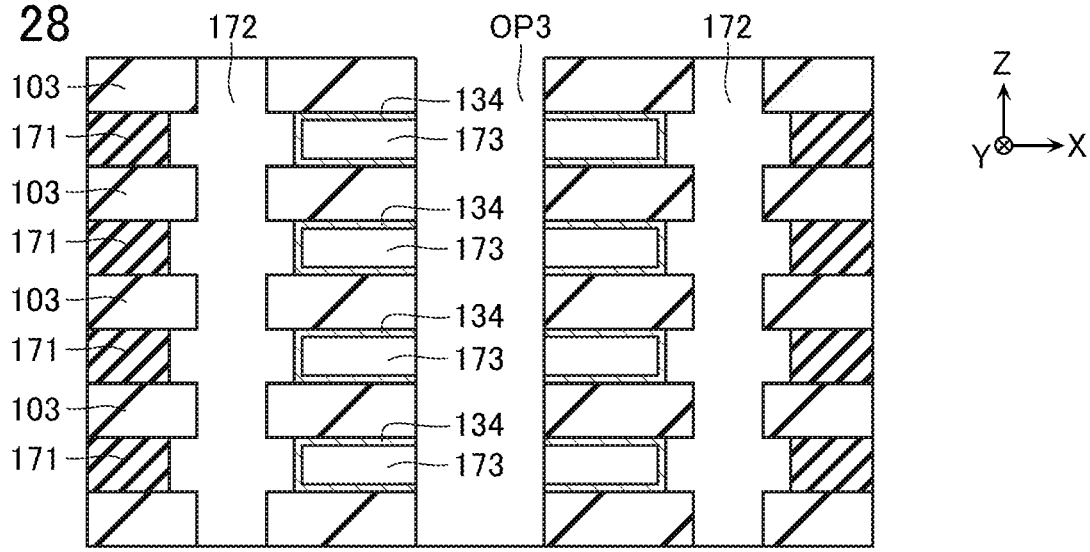
FIG. 28 is a schematic cross-sectional view for describing the manufacturing method.

Next, as illustrated in FIG. 27 and FIG. 28, for example, the sacrifice layers 173 and the conductive layers 134 are partially removed via the opening OP3. In this process, for example, the sacrifice layer 173 is partially removed to expose a portion of the conductive layer 134 disposed on the side surfaces of the insulating layer 115 (FIG. 27) and the insulating layer 103 (FIG. 28) in the X-direction, and the portion is removed. This process is performed by a method, such as wet etching.

Figure 29:
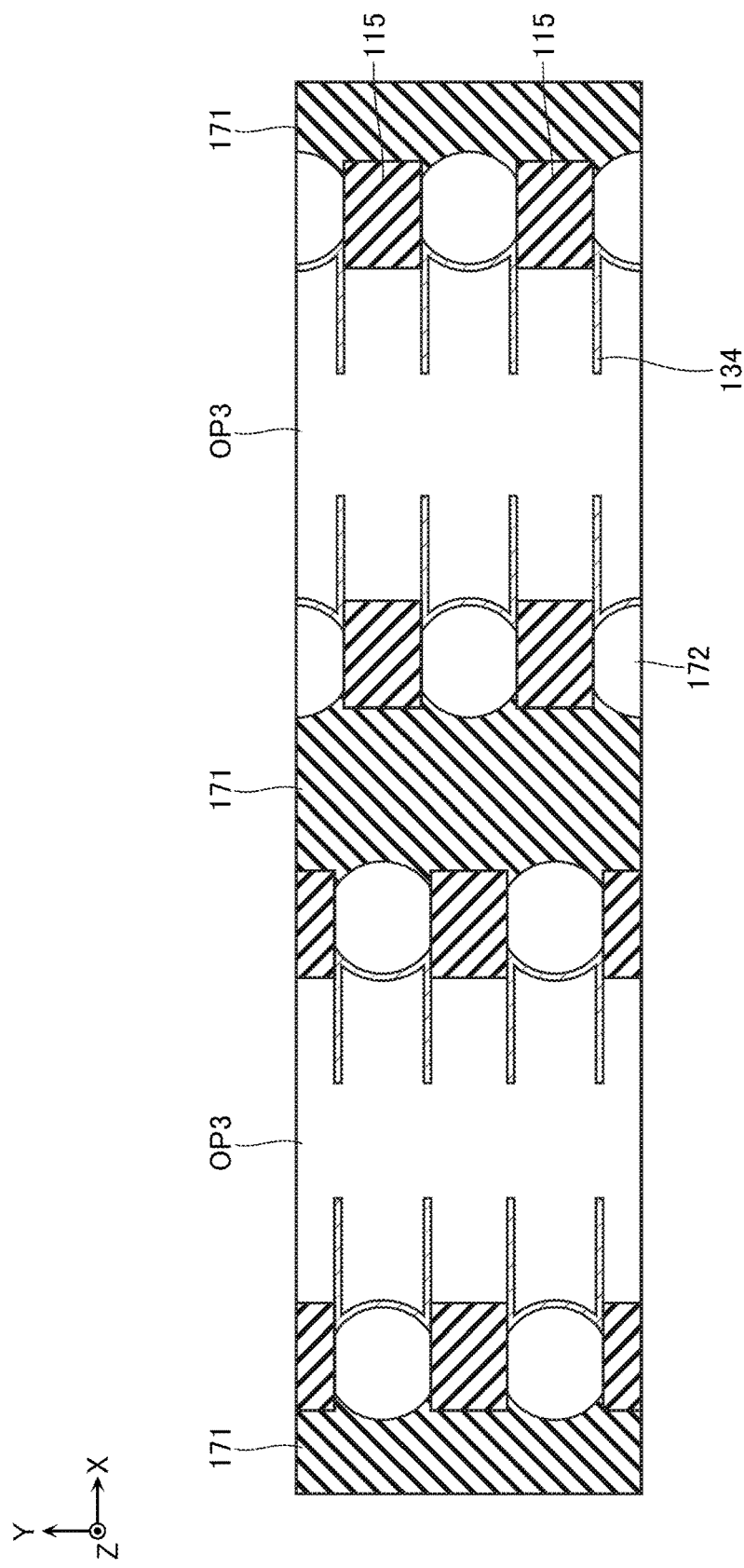
FIG. 29 is a schematic cross-sectional view for describing the manufacturing method.
Figure 30:
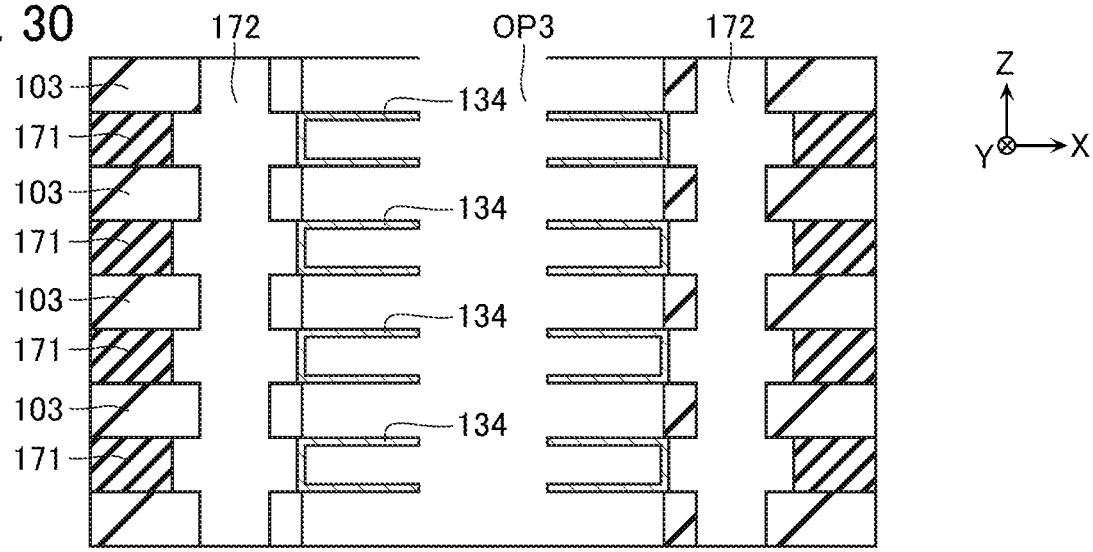
FIG. 30 is a schematic cross-sectional view for describing the manufacturing method.

Next, as illustrated in FIG. 29 and FIG. 30, for example, the sacrifice layer 173, a part of the insulating layer 115 (FIG. 29), and a part of the insulating layer 103 (FIG. 30) are removed via the opening OP3. In this process, the sacrifice layer 173 is completely removed. Furthermore, the insulating layer 115 (FIG. 29) and the insulating layer 103 (FIG. 30) are removed to an extent that the sacrifice layer 172 is not exposed to the opening OP3. This process is performed by a method, such as wet etching.

Figure 31:
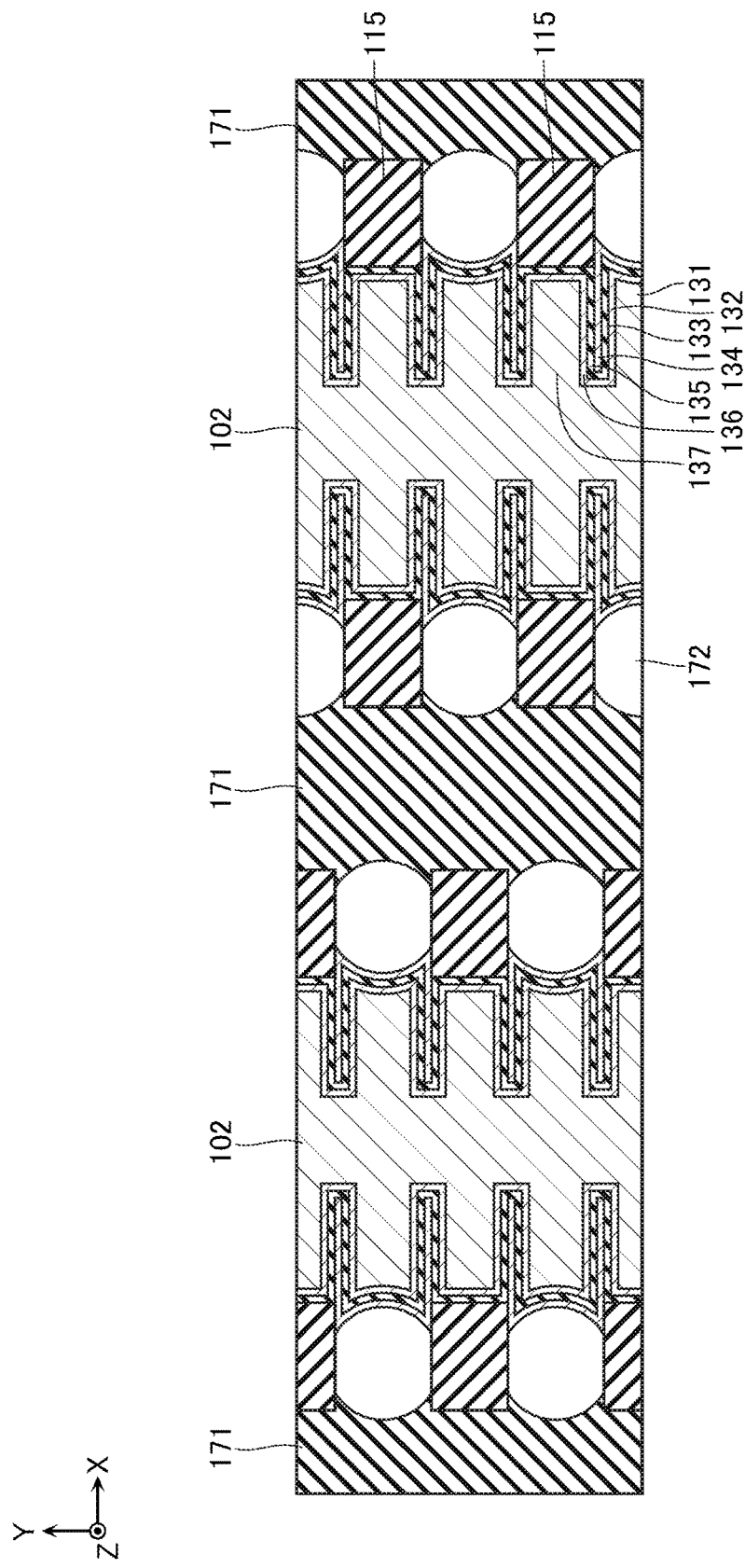
FIG. 31 is a schematic cross-sectional view for describing the manufacturing method.
Figure 32:
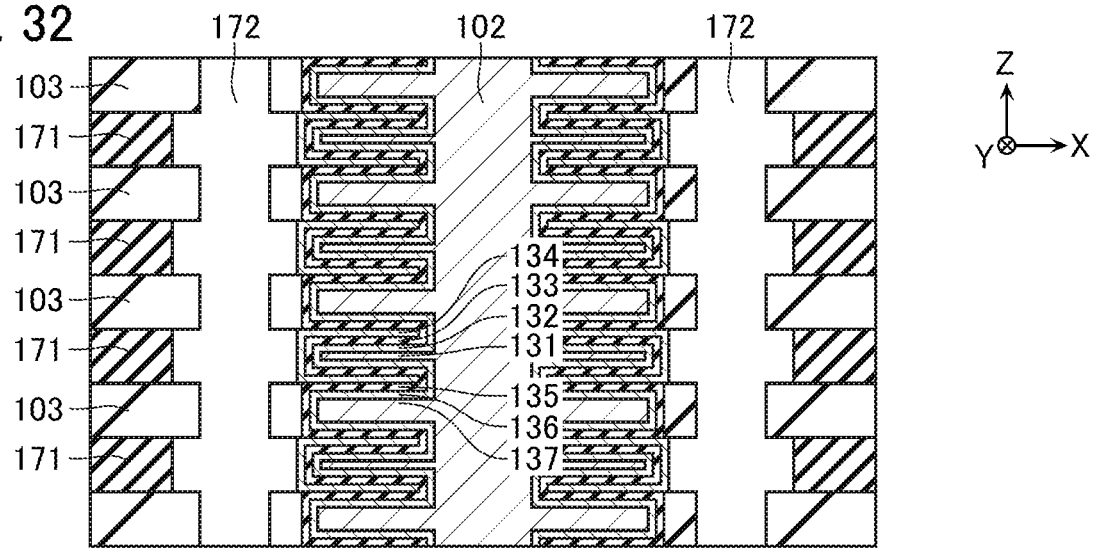
FIG. 32 is a schematic cross-sectional view for describing the manufacturing method.

Next, as illustrated in FIG. 31 and FIG. 32, for example, insulating layers 133 and 135, conductive layers 132 and 136, and conductive layers 131, 137, and 102 are formed on an upper surface, a lower surface, a side surface in the X-direction, and side surfaces in the Y-direction of the conductive layer 134 via the opening OP3. This process is performed by a method, such as CVD.

Figure 33:
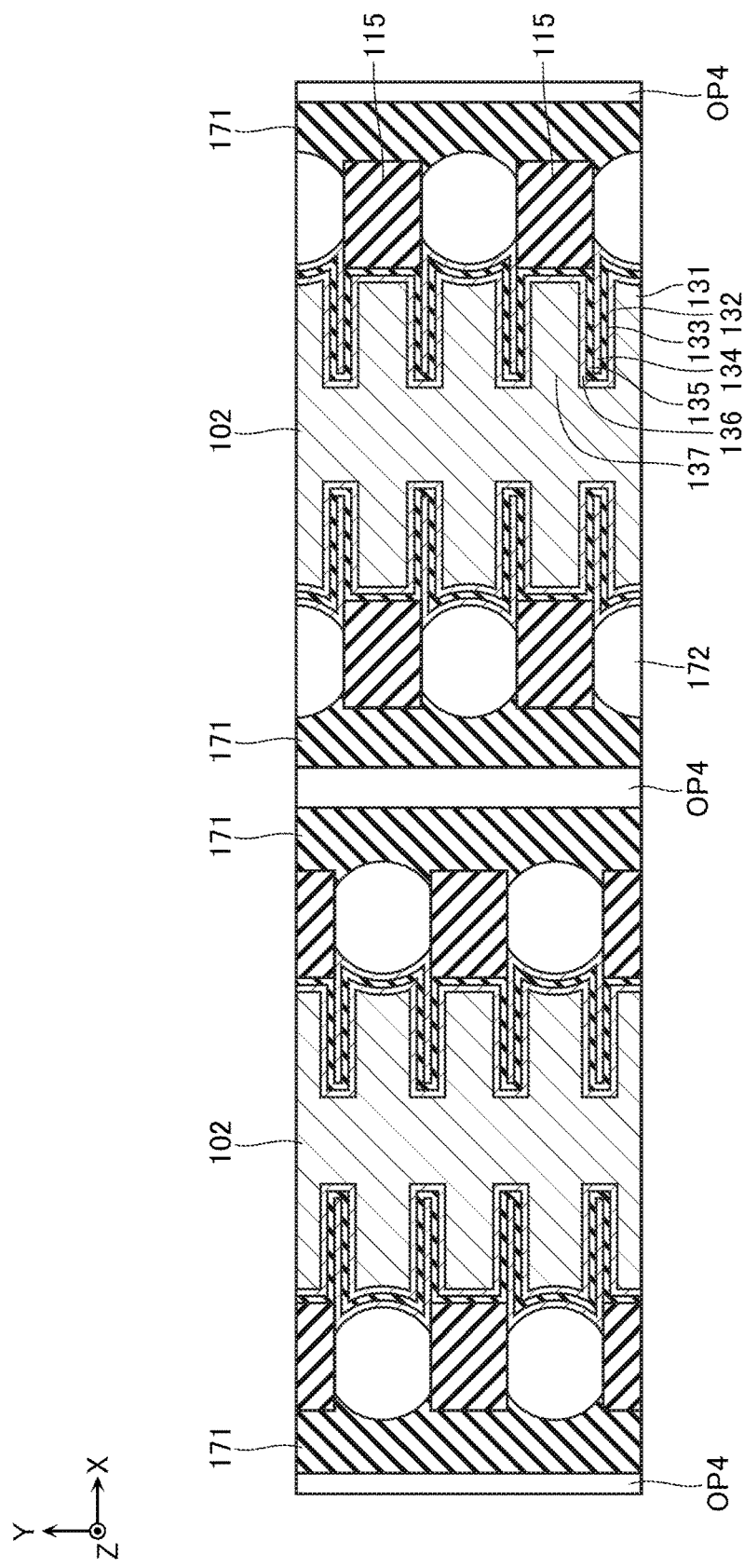
FIG. 33 is a schematic cross-sectional view for describing the manufacturing method.
Figure 34:
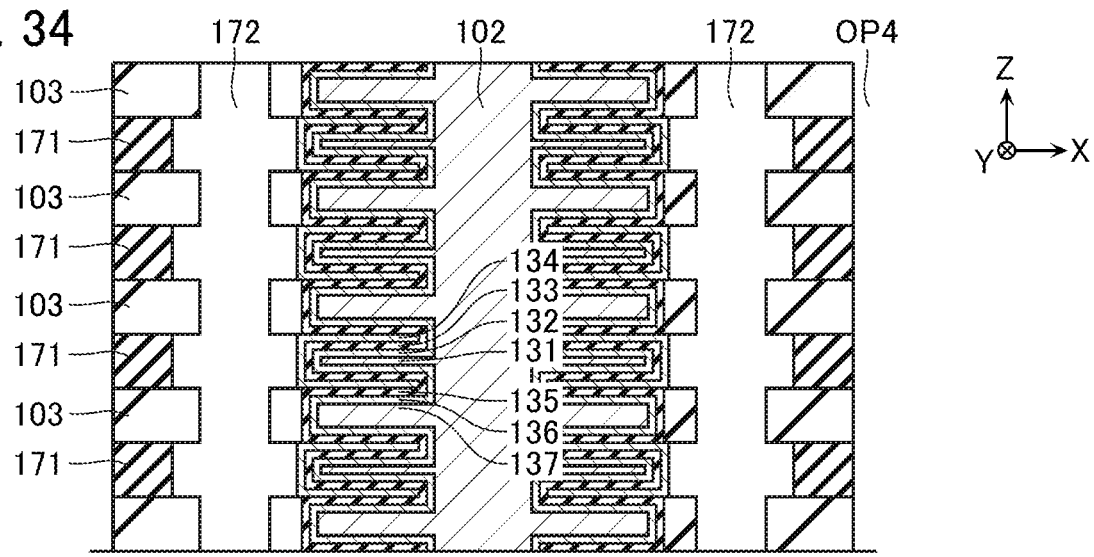
FIG. 34 is a schematic cross-sectional view for describing the manufacturing method.

Next, as illustrated in FIG. 33 and FIG. 34, for example, openings OP4 are formed in positions corresponding to the insulating layers 101. The openings OP4, as illustrated in FIG. 33, extend in the Y-direction and are arranged in the X-direction. Furthermore, as illustrated in FIG. 34, the opening OP4 extends in the Z-direction, penetrates the plurality of insulating layers 103 and the plurality of sacrifice layers 171 arranged in the Z-direction, and separates these configurations in the X-direction. This process is performed by a method, such as RIE.

Figure 35:
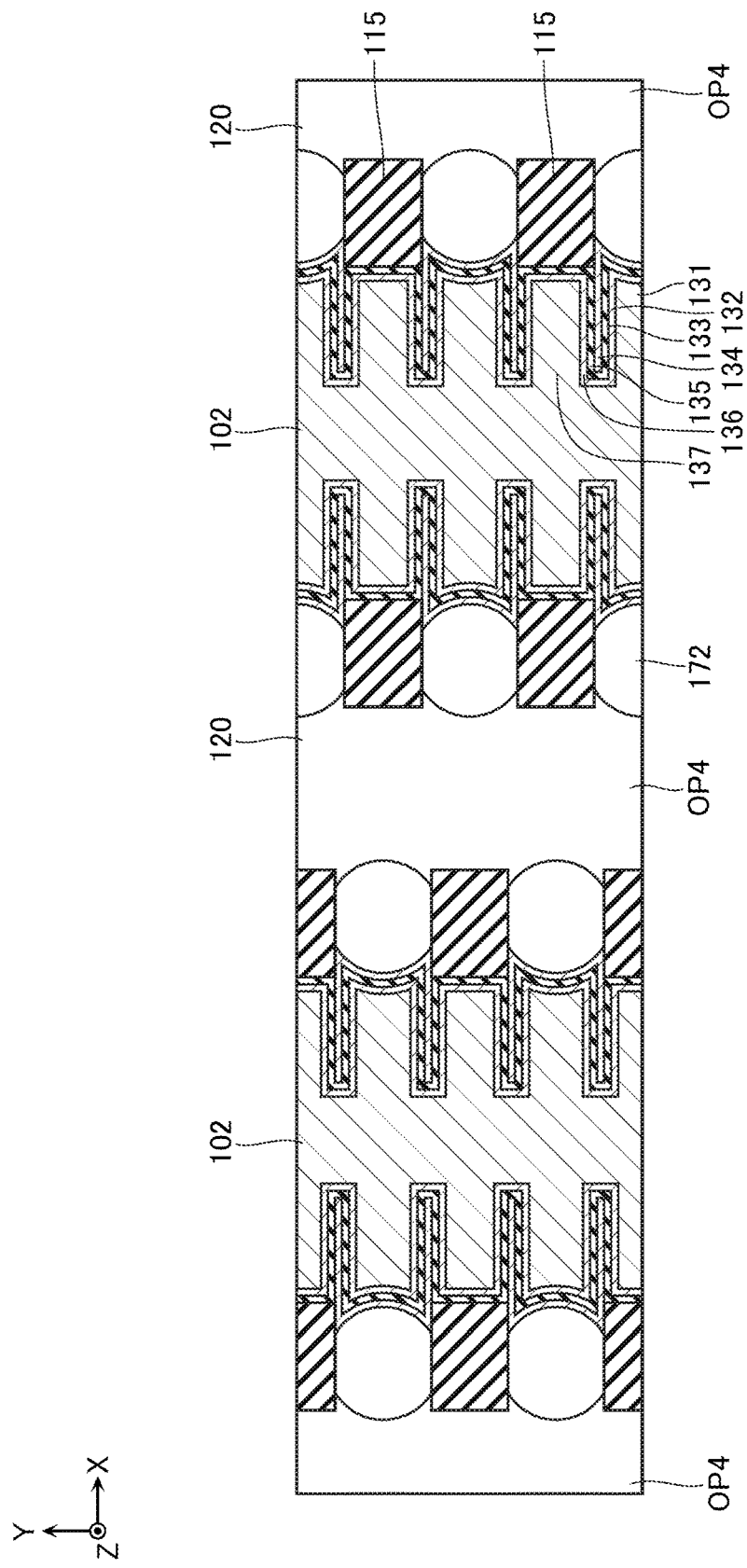
FIG. 35 is a schematic cross-sectional view for describing the manufacturing method.
Figure 36:
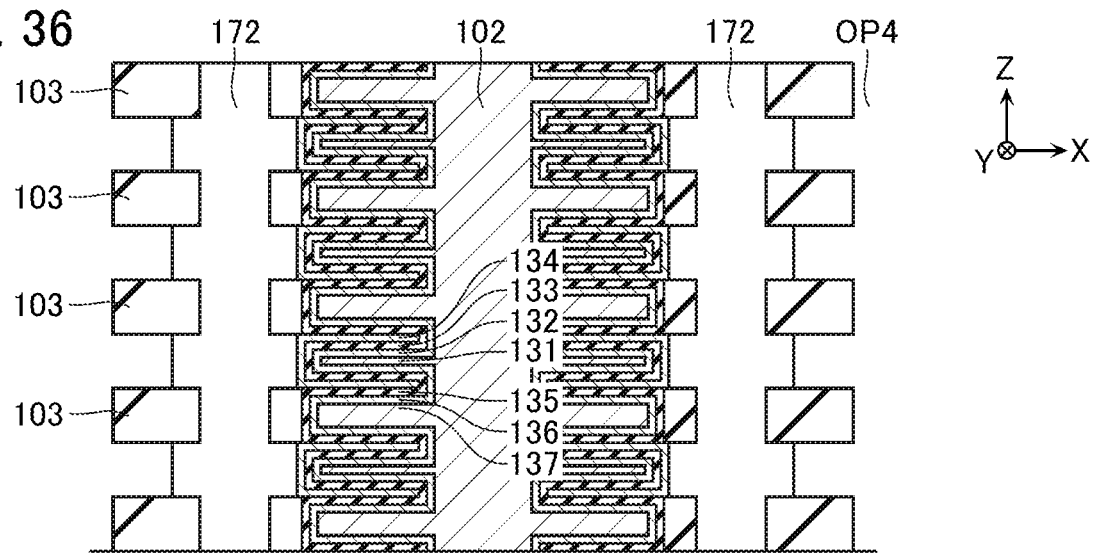
FIG. 36 is a schematic cross-sectional view for describing the manufacturing method.

Next, as illustrated in FIG. 35 and FIG. 36, for example, the sacrifice layers 171 are removed via the openings OP4. This process is performed by a method, such as wet etching.

Figure 37:
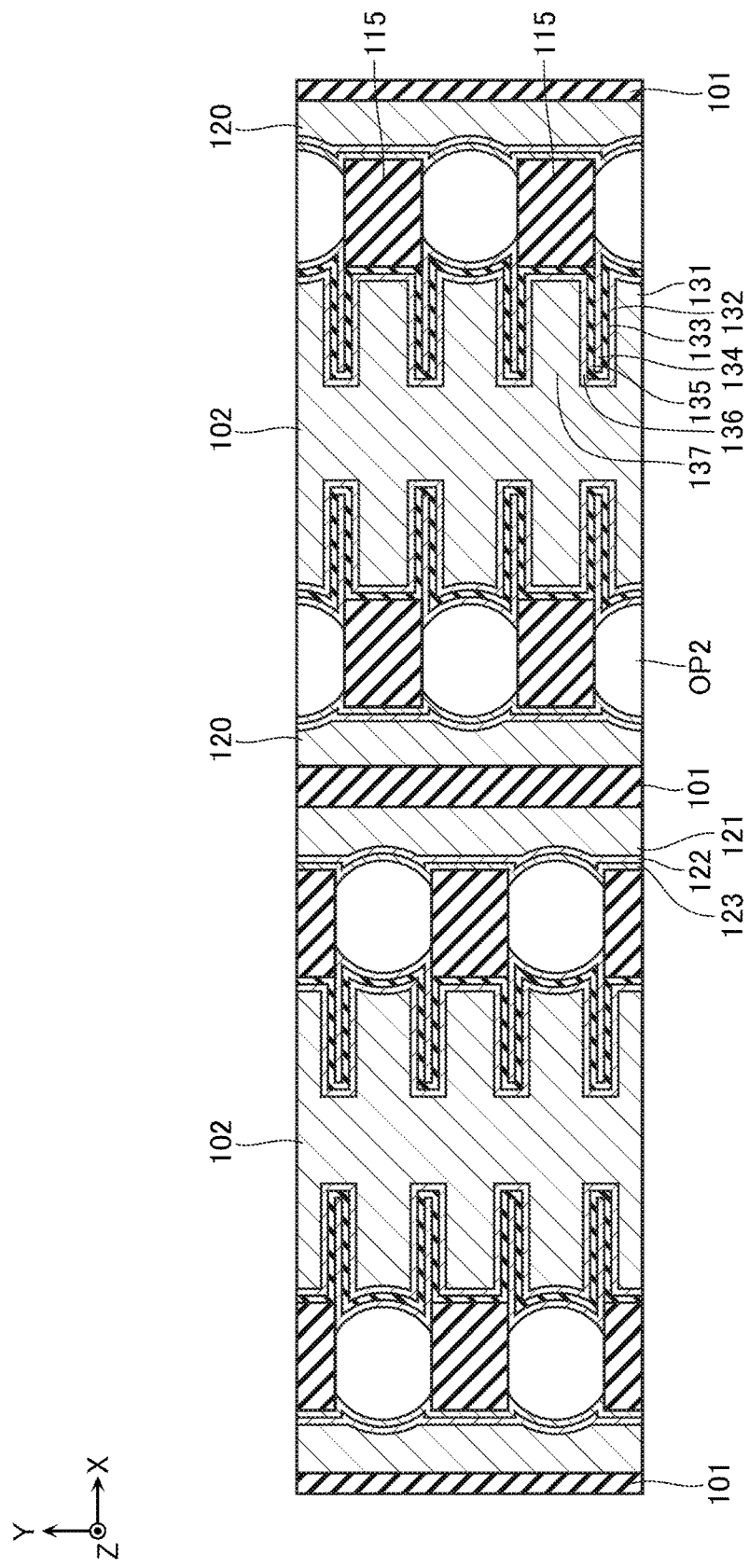
FIG. 37 is a schematic cross-sectional view for describing the manufacturing method.
Figure 38:
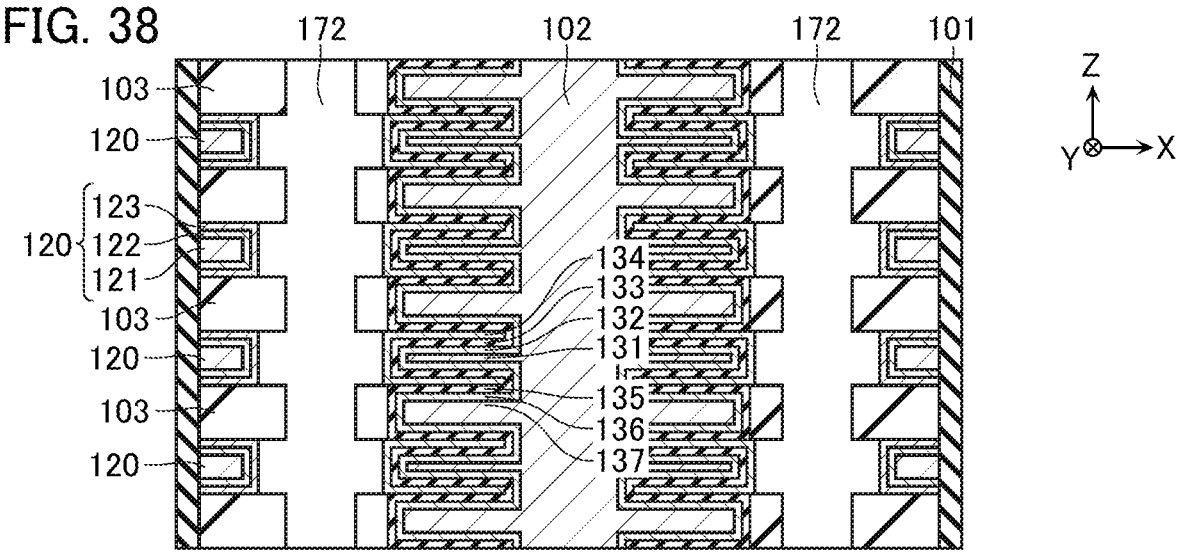
FIG. 38 is a schematic cross-sectional view for describing the manufacturing method.

Next, as illustrated in FIG. 37 and FIG. 38, for example, the conductive layer 120 and the insulating layer 101 are formed via the openings OP4. In this process, an insulating layer and a conductive layer are formed in the opening OP4 and in a space between the insulating layers 103 by a method, such as ALD and CVD. At this point, the space between the insulating layers 103 is embedded with the conductive layer. On the other hand, the opening OP4 is not embedded with the conductive layer. Next, by a method such as wet etching, the portion disposed on an inner circumferential surface of the insulating layer 103 of these insulating layer and conductive layer is removed. Then, the insulating layer 101 is formed inside the opening OP4.

Figure 39:
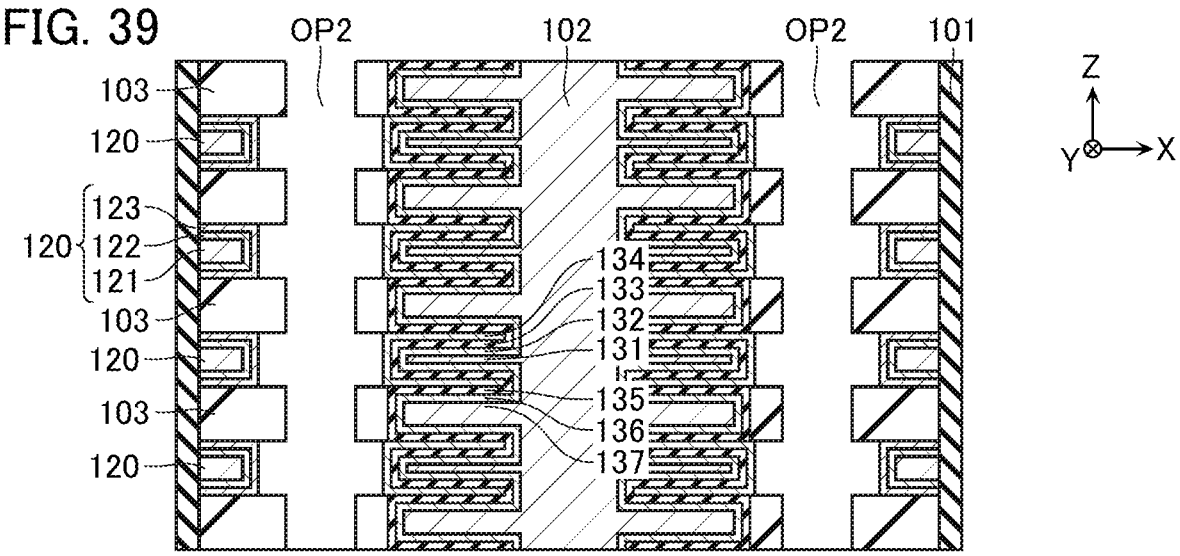
FIG. 39 is a schematic cross-sectional view for describing the manufacturing method.
Figure 40:
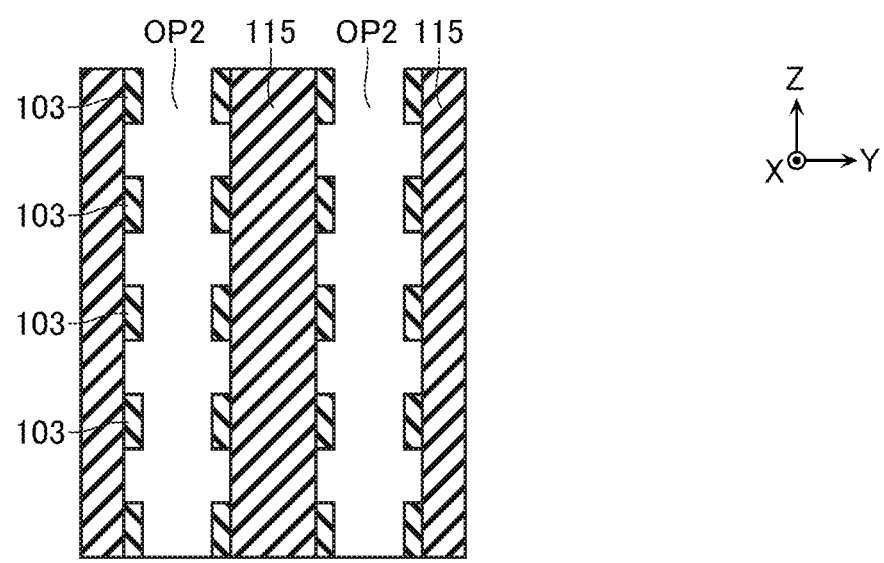
FIG. 40 is a schematic cross-sectional view for describing the manufacturing method.

Next, as illustrated in FIG. 39 and FIG. 40, for example, the sacrifice layers 172 are removed. This process is performed by a method, such as wet etching.

Figure 41:
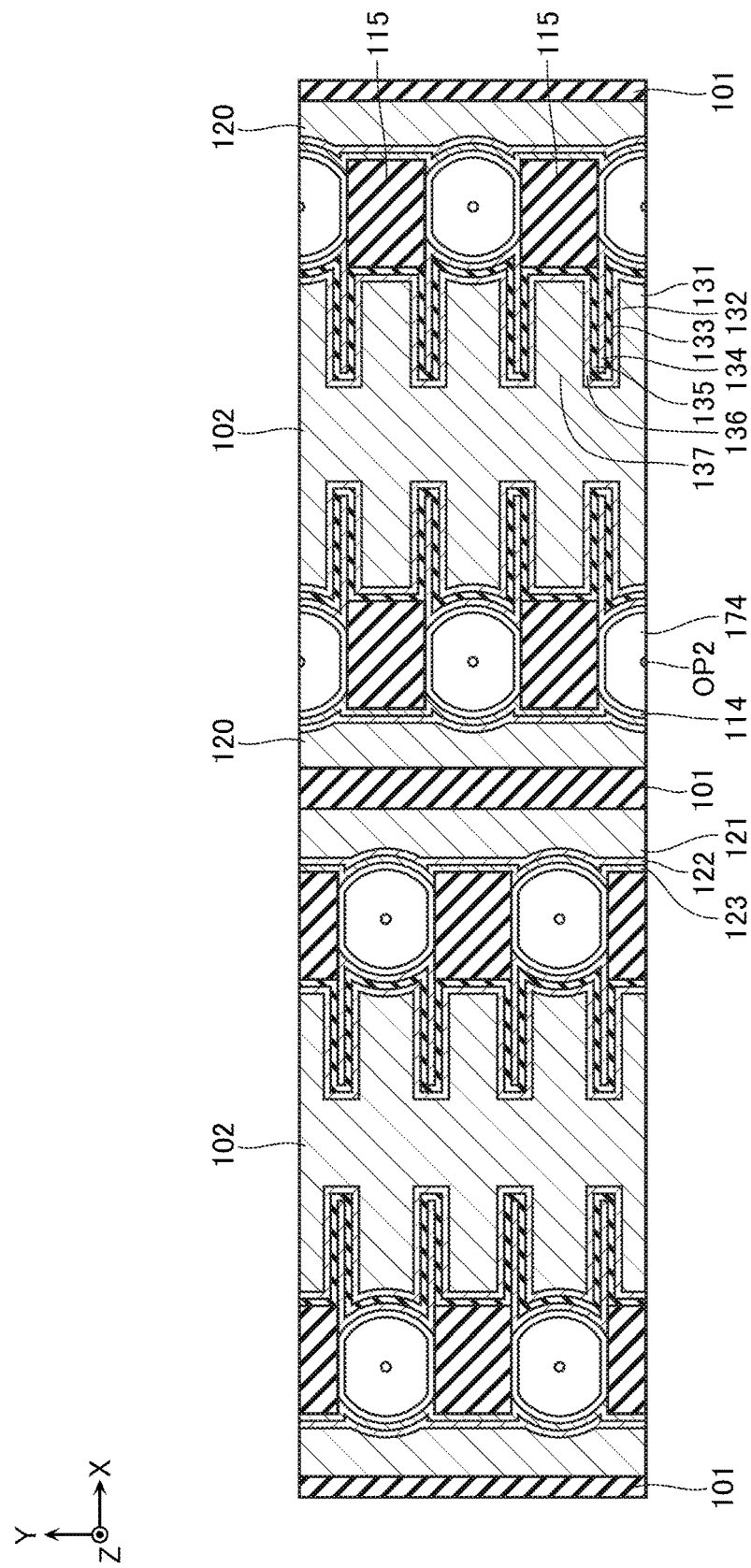
FIG. 41 is a schematic cross-sectional view for describing the manufacturing method.
Figure 42:
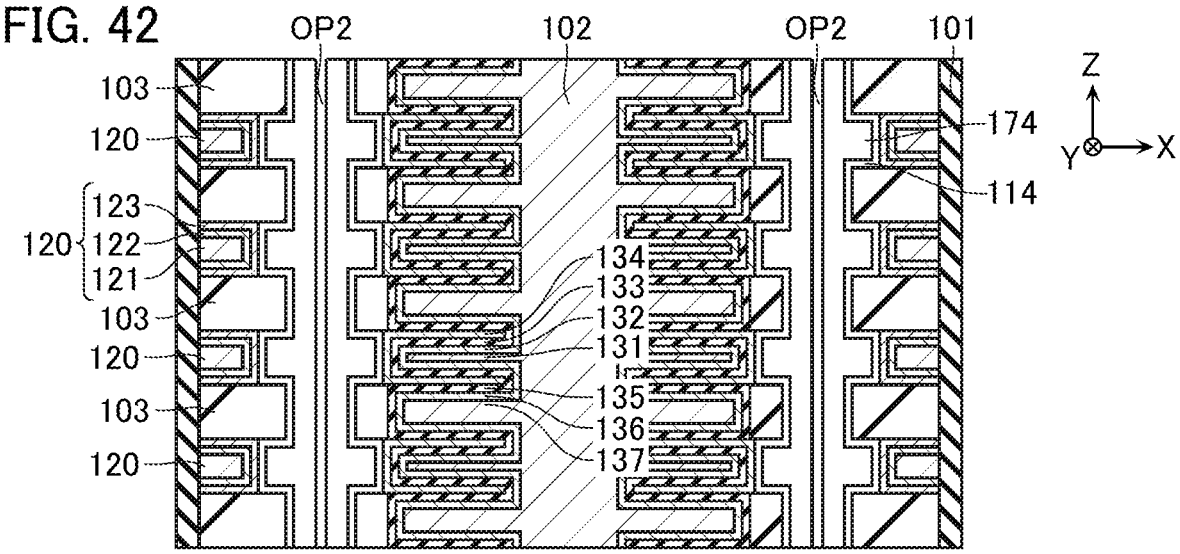
FIG. 42 is a schematic cross-sectional view for describing the manufacturing method.
Figure 43:
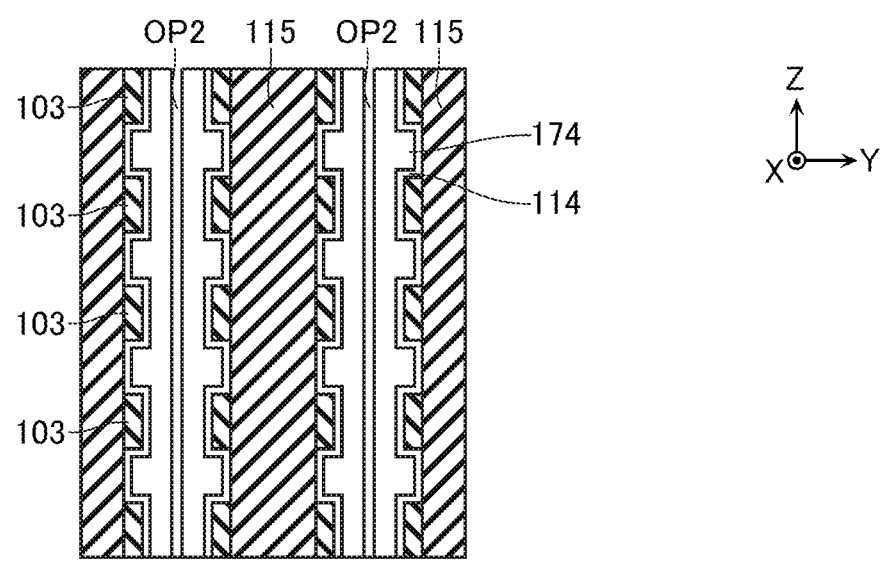
FIG. 43 is a schematic cross-sectional view for describing the manufacturing method.

Next, as illustrated in FIG. 41 to FIG. 43, for example, the semiconductor layer 114 is formed on the side surfaces of the conductive layers 120 and the conductive layers 134 in the X-direction, and the side surfaces of the insulating layer 115 in the Y-direction, and an upper surface, a lower surface, and an inner circumferential surface of the portion corresponding to the opening OP2 of the insulating layer 103 (FIG. 42 and FIG. 43) via the opening OP2. Furthermore, a sacrifice layer 174 is formed inside the opening OP2. In this process, as illustrated in FIG. 42 and FIG. 43, for example, the region between the two insulating layers 103 adjacent in the Z-direction is embedded with the sacrifice layer 174. On the other hand, the opening OP2 is not embedded with the sacrifice layer 174. This process is performed by a method, such as ALD and CVD.

Figure 44:
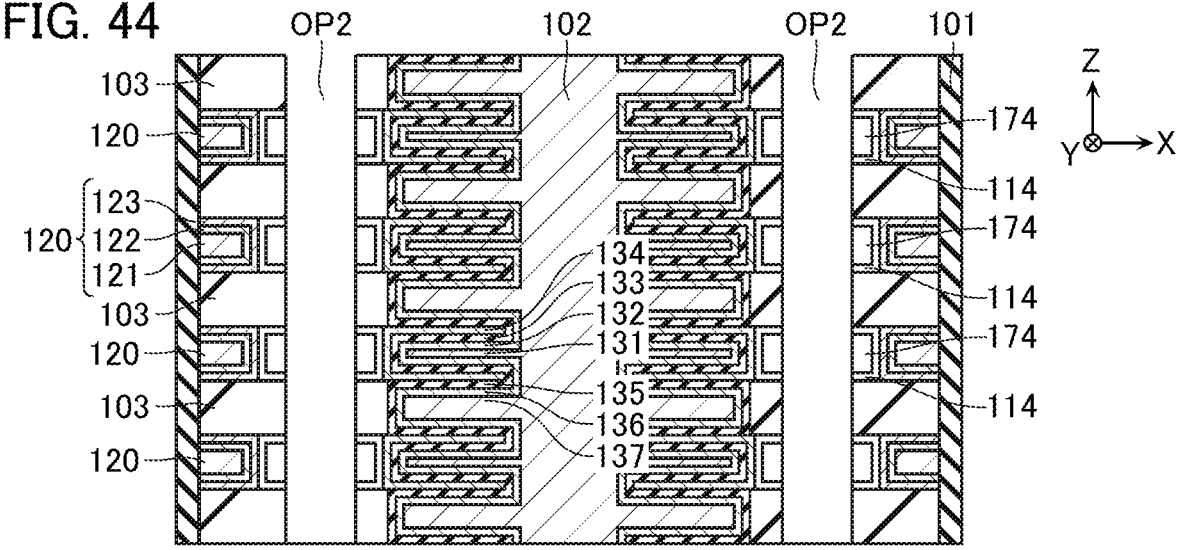
FIG. 44 is a schematic cross-sectional view for describing the manufacturing method.
Figure 45:
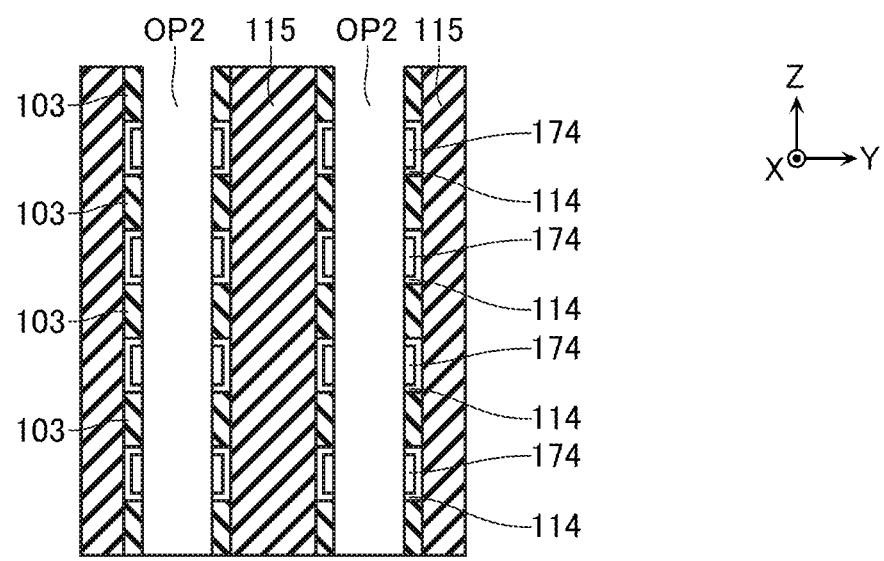
FIG. 45 is a schematic cross-sectional view for describing the manufacturing method.

Next, as illustrated in FIG. 44 and FIG. 45, for example, the sacrifice layer 174 and the semiconductor layer 114 are partially removed via the opening OP2. In this process, for example, the sacrifice layer 174 is partially removed to expose the portion disposed on the inner circumferential surface of the insulating layer 103 of the semiconductor layer 114, and this portion is removed. This process is performed by a method, such as wet etching.

Figure 46:
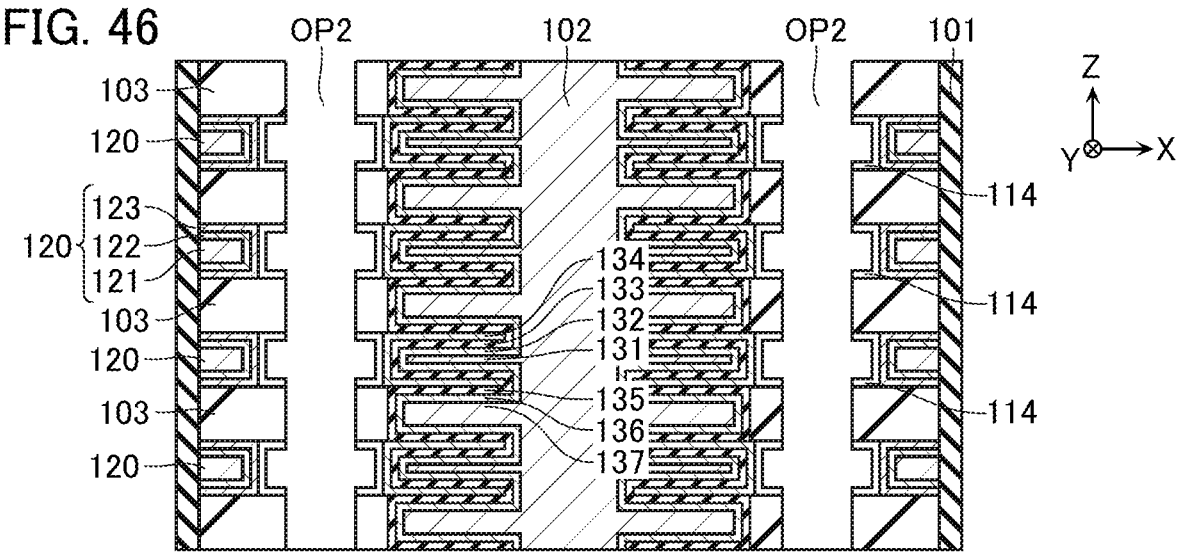
FIG. 46 is a schematic cross-sectional view for describing the manufacturing method.
Figure 47:
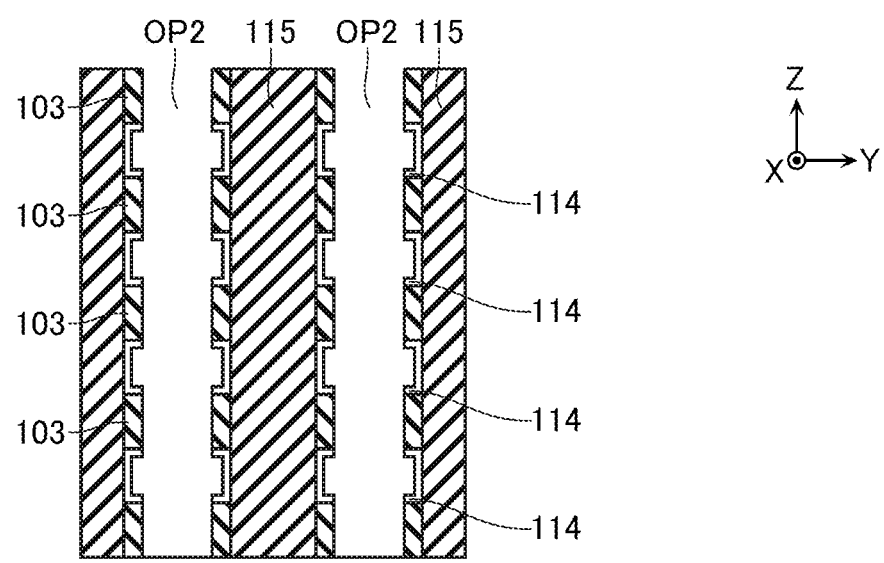
FIG. 47 is a schematic cross-sectional view for describing the manufacturing method.

Next, as illustrated in FIG. 46 and FIG. 47, for example, the sacrifice layers 174 are removed via the openings OP2. This process is performed by a method, such as wet etching.

Next, as illustrated in FIG. 3 to FIG. 6, for example, the insulating layer 113, the conductive layer 112, the conductive layer 111, and the conductive layer 104 are formed inside the opening OP2. This process is performed by a method, such as CVD. Accordingly, the structure described with reference to FIG. 1 to FIG. 7 is formed.

[Effect]

The semiconductor memory device according to the embodiment includes the plurality of semiconductor layers 114 arranged in the Z-direction, the plurality of conductive layers 111 and 112 opposed to these respective plurality of semiconductor layers 114, and the conductive layer 104 connected to these plurality of conductive layers 111 and 112. Furthermore, the respective plurality of semiconductor layers 114 are opposed to the upper surfaces, the lower surfaces, and the side surfaces in the Y-direction of the conductive layers 111 and 112.

Such configuration is manufacturable without increasing the number of processes except the stacking process (process described with reference to FIG. 8) even when the number of the memory layers ML included in the memory cell array MCA increases. Therefore, a high integration can be achieved relatively easily.

Furthermore, in such configuration, the semiconductor layer 114 is configured to surround the upper surfaces, the lower surfaces, and the side surfaces in the Y-direction of the conductive layers 111 and 112. In such configuration, a channel is formed in a portion opposed to the upper surfaces, a portion opposed to the lower surfaces, and portions opposed to the side surfaces in the Y-direction of the conductive layers 111 and 112 in the semiconductor layer 114. Therefore, an ON current of the transistor Tr can be relatively large. Accordingly, this ensures speed-up and stabilization of the performance.

Second Embodiment

[Configuration]

Figure 48:
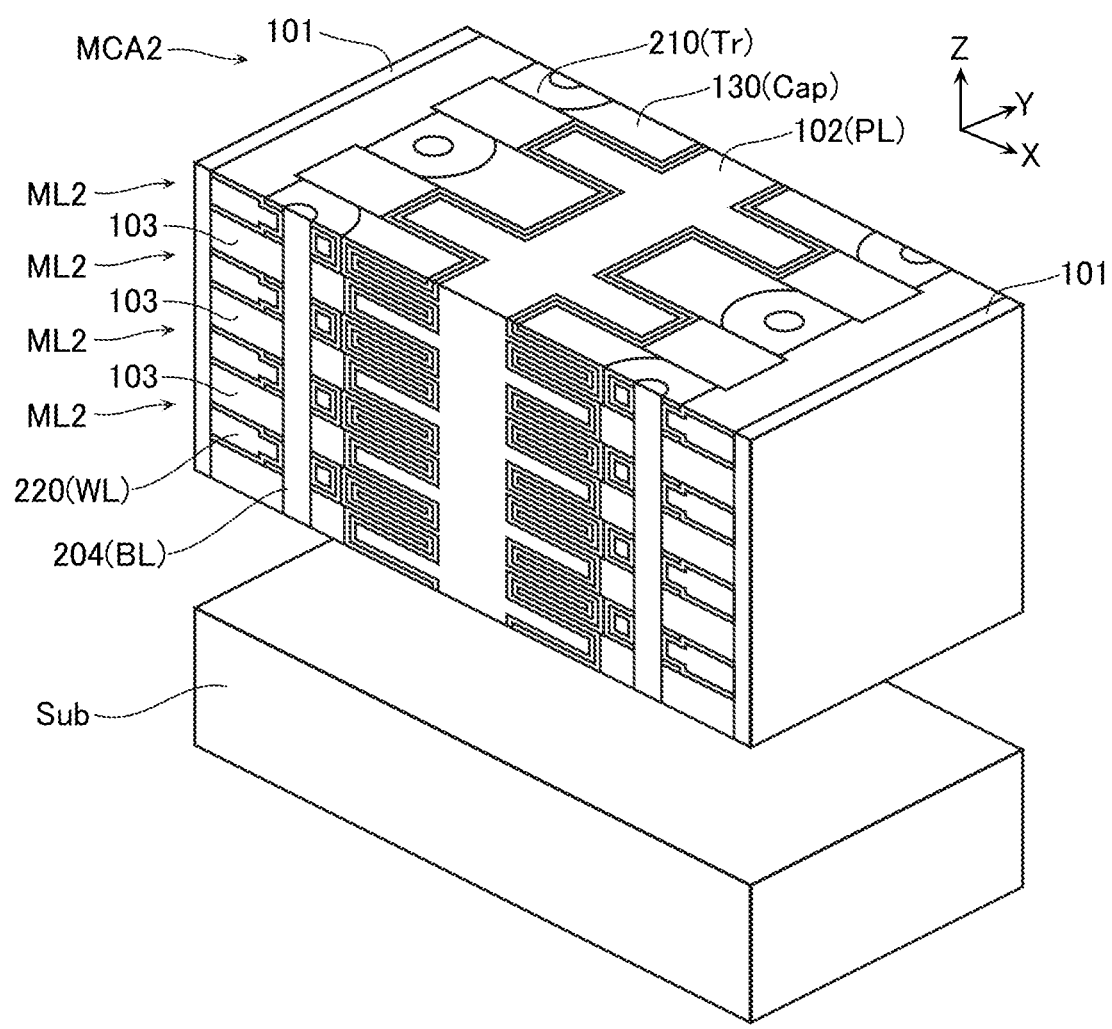
FIG. 48 is a schematic perspective view illustrating a configuration of a part of a semiconductor memory device according to a second embodiment.
Figure 49:
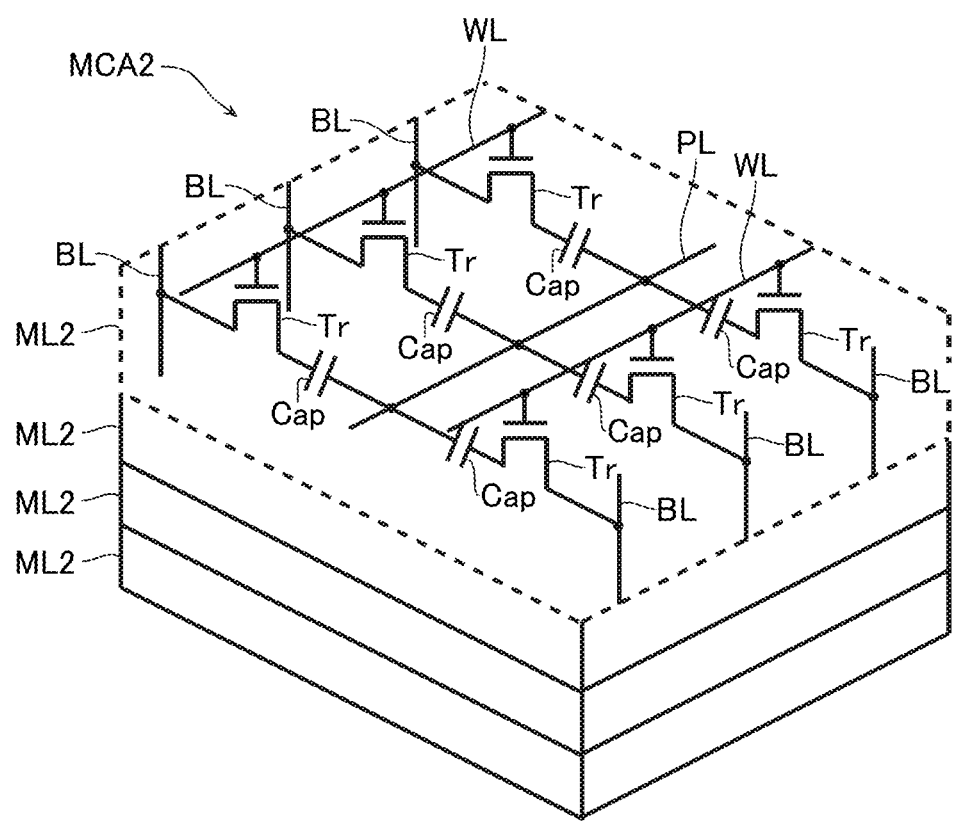
FIG. 49 is a schematic circuit diagram illustrating a configuration of a part of the semiconductor memory device.
Figure 50:
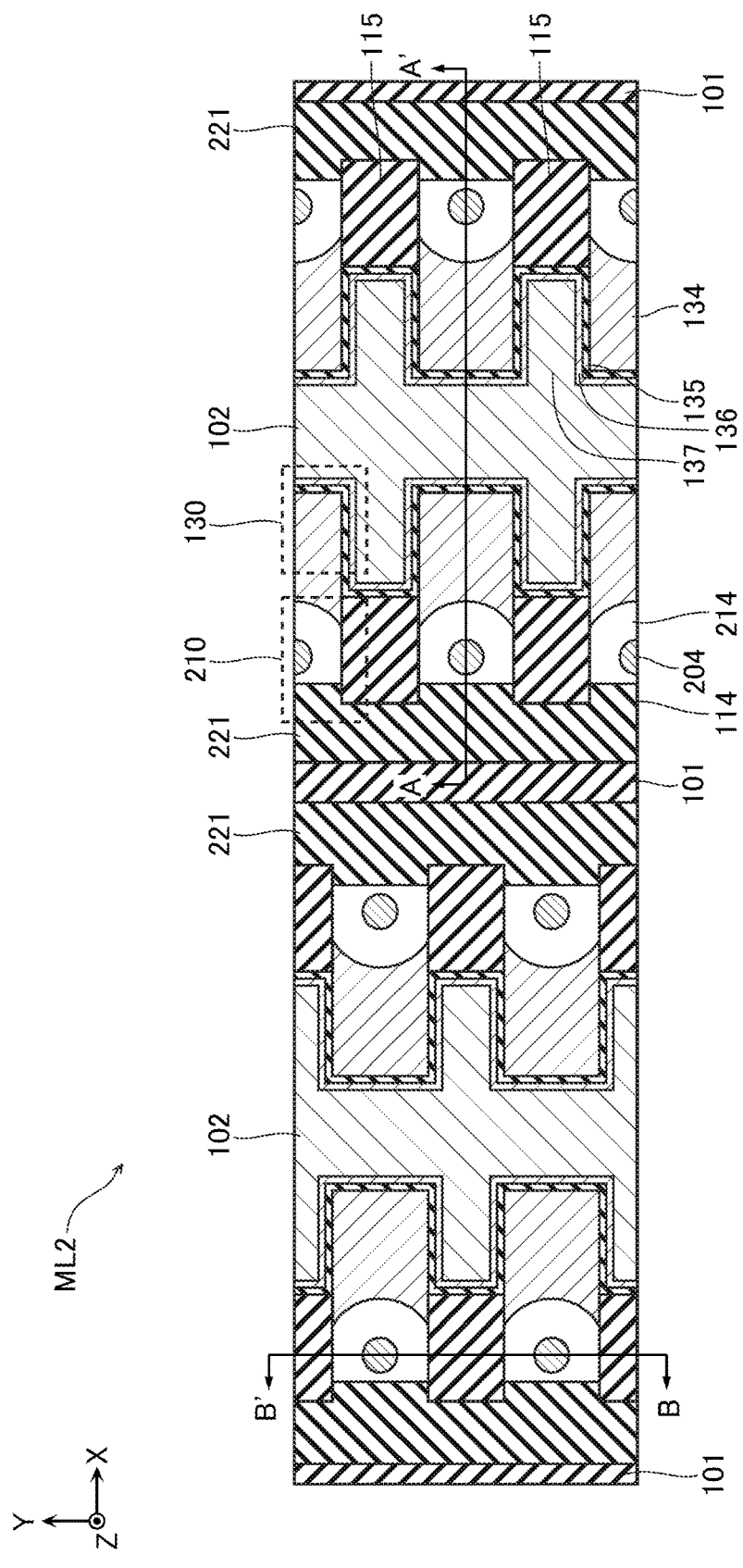
FIG. 50 is a schematic X-Y cross-sectional view illustrating a configuration of a part of the semiconductor memory device.
Figure 51:
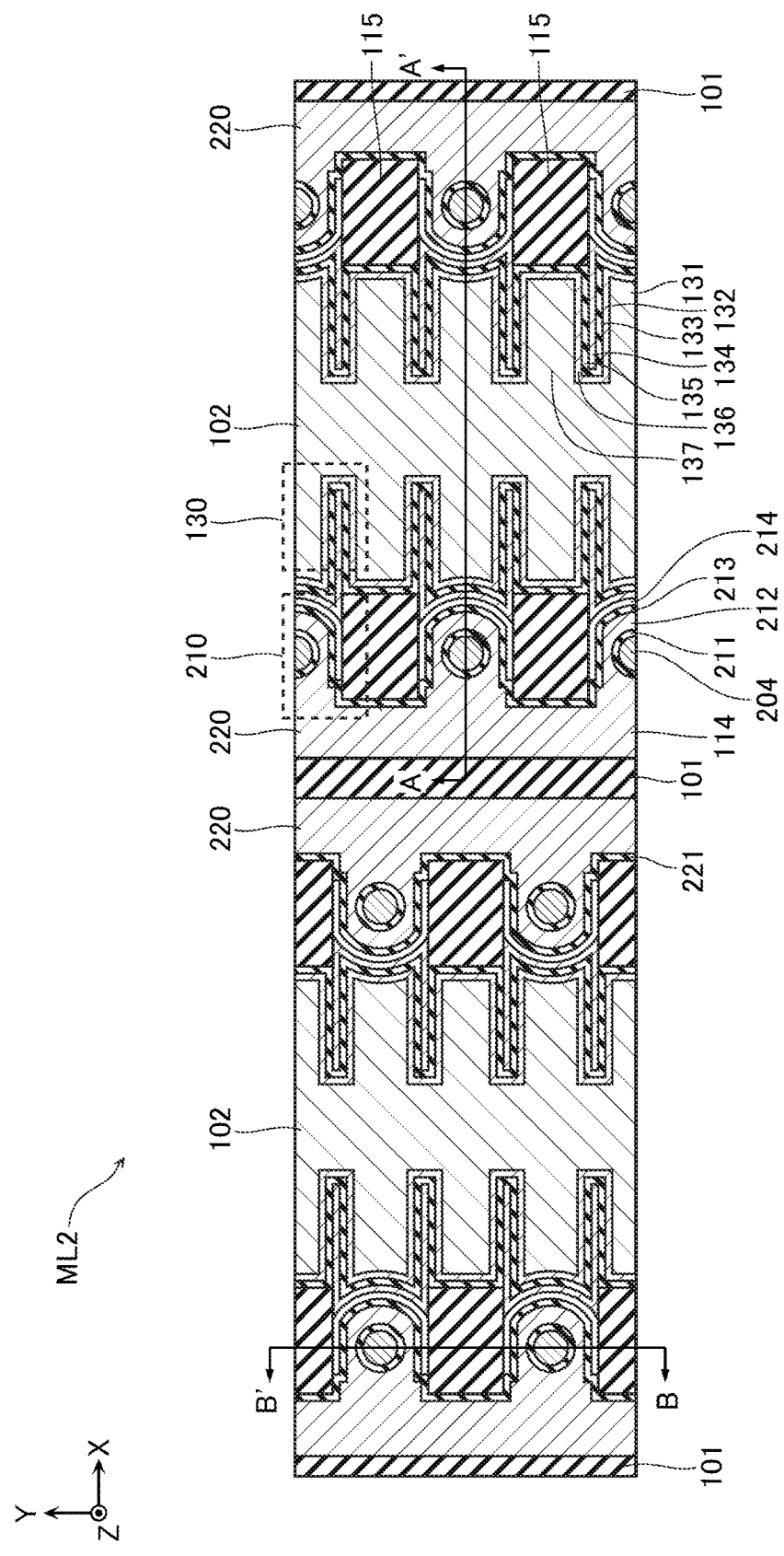
FIG. 51 is a schematic X-Y cross-sectional view illustrating a configuration of a part of the semiconductor memory device.
Figure 52:
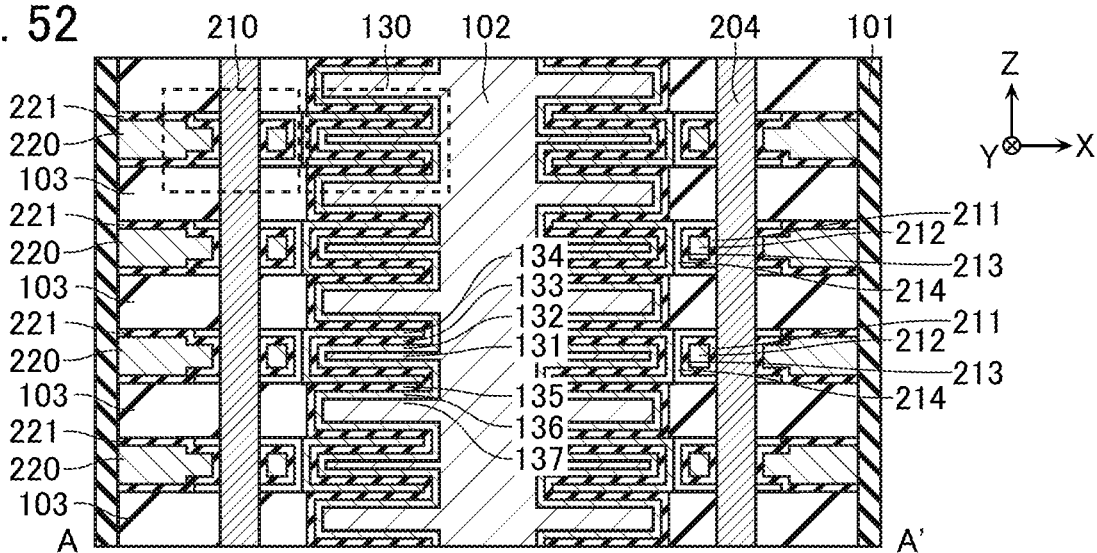
FIG. 52 is a schematic X-Z cross-sectional view of a configuration illustrated in FIG. 50 and FIG. 51 taken along the line A-A' and viewed along the arrow direction.
Figure 53:
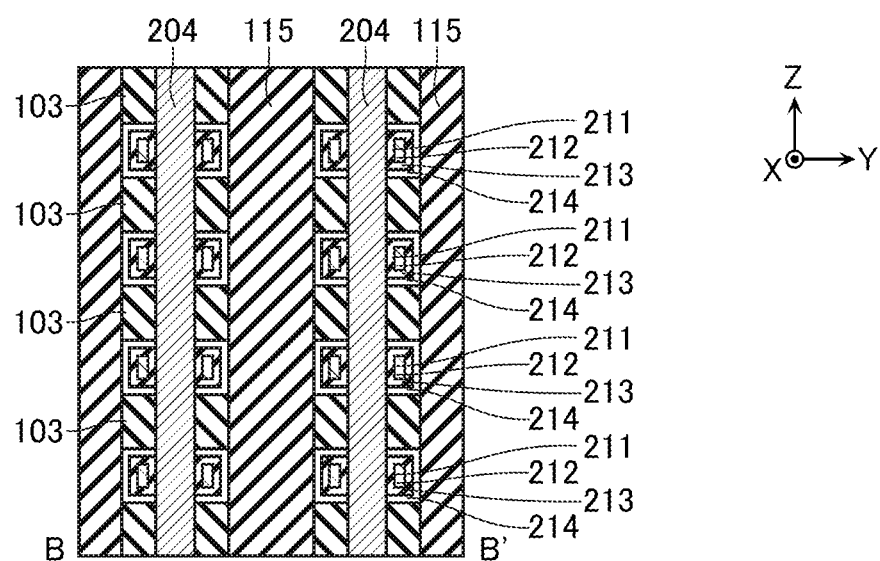
FIG. 53 is a schematic Y-Z cross-sectional view of a configuration illustrated in FIG. 50 and FIG. 51 taken along the line B-B' and viewed along the arrow direction.

FIG. 48 is a schematic perspective view illustrating a configuration of a part of a semiconductor memory device according to the second embodiment. FIG. 49 is a schematic circuit diagram illustrating a configuration of a part of the semiconductor memory device. FIG. 50 and FIG. 51 are schematic X-Y cross-sectional views illustrating configurations of apart of the semiconductor memory device. FIG. 50 and FIG. 51 indicate cross-sectional surfaces of different height positions. FIG. 52 is a schematic X-Z cross-sectional view of a configuration illustrated in FIG. 50 and FIG. 51 taken along the line A-A' and viewed along an arrow direction. FIG. 53 is a schematic Y-Z cross-sectional view of a configuration illustrated in FIG. 50 and FIG. 51 taken along the line B-B' and viewed along an arrow direction.

In the following description, configurations similar to those of the first embodiment are attached by the same reference numerals and their descriptions are omitted.

FIG. 48 illustrates a portion of the semiconductor substrate Sub and a memory cell array MCA2 disposed on the semiconductor substrate Sub.

As illustrated in FIG. 48, the memory cell array MCA2 includes the plurality of insulating layers 101 and the plurality of conductive layers 102 arranged alternately in the X-direction. Furthermore, between the insulating layer 101 and the conductive layer 102, a plurality of memory layers ML2 arranged in the Z-direction via insulating layers 103 and a plurality of conductive layers 204 extending in the Z-direction and arranged in the Y-direction are disposed. The memory layer ML2 includes a plurality of transistor structures 210 disposed along outer circumferential surfaces of the plurality of conductive layers 204, a conductive layer 220 disposed between the plurality of transistor structures 210 and the insulating layer 101, and a plurality of capacitor structures 130 disposed between the plurality of transistor structures 210 and the conductive layer 102.

The conductive layer 204 contains, for example, a stacked structure of indium tin oxide (ITO), titanium nitride (TiN), and tungsten (W). The conductive layer 204 functions as, for example, the bit line BL (FIG. 49). The plurality of bit lines BL are disposed corresponding to the plurality of transistors Tr included in the memory layer ML2. Furthermore, the bit line BL is connected in common to source electrodes of the plurality of transistors Tr corresponding to the plurality of memory layers ML2. The conductive layer 204 contains, for example, tungsten (W).

The transistor structure 210 includes, as illustrated in FIG. 51 to FIG. 53, for example, an insulating layer 211 disposed on the outer circumferential surface of the conductive layer 204, a conductive layer 212 disposed on an outer circumferential surface of the insulating layer 211, an insulating layer 213 disposed on an upper surface, a lower surface, and an outer circumferential surface of the conductive layer 212, and a semiconductor layer 214 disposed on an upper surface, a lower surface, and an outer circumferential surface of the insulating layer 213.

In the X-Y cross-sectional surface exemplarily illustrated in FIG. 51, the outer circumferential surface of the insulating layer 211 may be formed along a circle around a center position of the conductive layer 204. Furthermore, side surfaces in one side in the X-direction (conductive layer 102 side) of the conductive layer 212, the insulating layer 213, and the semiconductor layer 214 may be formed along the circle around the center position of the conductive layer 204. Furthermore, both side surfaces of the conductive layer 212, the insulating layer 213, and the semiconductor layer 214 in the Y-direction may be linearly formed along the side surface of the insulating layer 115.

The insulating layer 211 contains, for example, silicon oxide ($SiO_2$). The insulating layer 211 surrounds the outer circumferential surface of the conductive layer 204 over the whole circumference.

The conductive layer 212 functions as, for example, agate electrode of the transistor Tr (FIG. 49). The conductive layer 212 includes, for example, a stacked structure of titanium nitride (TiN), and tungsten (W). The conductive layer 212 surrounds the outer circumferential surface of the insulating layer 211 over the whole circumference. As illustrated in FIG. 51, the plurality of conductive layers 212 arranged in the Y-direction are connected in common to the conductive layer 220 extending in the Y-direction.

The insulating layer 213 functions as, for example, the gate insulating film of the transistor Tr (FIG. 49). The insulating layer 213 contains, for example, silicon oxide ($SiO_2$). The insulating layer 213 covers both side surfaces in the Y-direction and one side surface in the X-direction (conductive layer 102 side) of the conductive layer 212.

The semiconductor layer 214 functions as, for example, a channel region of the transistor Tr (FIG. 49). The semiconductor layer 214 may be, for example, a semiconductor containing at least one element of gallium (Ga) and aluminum (Al), and containing indium (In), zinc (Zn), and oxygen (O), or another oxide semiconductor. The semiconductor layer 214 covers both side surfaces in the Y-direction and one side surface (conductive layer 102 side) in the X-direction of the conductive layer 212 via the insulating layer 213. As illustrated in FIG. 52 and FIG. 53, the plurality of semiconductor layers 214 arranged in the Z-direction are connected in common to the conductive layer 204 extending in the Z-direction. As illustrated in FIG. 50, the insulating layer 115 such as silicon oxide ($SiO_2$) is disposed between the two semiconductor layers 214 adjacent in the Y-direction.

The conductive layer 220 functions as, for example, a word line WL (FIG. 49) of the memory cell array MCA2. As illustrated in FIG. 51, for example, the conductive layer 220 extends in the Y-direction and is connected to the plurality of conductive layers 212 arranged in the Y-direction. The conductive layer 220 contains, for example, a stacked structure of indium tin oxide (ITO), titanium nitride (TiN), and tungsten (W). An upper surface and a lower surface of the conductive layer 220 are covered by the insulating layer 221, such as silicon oxide ($SiO_2$) The insulating layer 221 is connected to the insulating layer 211 and the insulating layer 213.

[Manufacturing Method]

FIG. 54 to FIG. 67 are schematic cross-sectional views for describing the manufacturing method of the semiconductor memory device according to the second embodiment. FIG. 54, FIG. 55, FIG. 57, FIG. 60, FIG. 62, FIG. 64, and FIG. 66 indicate the portion corresponding to FIG. 52. FIG. 56, FIG. 59, FIG. 61, FIG. 63, and FIG. 65 indicate the portion corresponding to FIG. 51. FIG. 58 and FIG. 67 indicate the portion corresponding to FIG. 53.

Among the manufacturing processes of the semiconductor memory device according to the first embodiment, up to the process described with reference to FIG. 31 and FIG. 32 is performed in the manufacturing method.

Figure 54:
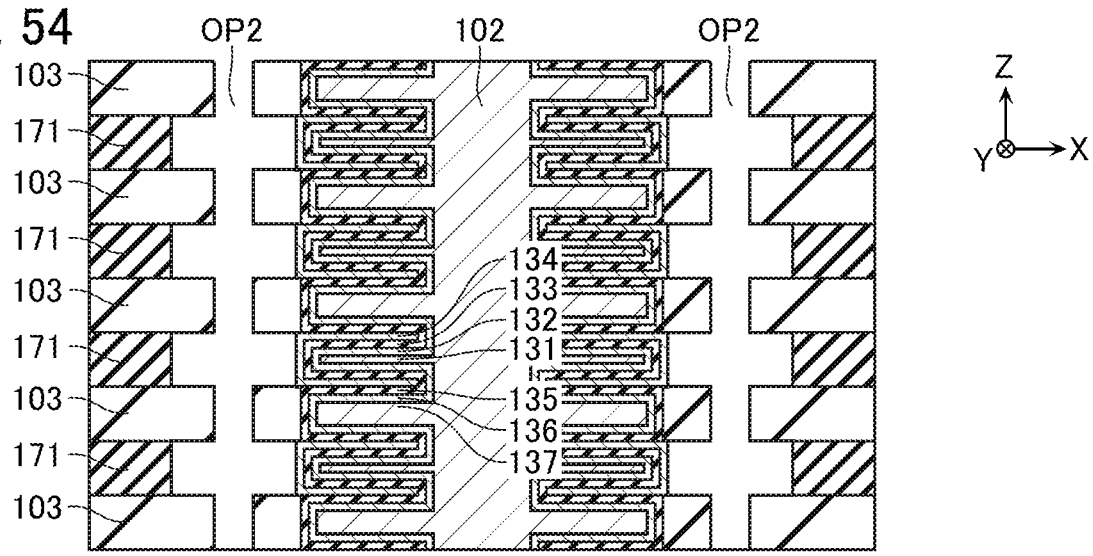
FIG. 54 is a schematic cross-sectional view for describing a manufacturing method for the semiconductor memory device according to the second embodiment.

Next, as illustrated in FIG. 54, for example, the sacrifice layer 172 is removed. This process is performed by a method, such as wet etching.

Figure 55:
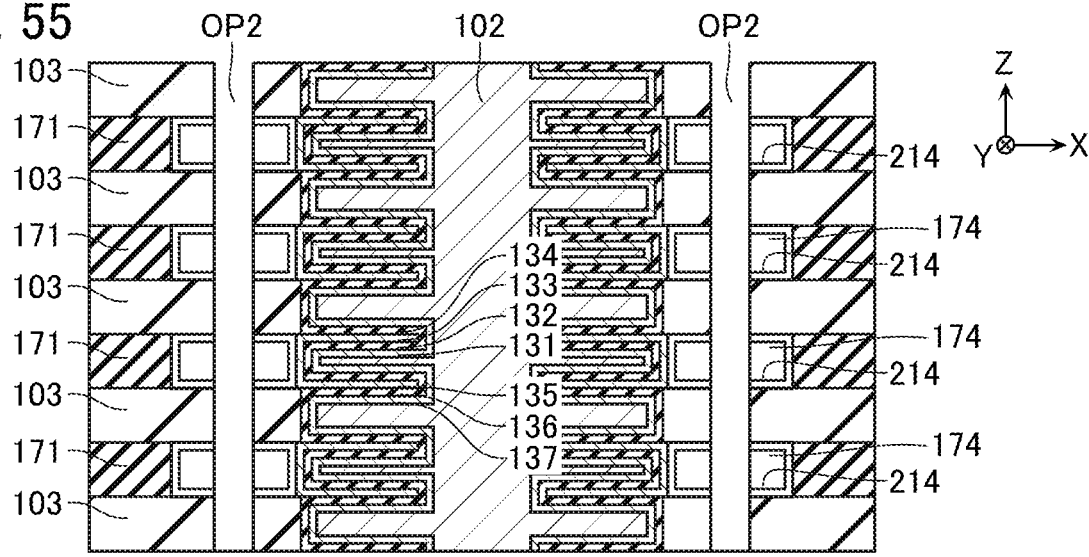
FIG. 55 is a schematic cross-sectional view for describing the manufacturing method.

Next, as illustrated in FIG. 55, for example, the semiconductor layer 214 is formed on side surfaces of the sacrifice layer 171 and the conductive layer 134 in the X-direction, the side surface of the insulating layer 115 in the Y-direction, and an upper surface and a lower surface of the insulating layer 103 (FIG. 42, FIG. 43) via the opening OP2. Furthermore, the sacrifice layer 174 is formed in a region between the two insulating layers 103 adjacent in the Z-direction. This process is performed, for example, similarly to the process described with reference to FIG. 41 to FIG. 45.

Figure 56:
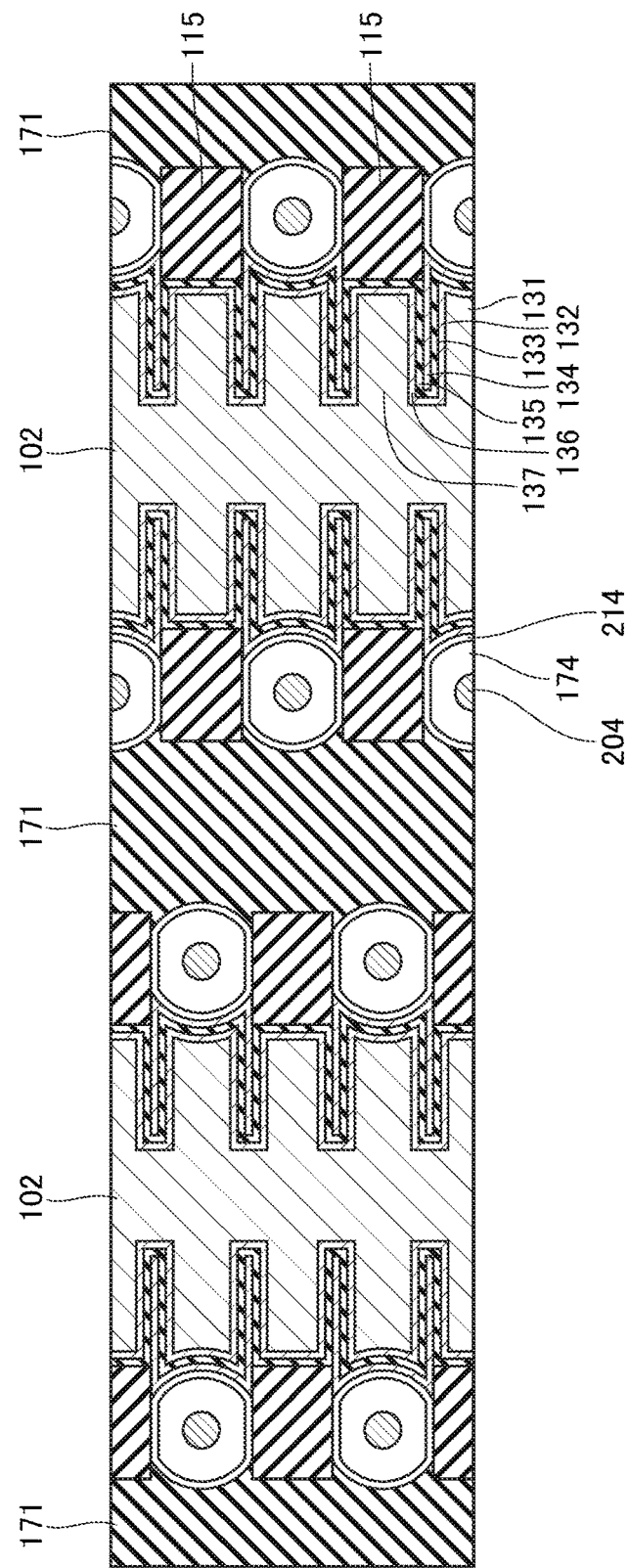
FIG. 56 is a schematic cross-sectional view for describing the manufacturing method.
Figure 57:
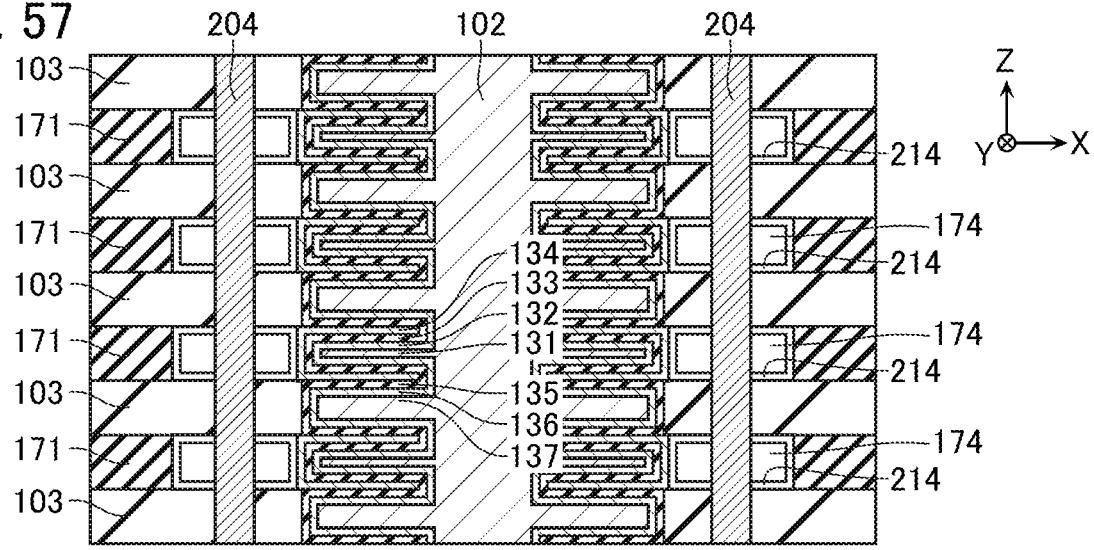
FIG. 57 is a schematic cross-sectional view for describing the manufacturing method.
Figure 58:
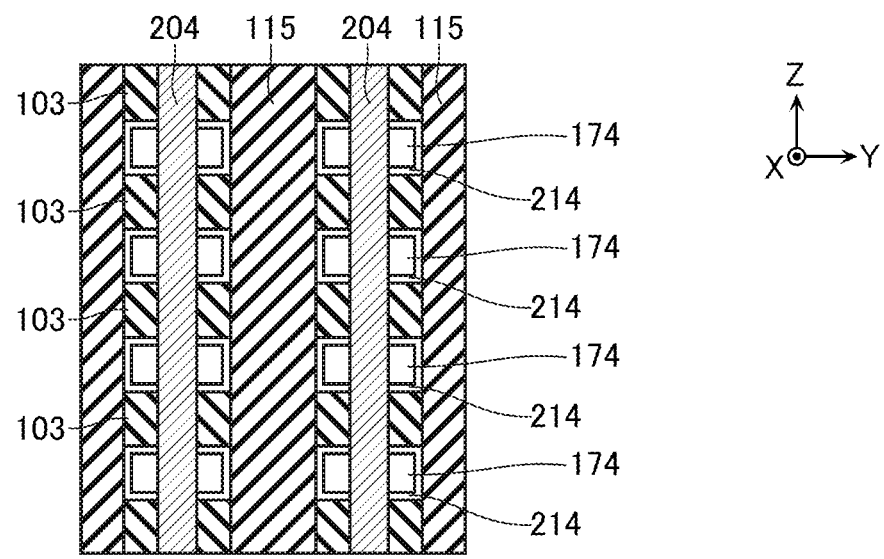
FIG. 58 is a schematic cross-sectional view for describing the manufacturing method.

Next, as illustrated in FIG. 56 to FIG. 58, for example, the conductive layer 204 is formed inside the opening OP2. This process is performed by a method, such as ALD and CVD.

Figure 59:
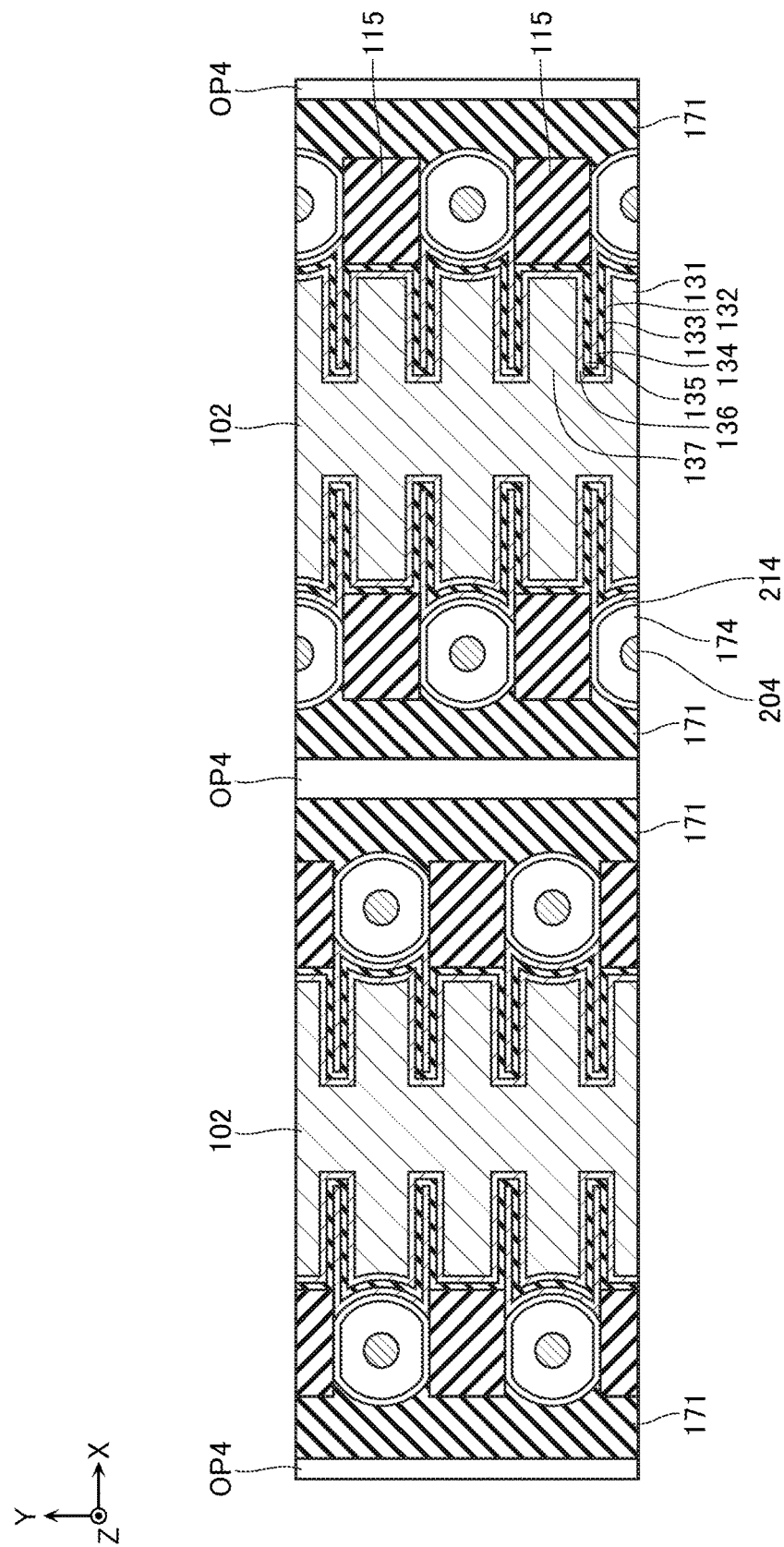
FIG. 59 is a schematic cross-sectional view for describing the manufacturing method.
Figure 60:
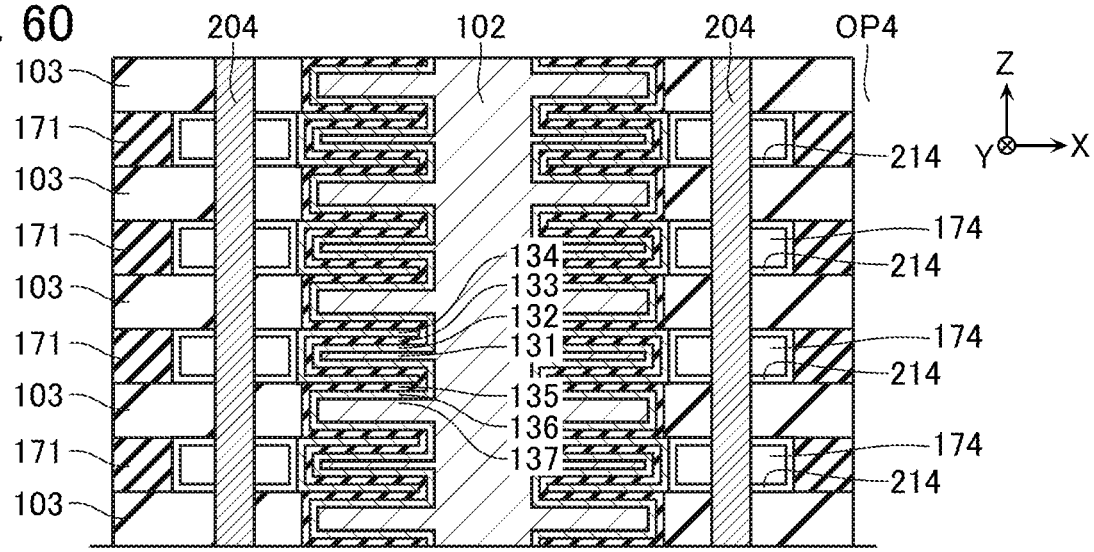
FIG. 60 is a schematic cross-sectional view for describing the manufacturing method.

Next, as illustrated in FIG. 59 and FIG. 60, for example, the opening OP4 is formed in a position corresponding to the insulating layer 101. This process is performed by a method, such as RIE.

Figure 61:
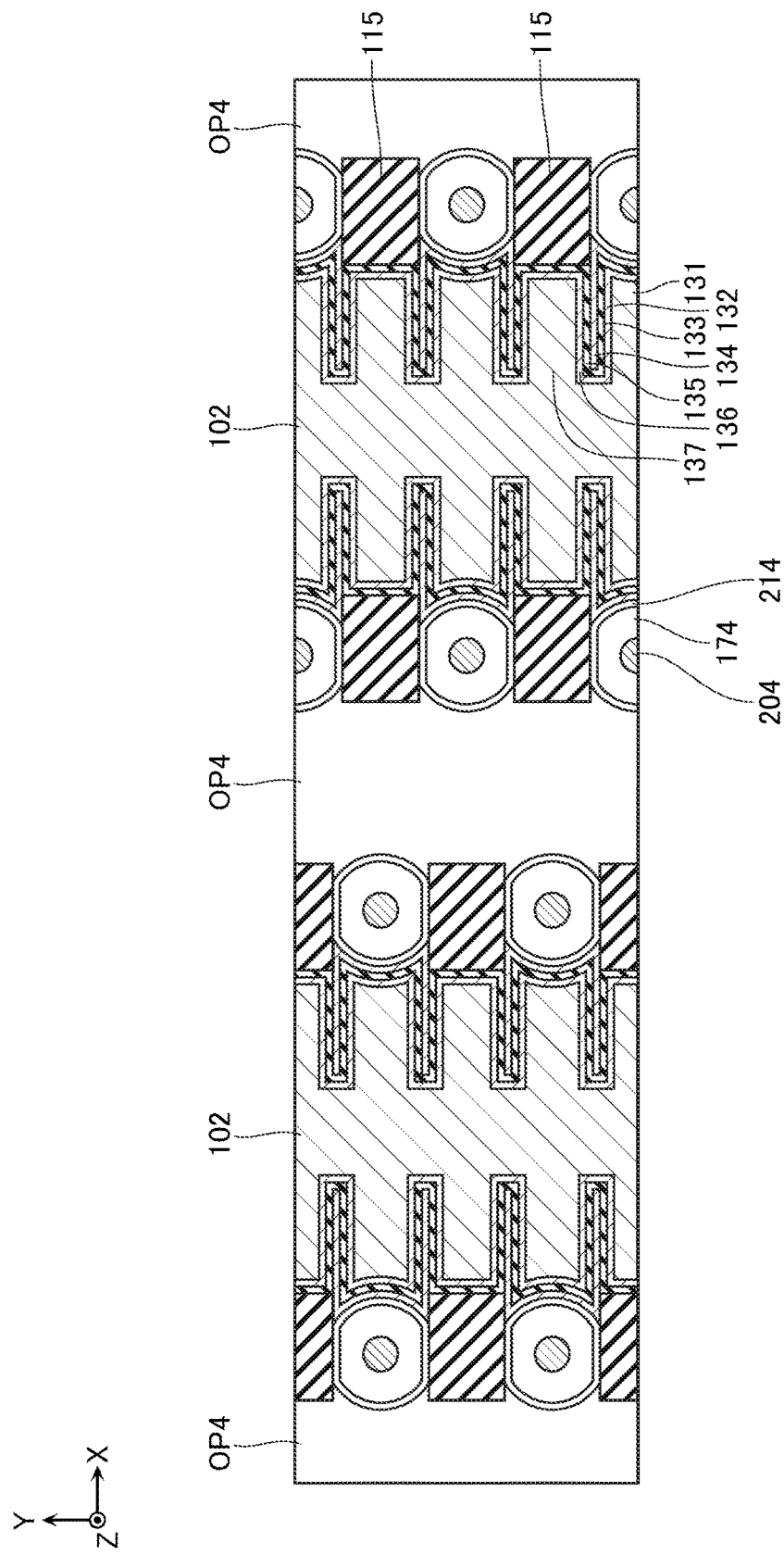
FIG. 61 is a schematic cross-sectional view for describing the manufacturing method.
Figure 62:
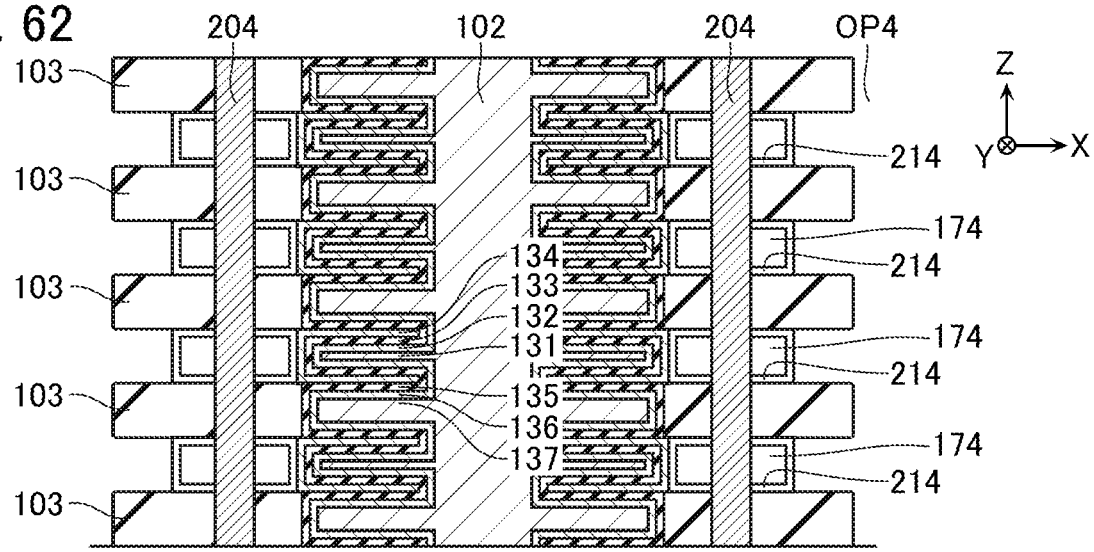
FIG. 62 is a schematic cross-sectional view for describing the manufacturing method.

Next, as illustrated in FIG. 61 and FIG. 62, for example, the sacrifice layer 171 is removed via the opening OP4. This process is performed by a method, such as wet etching.

Figure 63:
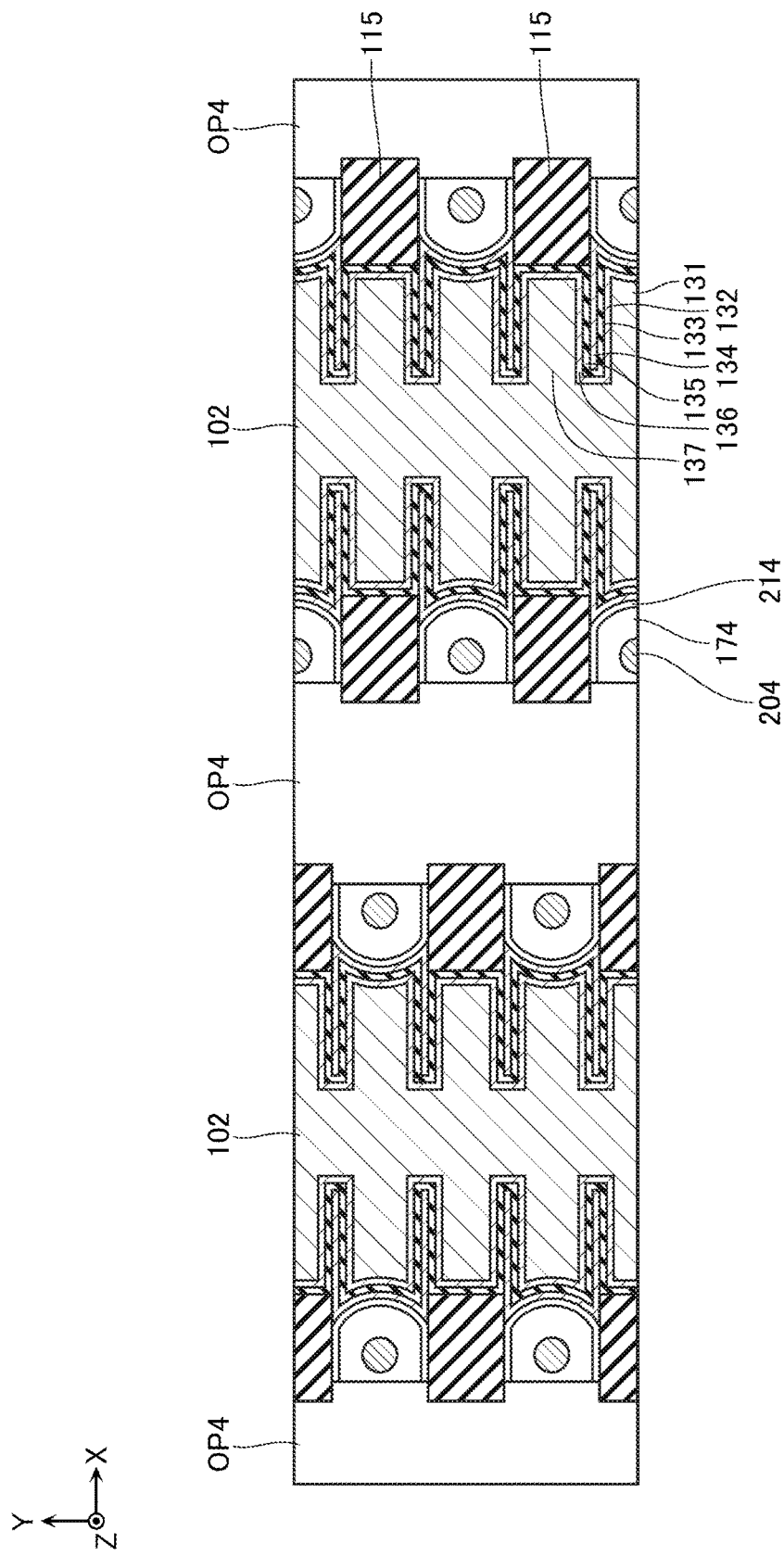
FIG. 63 is a schematic cross-sectional view for describing the manufacturing method.
Figure 64:
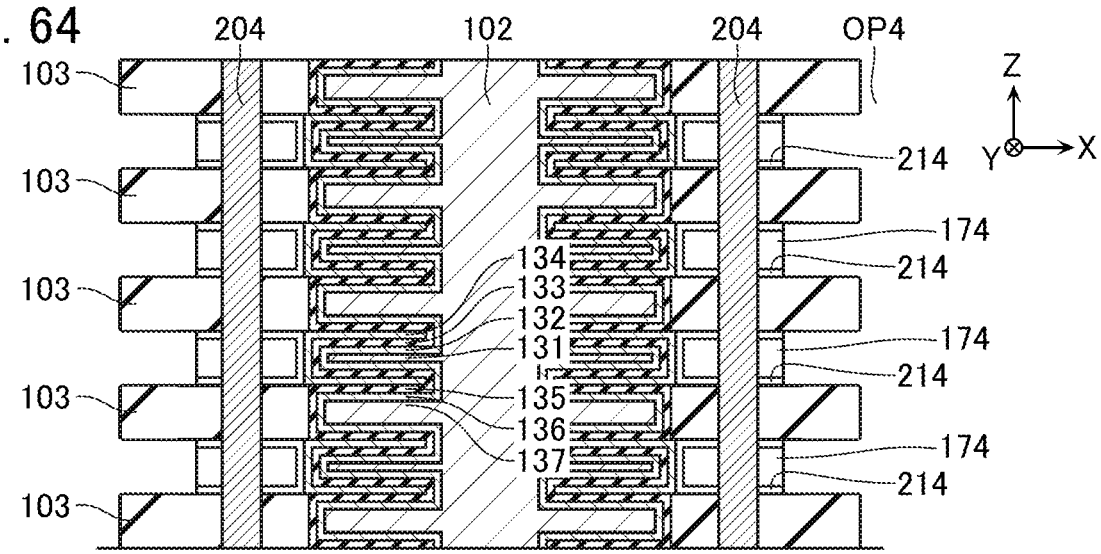
FIG. 64 is a schematic cross-sectional view for describing the manufacturing method.

Next, as illustrated in FIG. 63 and FIG. 64, for example, the semiconductor layer 214 is partially removed to partially expose the sacrifice layer 174 via the opening OP4. This process is performed by a method, such as wet etching.

Figure 65:
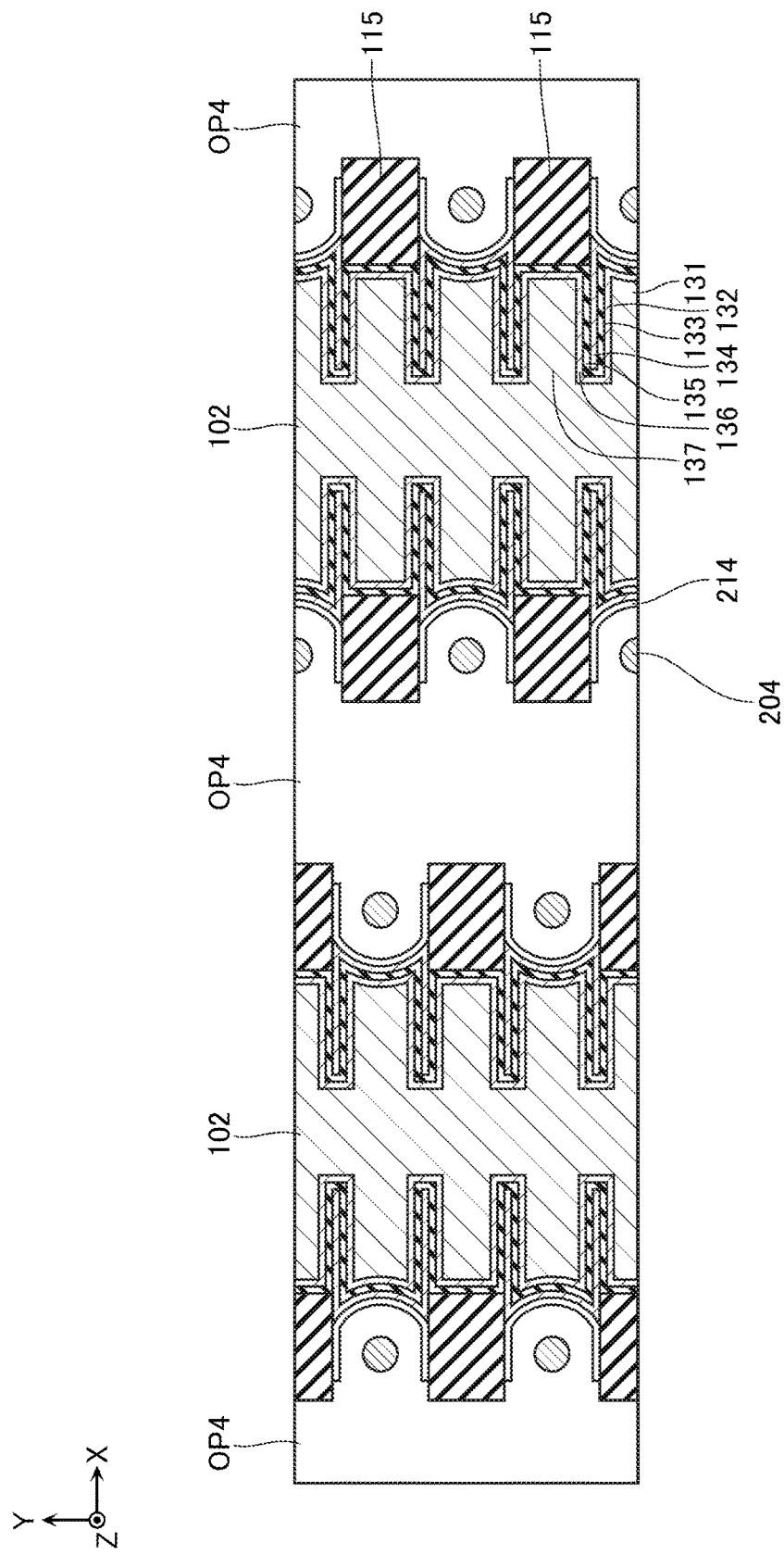
FIG. 65 is a schematic cross-sectional view for describing the manufacturing method.
Figure 66:
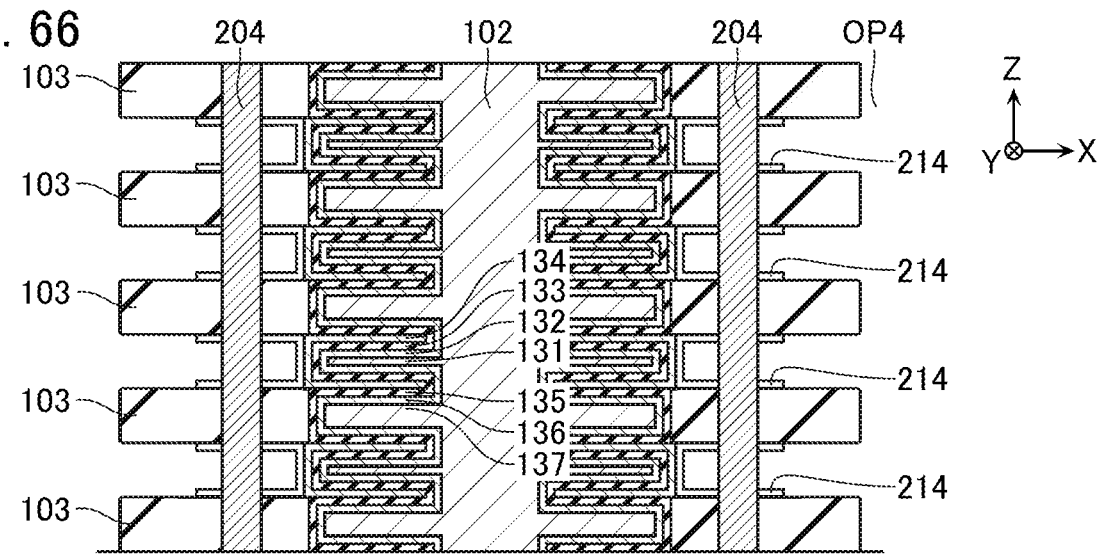
FIG. 66 is a schematic cross-sectional view for describing the manufacturing method.
Figure 67:
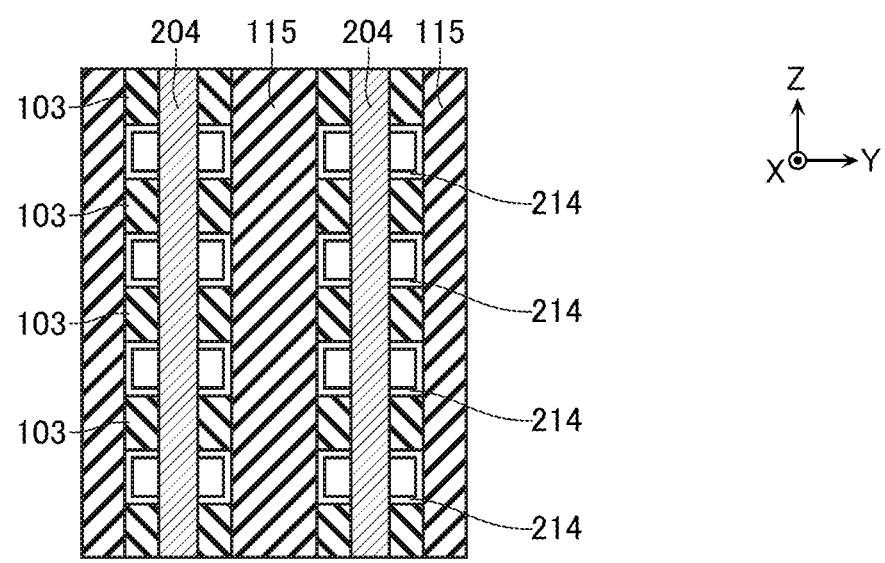
FIG. 67 is a schematic cross-sectional view for describing the manufacturing method.

Next, as illustrated in FIG. 65 to FIG. 67, for example, the sacrifice layer 174 is removed to expose the outer circumferential surface of the conductive layer 204 via the opening OP4. This process is performed by a method, such as wet etching.

Next, as illustrated in FIG. 51 to FIG. 53, for example, the insulating layers 211, 213, and 221 are formed, the conductive layers 212 and 220 are formed, and the insulating layer 101 are formed inside the opening OP4. This process is performed similarly to the process described with reference to FIG. 37 and FIG. 38. Accordingly, a structure described with reference to FIG. 48 to FIG. 53 is formed.

[Effect]

The semiconductor memory device according to the embodiment can exert an effect similar to that of the semiconductor memory device according to the first embodiment.

Third Embodiment

[Configuration]

Figure 68:
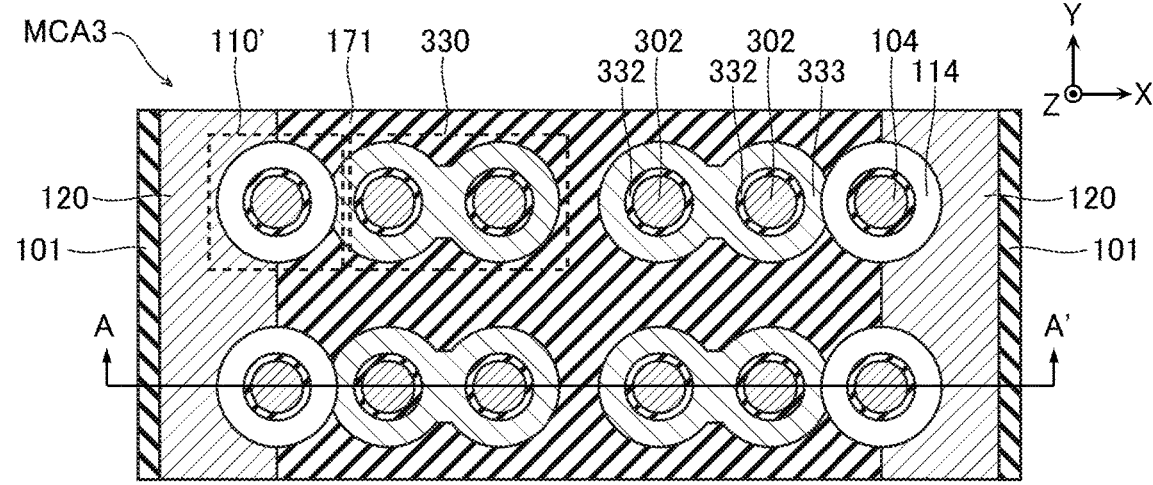
FIG. 68 is a schematic X-Y cross-sectional view illustrating a configuration of apart of a semiconductor memory device according to a third embodiment.
Figure 69:
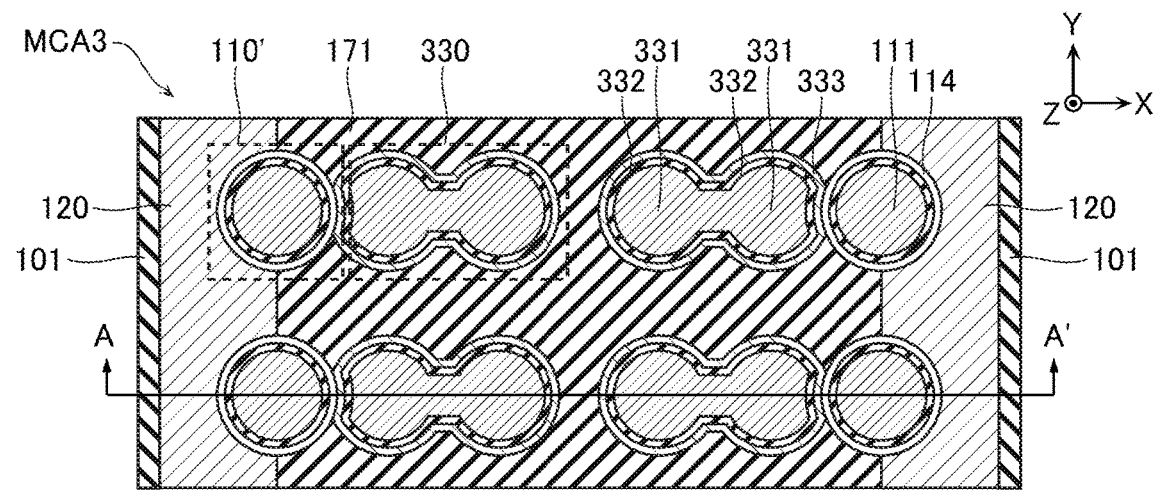
FIG. 69 is a schematic X-Y cross-sectional view illustrating a configuration of a part of the semiconductor memory device.
Figure 70:
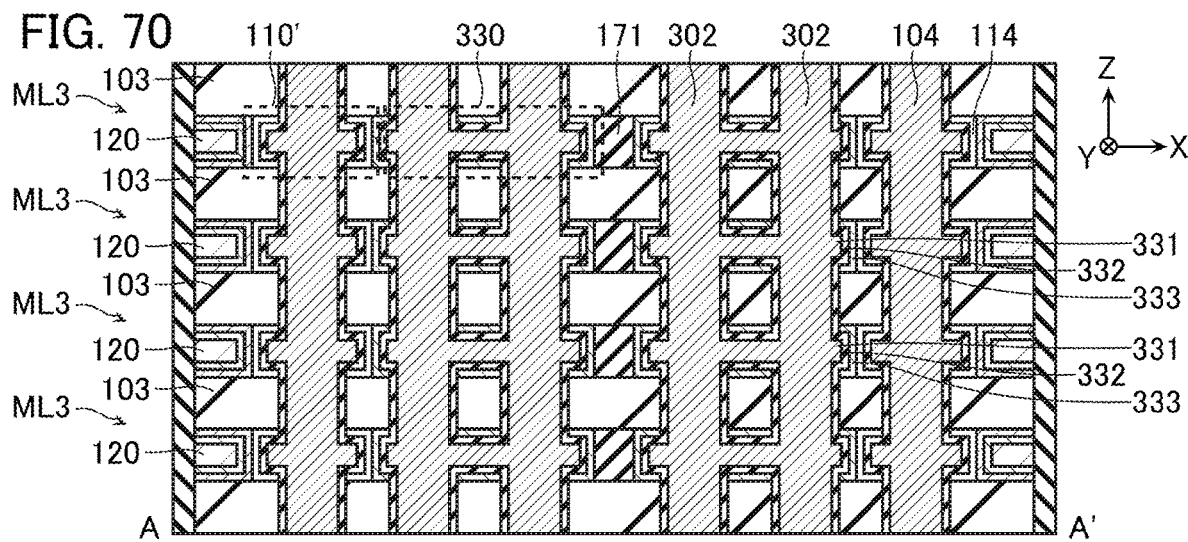
FIG. 70 is a schematic X-Z cross-sectional view of a configuration illustrated in FIG. 68 and FIG. 69 taken along the line A-A' and viewed along the arrow direction.

FIG. 68 and FIG. 69 is a schematic X-Y cross-sectional view illustrating a configuration of a part of a semiconductor memory device according to the third embodiment. FIG. 68 and FIG. 69 indicate cross-sectional surfaces of different height positions. FIG. 70 is a schematic X-Z cross-sectional view of a configuration illustrated in FIG. 68 and FIG. 69 taken along the line and viewed along an arrow direction.

In the following description, configurations similar to those of the first embodiment are attached by the same reference numerals and their descriptions are omitted.

As illustrated in FIG. 68, a memory cell array MCA3 according to the third embodiment includes the plurality of insulating layers 101 arranged in the X-direction. Furthermore, as illustrated in FIG. 70, a plurality of memory layers ML3 arranged in the Z-direction via the insulating layers 103 are disposed between the two insulating layers 101 arranged in the X-direction. Furthermore, a plurality of conductive layers 104 and 302 extending in the Z-direction and arranged in the X-direction and the Y-direction are disposed between the two insulating layers 101 arranged in the X-direction. The plurality of conductive layers 104 are partially disposed near one of these two insulating layers 101 and arranged in the Y-direction. Furthermore, the plurality of conductive layers 104 are partially disposed near the other of these two insulating layers 101 and arranged in the Y-direction. Each of the conductive layers 302 is disposed corresponding to any of the plurality of conductive layers 104. In the illustrated example, two conductive layers 302 are disposed corresponding to one conductive layer 104. The conductive layers 302 are arranged with the corresponding conductive layer 104 in the X-direction. The memory layer ML3 includes a plurality of transistor structures 110' disposed along the outer circumferential surfaces of a plurality of conductive layers 104, a conductive layer 120 disposed between the plurality of transistor structures 110' and the insulating layer 101, and a plurality of capacitor structures 330 disposed along outer circumferential surfaces of a plurality of conductive layers 302.

The transistor structure 110' is basically configured similarly to the transistor structure 110 according to the first embodiment. However, in a X-Y cross-sectional surface exemplarily illustrated in FIG. 69, the outer circumferential surfaces of the conductive layer 111, the conductive layer 112, the insulating layer 113, and the semiconductor layer 114 may be formed along the circle around the center position of the conductive layer 104 (FIG. 68) over the whole circumference.

The conductive layer 302 contains, for example, a stacked structure of titanium nitride (TiN) and tungsten (W). The conductive layer 302 functions as, for example, the plate line PL (FIG. 2).

The capacitor structure 330, as illustrated in FIG. 70, for example, includes a conductive layer 331, an insulating layer 332 disposed on an upper surface, a lower surface, and side surfaces in the X-direction and the Y-direction of the conductive layer 331, and a conductive layer 333 disposed on an upper surface, a lower surface, and side surfaces in the X-direction and the Y-direction of the insulating layer 332.

In the X-Y cross-sectional surface exemplarily illustrated in FIG. 69, the outer circumferential surfaces of these configurations may be formed along circles around center positions of the conductive layers 302 (FIG. 68).

The conductive layer 331 functions as one electrode of the capacitor Cap (FIG. 2). The conductive layer 331 contains, for example, a stacked structure of titanium nitride (TiN) and tungsten (W). As illustrated in FIG. 70, a plurality of conductive layers 331 arranged in the Z-direction are connected in common to the conductive layer 302 extending in the Z-direction.

The insulating layer 332 functions as the insulating layer of the capacitor Cap (FIG. 2). The insulating layer 332 may be, for example, alumina ($Al_2O_3$) or another insulating metal oxide.

The conductive layer 333 functions as, for example, the other electrode of the capacitor Cap (FIG. 2). The conductive layer 333 contains, for example, indium tin oxide (ITO). The conductive layer 333 is insulated from the conductive layer 331 via the insulating layer 332. The conductive layer 333 is connected to the side surface of the semiconductor layer 114 in the X-direction.

[Manufacturing Method]

FIG. 71 to FIG. 89 are schematic cross-sectional views for describing the manufacturing method of the semiconductor memory device according to the third embodiment. FIG. 71, FIG. 73, FIG. 75, FIG. 77, FIG. 79, FIG. 81, FIG. 84, and FIG. 87 indicate portions corresponding to FIG. 68. FIG. 82, FIG. 85, and FIG. 88 indicate portions corresponding to FIG. 69. FIG. 72, FIG. 74, FIG. 76, FIG. 78, FIG. 80, FIG. 83, FIG. 86, and FIG. 89 indicate portions corresponding to FIG. 70.

Among the manufacturing process of the semiconductor memory device according to the first embodiment, the process described with reference to FIG. 8 is performed in the manufacturing method.

Figure 71:
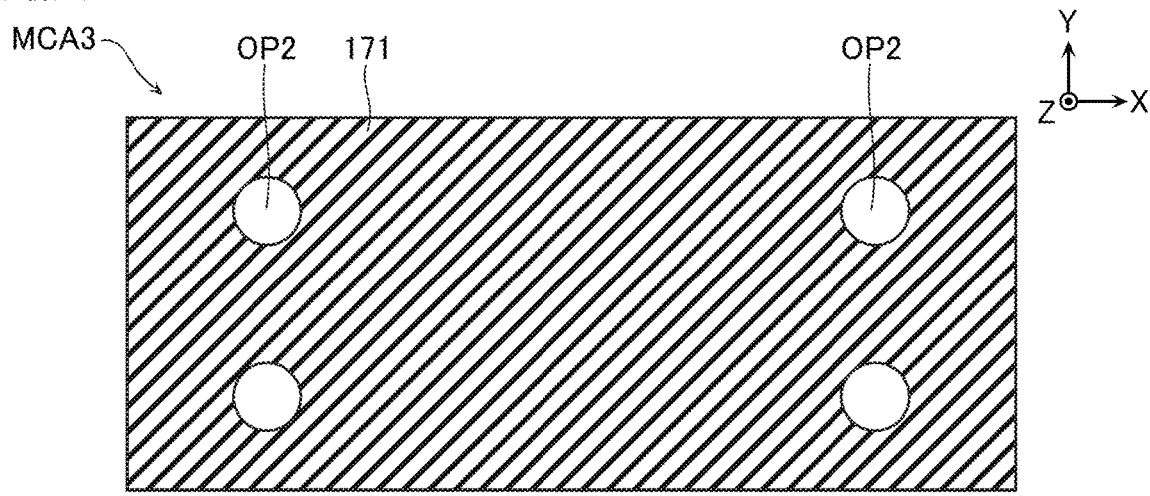
FIG. 71 is a schematic cross-sectional view for describing a manufacturing method of the semiconductor memory device according to the third embodiment.
Figure 72:
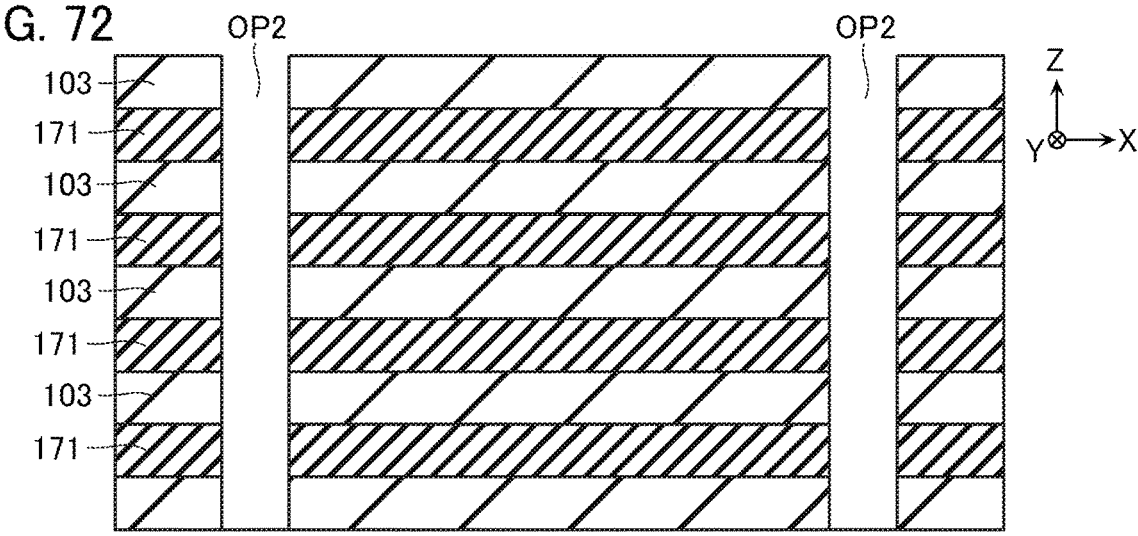
FIG. 72 is a schematic cross-sectional view for describing the manufacturing method.

Next, as illustrated in FIG. 71 and FIG. 72, for example, an opening OP2 is formed in a position corresponding to the conductive layer 104. This process is performed by a method, such as RIE.

Figure 73:
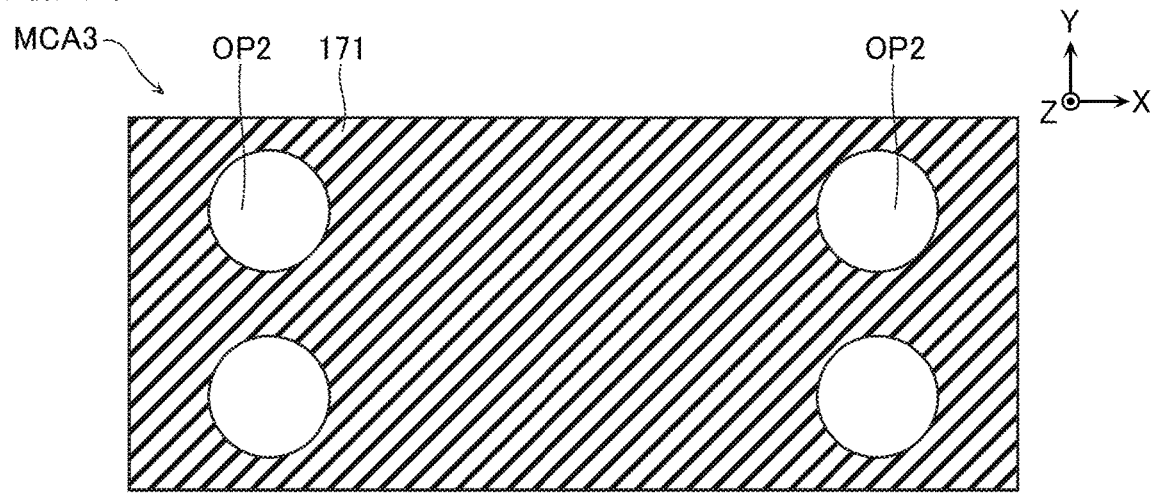
FIG. 73 is a schematic cross-sectional view for describing the manufacturing method.
Figure 74:
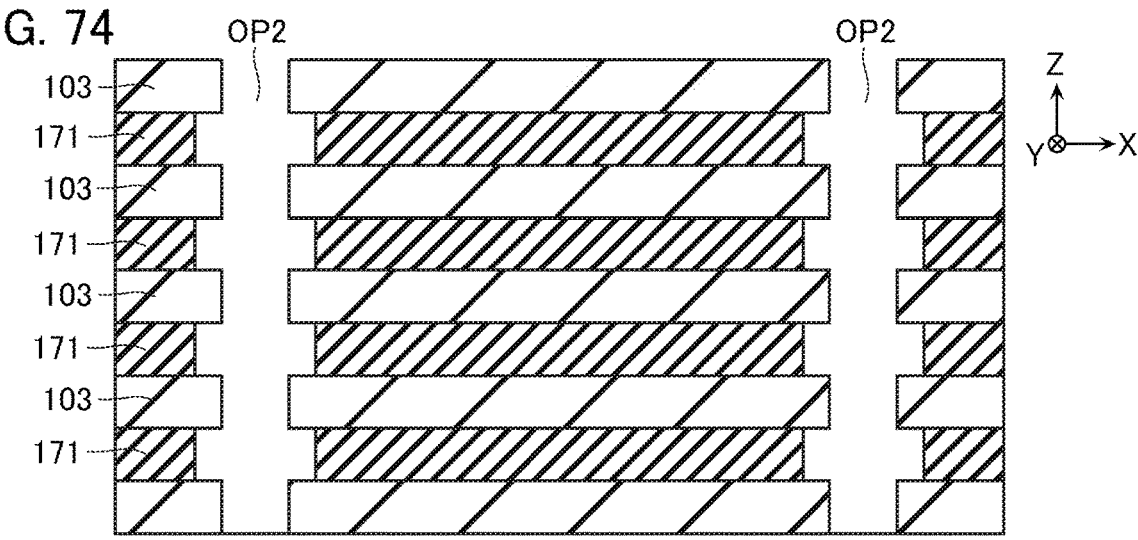
FIG. 74 is a schematic cross-sectional view for describing the manufacturing method.

Next, as illustrated in FIG. 73 and FIG. 74, for example, the sacrifice layer 171 is partially and selectively removed via the opening OP2. In this process, the sacrifice layer 171 is removed to an extent that the two openings OP2 adjacent in the Y-direction do not mutually communicate. This process is performed by a method, such as wet etching.

Figure 75:
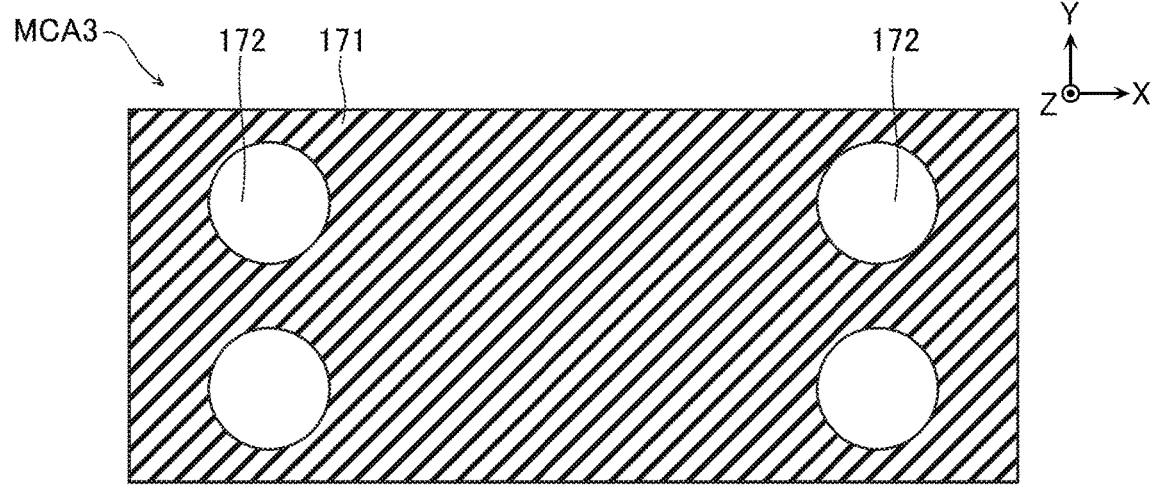
FIG. 75 is a schematic cross-sectional view for describing the manufacturing method.
Figure 76:
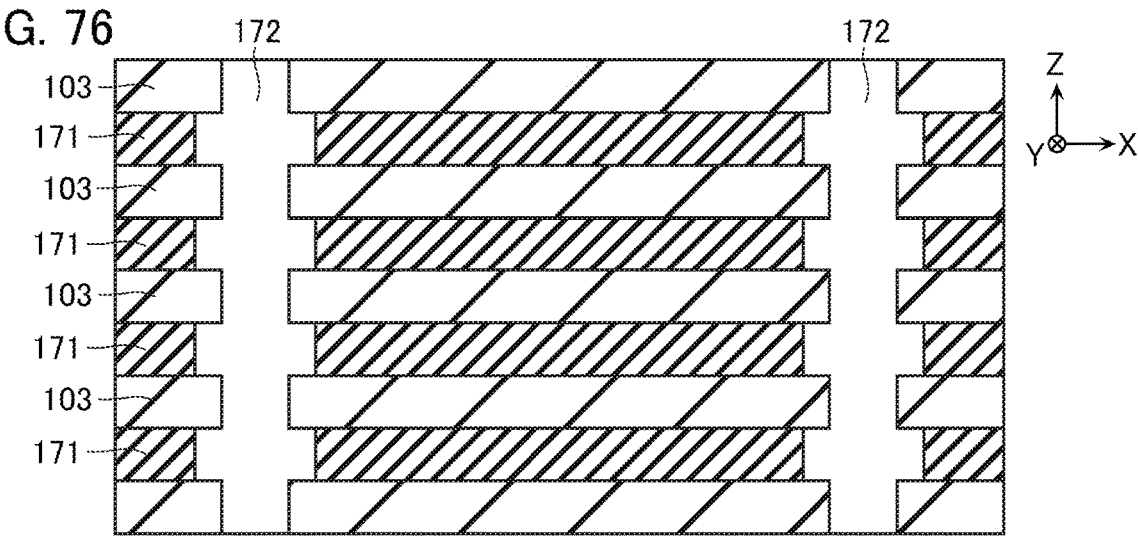
FIG. 76 is a schematic cross-sectional view for describing the manufacturing method.

Next, as illustrated in FIG. 75 and FIG. 76, for example, a sacrifice layer 172 is formed inside the opening OP2. This process is performed by a method, such as CVD.

Figure 77:
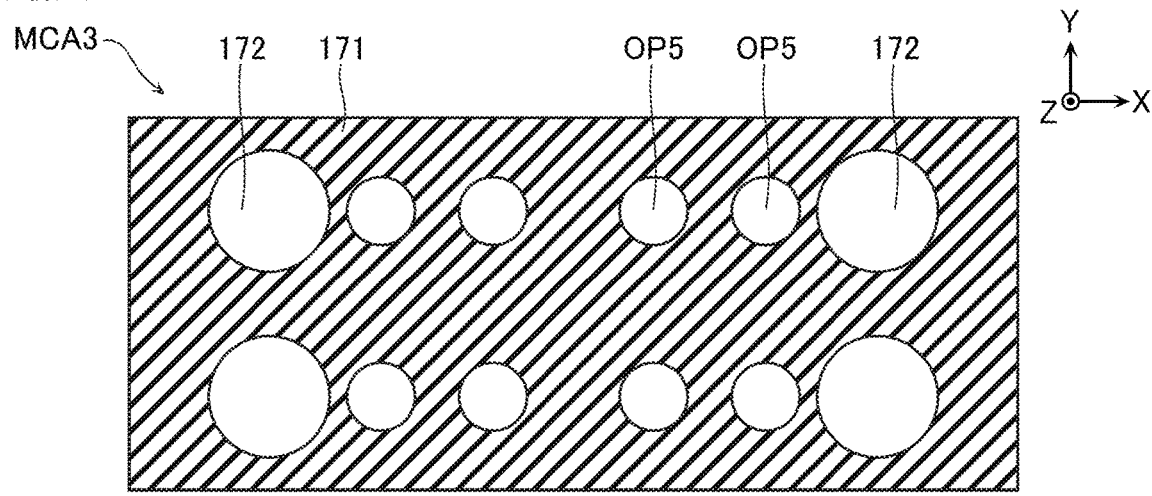
FIG. 77 is a schematic cross-sectional view for describing the manufacturing method.
Figure 78:
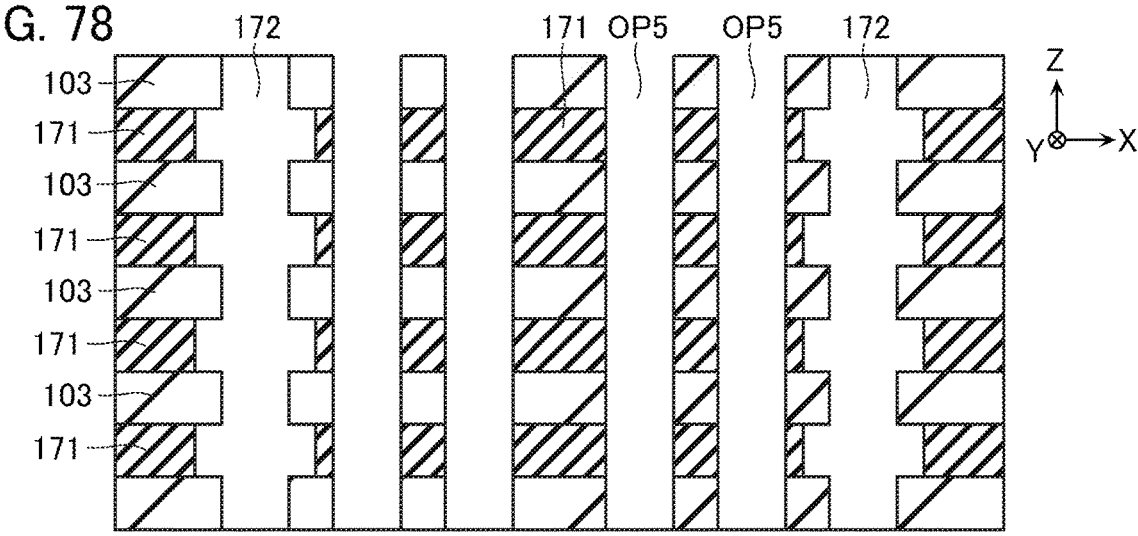
FIG. 78 is a schematic cross-sectional view for describing the manufacturing method.

Next, as illustrated in FIG. 77 and FIG. 78, for example, openings OP5 are formed in positions corresponding to the conductive layers 302. As illustrated in FIG. 78, the opening OP5 extends in the Z-direction and penetrates a plurality of insulating layers 103 and a plurality of sacrifice layers 171 arranged in the Z-direction. This process is performed by a method, such as RIE.

Figure 79:
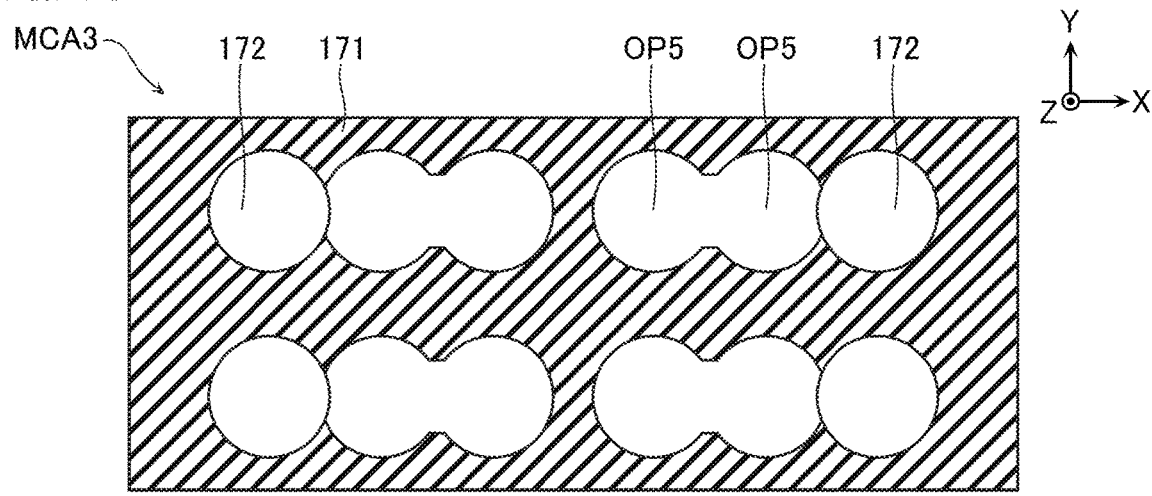
FIG. 79 is a schematic cross-sectional view for describing the manufacturing method.
Figure 80:
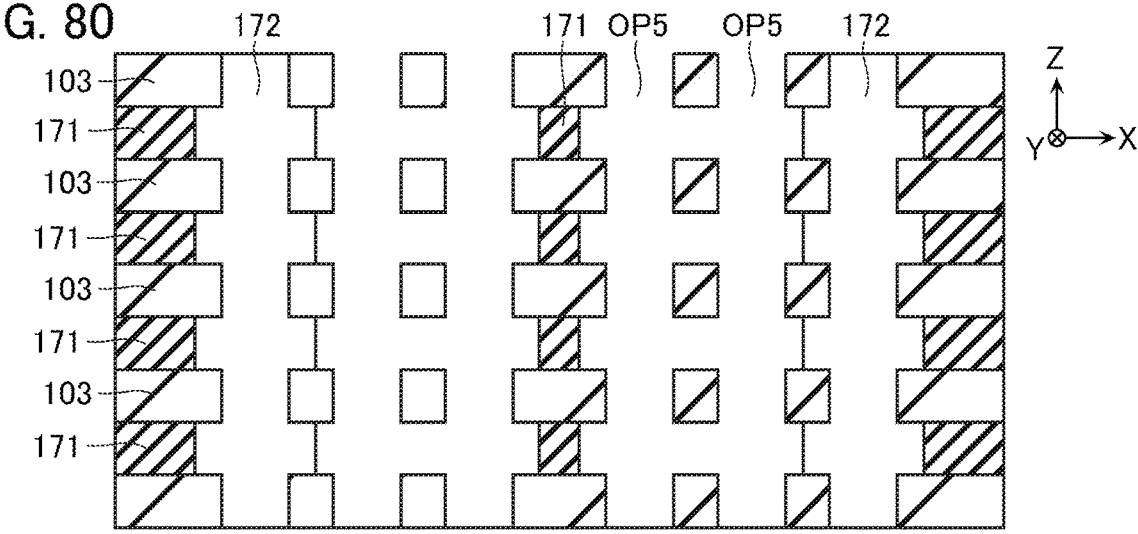
FIG. 80 is a schematic cross-sectional view for describing the manufacturing method.

Next, as illustrated in FIG. 79 and FIG. 80, for example, the sacrifice layer 171 is partially and selectively removed via the opening OP5. In this process, the outer circumferential surface of the sacrifice layer 172 is partially exposed inside the opening OP5. Furthermore, in this process, the two openings OP5 adjacent in the X-direction mutually communicate. This process is performed by a method, such as wet etching.

Figure 81:
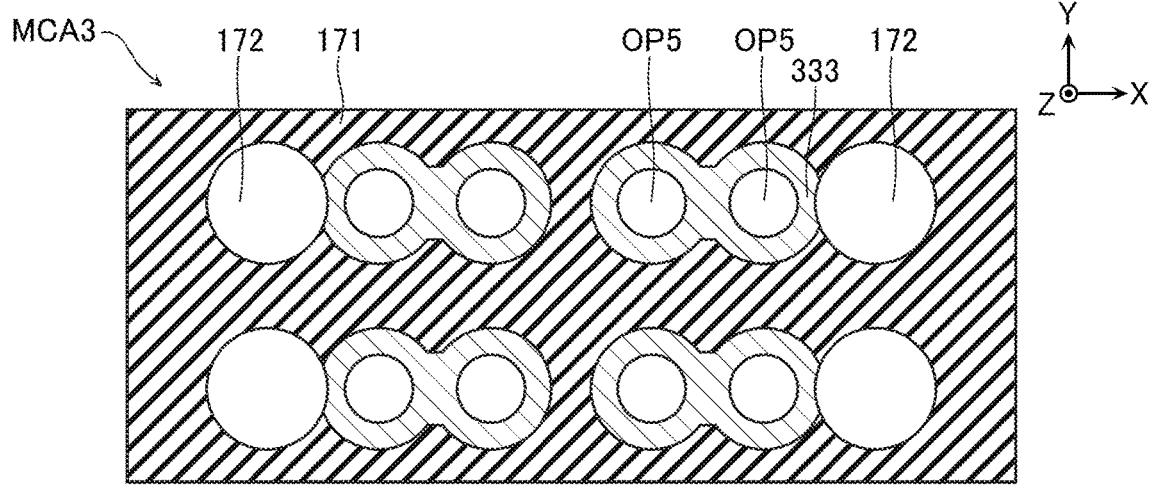
FIG. 81 is a schematic cross-sectional view for describing the manufacturing method.
Figure 82:
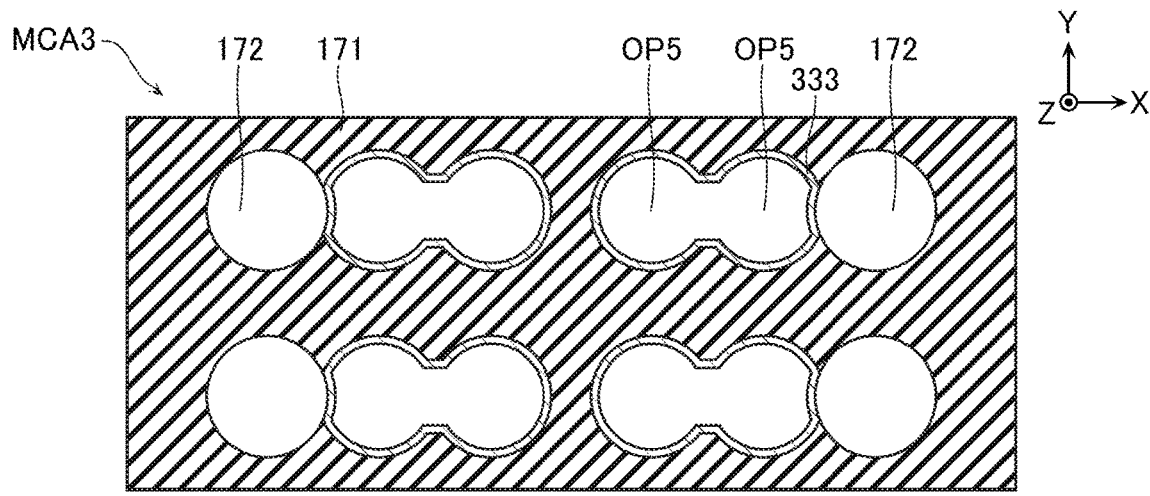
FIG. 82 is a schematic cross-sectional view for describing the manufacturing method.
Figure 83:
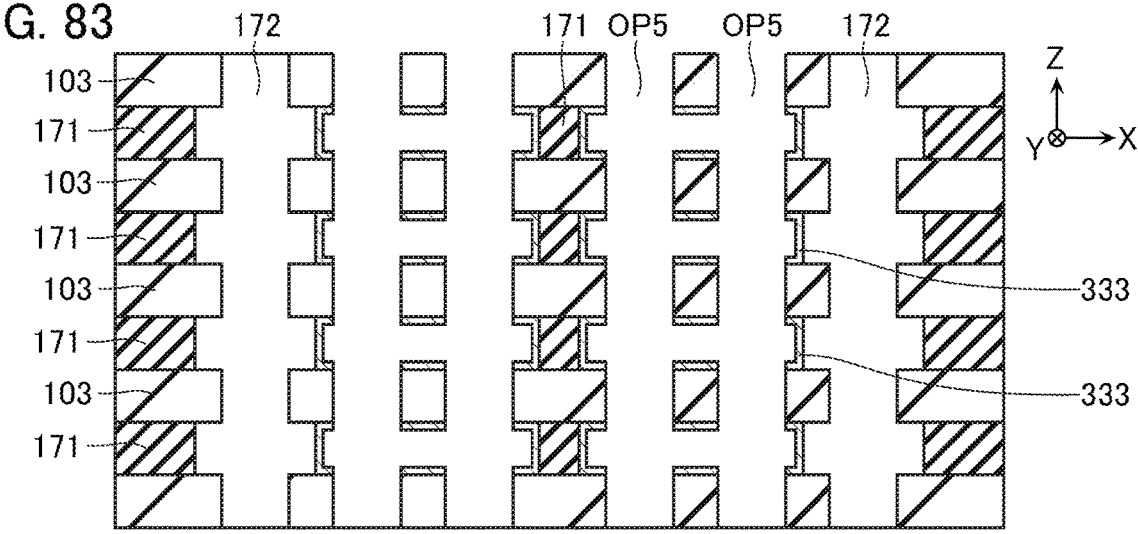
FIG. 83 is a schematic cross-sectional view for describing the manufacturing method.

Next, as illustrated in FIG. 81 to FIG. 83, for example, the conductive layers 333 are formed on surfaces exposed to the opening OP2 of the sacrifice layer 171 (parts of the inner circumferential surface of the opening OP2) and upper surfaces and lower surfaces of the insulating layers 103 (FIG. 83) via the opening OP5. This process is performed, for example, similarly to the process described with reference to FIG. 41 to FIG. 47. However, in this process, the conductive layer 333 is formed instead of the semiconductor layer 114.

Figure 84:
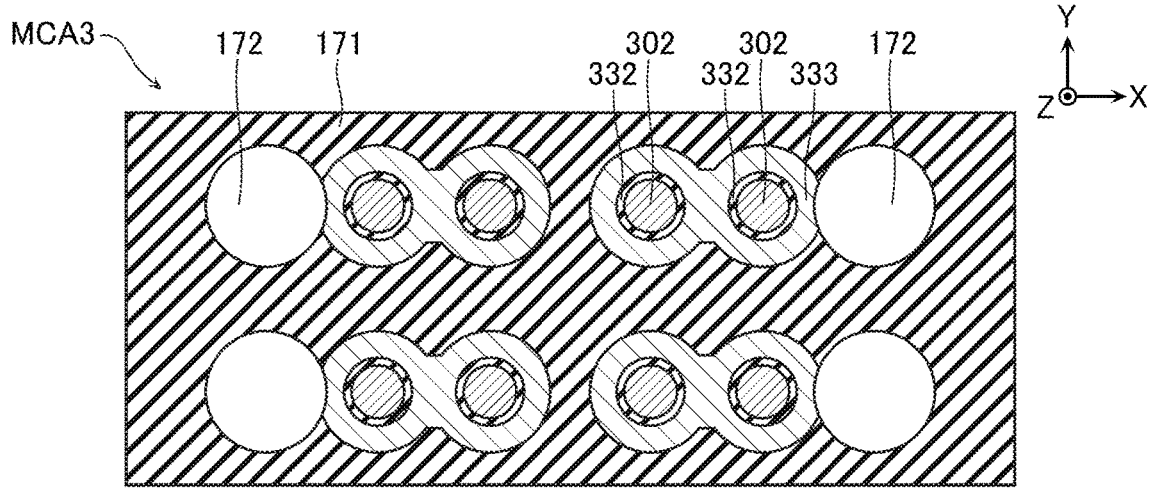
FIG. 84 is a schematic cross-sectional view for describing the manufacturing method.
Figure 85:
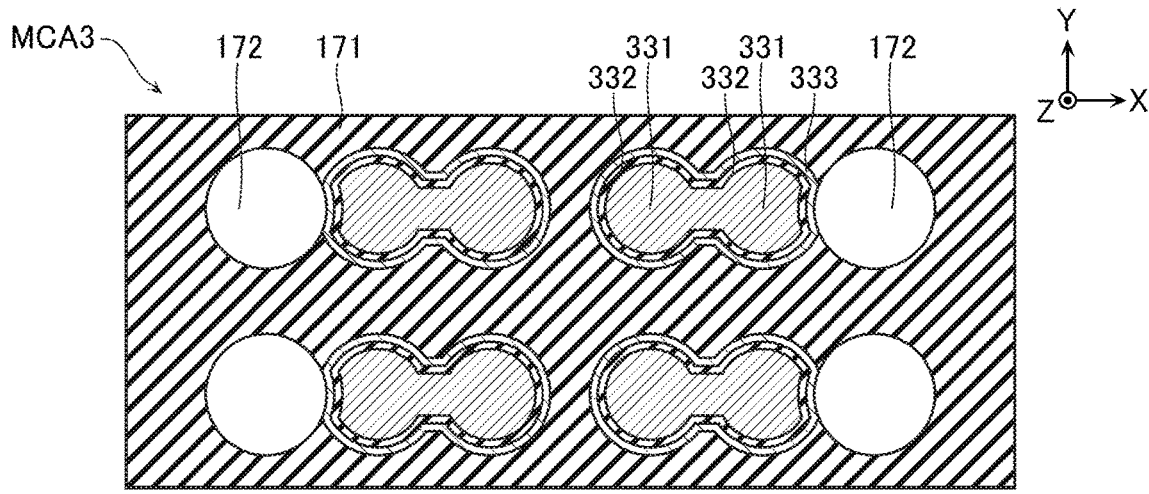
FIG. 85 is a schematic cross-sectional view for describing the manufacturing method.
Figure 86:
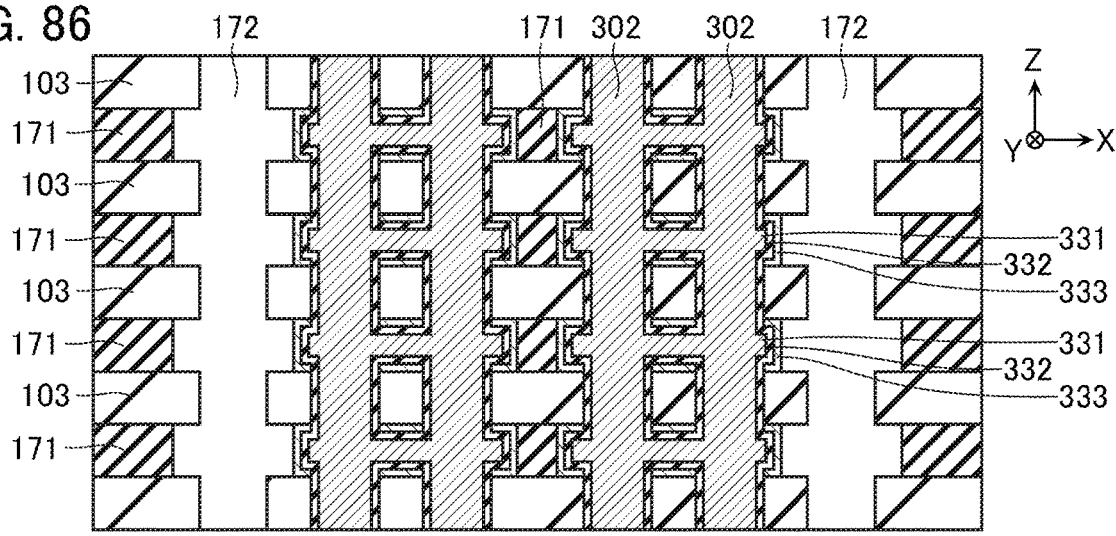
FIG. 86 is a schematic cross-sectional view for describing the manufacturing method.

Next, as illustrated in FIG. 84 to FIG. 86, for example, the insulating layer 332 and the conductive layer 331 are formed inside the opening OP5. This process is performed by a method, such as CVD.

Figure 87:
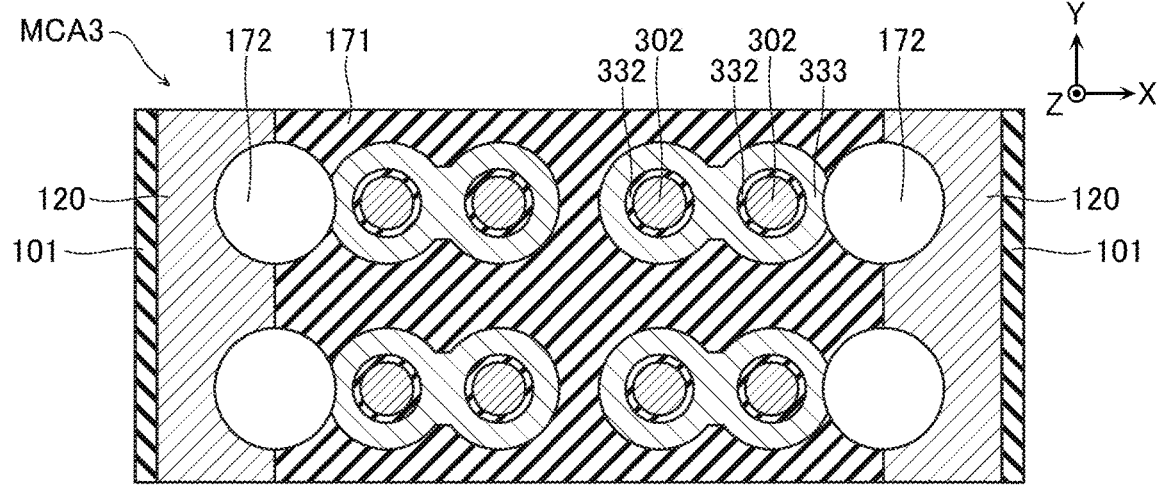
FIG. 87 is a schematic cross-sectional view for describing the manufacturing method.
Figure 88:
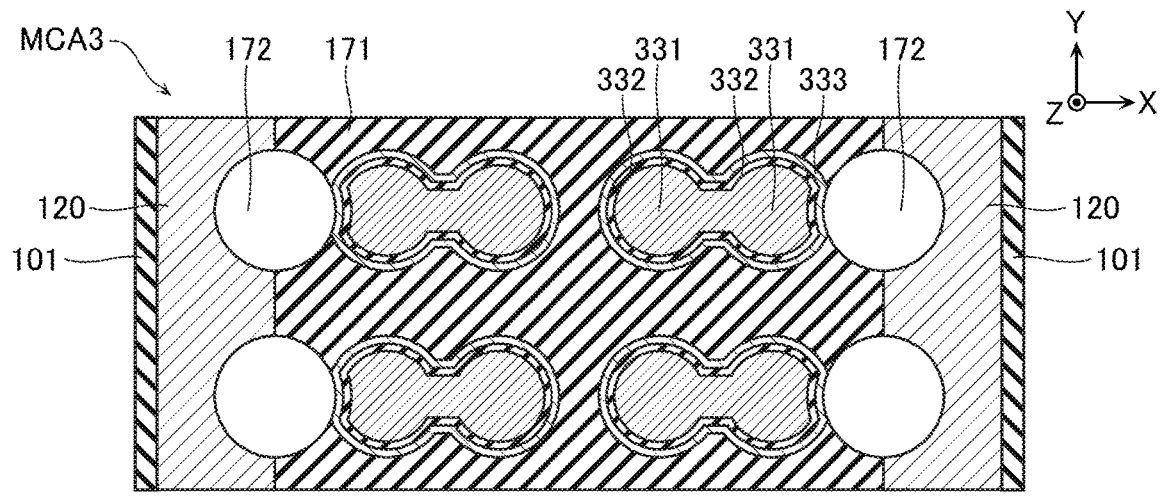
FIG. 88 is a schematic cross-sectional view for describing the manufacturing method.
Figure 89:
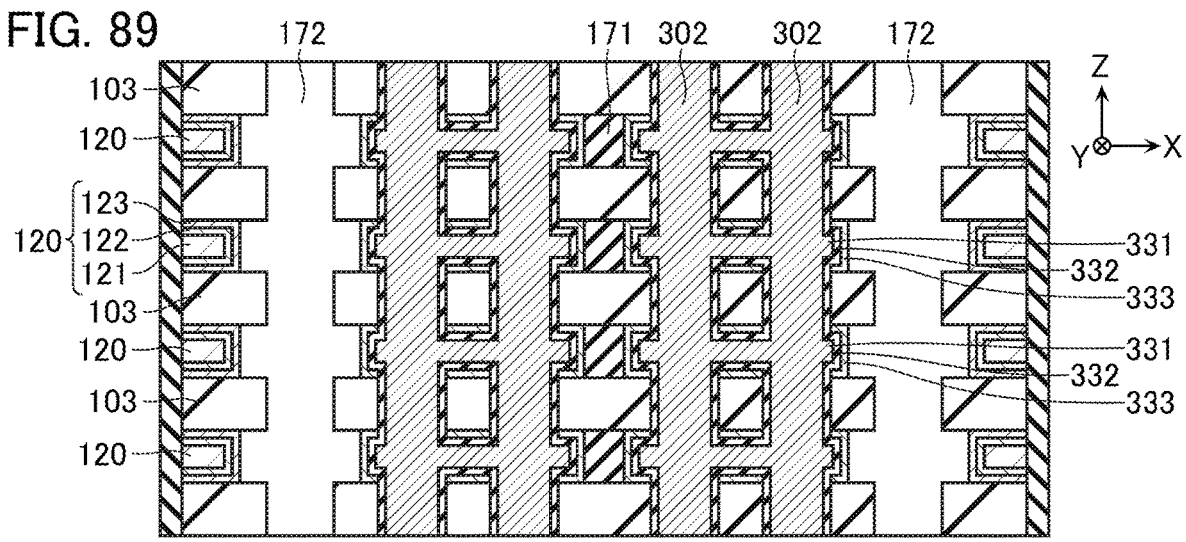
FIG. 89 is a schematic cross-sectional view for describing the manufacturing method.

Next, as illustrated in FIG. 87 to FIG. 89, for example, the conductive layer 120 and the insulating layer 101 are formed. This process is performed, for example, similarly to the process described with reference to FIG. 33 to FIG. 38.

Next, as illustrated in FIG. 68 to FIG. 70, for example, the transistor structure 110 is formed. Among the manufacturing processes of the semiconductor memory device according to the first embodiment, this process is performed, for example, similarly to the process after the process described with reference to FIG. 39 and FIG. 40. Accordingly, a structure described with reference to FIG. 68 to FIG. 70 is formed.

[Effect]

The semiconductor memory device according to the embodiment can exert an effect similar to that of the semiconductor memory device according to the first embodiment.

Other Embodiments

The semiconductor memory devices according to the first embodiment to the third embodiment have been described above. However, the semiconductor memory devices according to these embodiments are only examples and specific configurations and operations are adjustable as appropriate.

For example, as described with reference to FIG. 1 to FIG. 7, the semiconductor memory device according to the first embodiment include the transistor structure 110 and the capacitor structure 130. Furthermore, for example, as described with reference to FIG. 48 to FIG. 53, the semiconductor memory device according to the second embodiment included the transistor structure 210 and the capacitor structure 130. Furthermore, for example, as described with reference to FIG. 68 to FIG. 70, the semiconductor memory device according to the third embodiment included the transistor structure 110' and the capacitor structure 330. However, such configuration is only an example and specific configurations are adjustable as appropriate. For example, the semiconductor memory device according to the third embodiment may include the transistor structure 210 (FIG. 48 to FIG. 53) instead of the transistor structure 110'.

Furthermore, in the above description, examples in which the capacitor Cap is connected to the transistor structures 110 and 210 have been described. In such examples, the shape, structure, and the like of the capacitor Cap are adjustable as appropriate.

Furthermore, in the above description, examples in which the capacitor Cap is employed as the memory portion connected to the transistor structures 110 and 210 have been described. However, the memory portion need not be the capacitor Cap. For example, the memory portion may be one that contains a chalcogen material, such as ferroelectric, ferromagnet or GeSbTe, or another material and stores data using the characteristics of these materials. For example, in any of the structures described above, any of these materials may be included in the insulating layer between the electrodes forming the capacitor Cap.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a plurality of memory portions arranged in a first direction;
    a plurality of semiconductor layers arranged in the first direction and electrically connected to the plurality of memory portions respectively;
    a plurality of gate electrodes arranged in the first direction and opposed to the plurality of semiconductor layers respectively;
    a plurality of gate insulating films disposed between the plurality of semiconductor layers and the plurality of gate electrodes respectively;
    a first wiring extending in the first direction and directly connected to the plurality of semiconductor layers; and
    a plurality of second wirings arranged in the first direction and directly connected to the plurality of gate electrodes respectively, wherein
    the plurality of semiconductor layers are opposed to surfaces on one side and the other side of each of the plurality of gate electrodes in the first direction via the gate insulating film, and
    when a cross-sectional surface that extends in the first direction and a second direction intersecting with the first direction and includes the plurality of gate electrodes is assumed to be a first cross-sectional surface,
    in the first cross-sectional surface, the plurality of semiconductor layers are opposed to side surfaces on one side and the other side of each of the plurality of gate electrodes in the second direction via the gate insulating film.

2. The semiconductor memory device according to claim 1, wherein
    when a cross-sectional surface that is perpendicular to the first direction and includes a part of one of the plurality of semiconductor layers is assumed to be a second cross-sectional surface,
    in the second cross-sectional surface, one of the plurality of semiconductor layers surrounds an outer circumferential surface of the first wiring.

3. The semiconductor memory device according to claim 1, wherein
    when a cross-sectional surface that is perpendicular to the first direction and includes a part of one of the plurality of gate electrodes is assumed to be a third cross-sectional surface,
    in the third cross-sectional surface, one of the plurality of gate electrodes surrounds an outer circumferential surface of the first wiring.

4. The semiconductor memory device according to claim 1, comprising:

a plurality of first electrodes arranged in the first direction and connected to the plurality of semiconductor layers in a third direction intersecting with the first direction respectively;

a second electrode opposed to the plurality of first electrodes; and a first insulating film disposed between the plurality of first electrodes and the second electrode.

5. The semiconductor memory device according to claim 1, wherein the plurality of memory portions are a plurality of capacitors.

6. The semiconductor memory device according to claim 1, wherein each of the plurality of semiconductor layers contains an oxide semiconductor.

7. The semiconductor memory device according to claim 1, wherein each of the plurality of semiconductor layers contains at least one element of gallium (Ga) and aluminum (Al), and contains indium (In), zinc (Zn), and oxygen (O).

8. The semiconductor memory device according to claim 1, wherein one of the plurality of second wirings and corresponding one of the plurality of gate electrodes are integrally formed.

9. A semiconductor memory device comprising:

a plurality of memory portions arranged in a first direction;

a plurality of semiconductor layers arranged in the first direction and electrically connected to the plurality of memory portions respectively;

a plurality of gate electrodes arranged in the first direction and opposed to the plurality of semiconductor layers respectively;

a plurality of gate insulating films disposed between the plurality of semiconductor layers and the plurality of gate electrodes respectively;

a first wiring extending in the first direction and directly connected to the plurality of semiconductor layers; and a plurality of second wirings arranged in the first direction and directly connected to the plurality of gate electrodes respectively, wherein the plurality of semiconductor layers are opposed to surfaces on one side and the other side of each of the plurality of gate electrodes in the first direction via the gate insulating film, and when a cross-sectional surface that is perpendicular to the first direction and includes a part of one of the plurality of semiconductor layers is assumed to be a second cross-sectional surface, in the second cross-sectional surface, one of the plurality of semiconductor layers surrounds an outer circumferential surface of the first wiring.

10. The semiconductor memory device according to claim 9, comprising:

a plurality of first electrodes arranged in the first direction and connected to the plurality of semiconductor layers in a third direction intersecting with the first direction respectively;

a second electrode opposed to the plurality of first electrodes; and a first insulating film disposed between the plurality of first electrodes and the second electrode.

11. The semiconductor memory device according to claim 9, wherein the plurality of memory portions are a plurality of capacitors.

12. The semiconductor memory device according to claim 9, wherein each of the plurality of semiconductor layers contains an oxide semiconductor.

13. The semiconductor memory device according to claim 9, wherein each of the plurality of semiconductor layers contains at least one element of gallium (Ga) and aluminum (Al), and contains indium (In), zinc (Zn), and oxygen (O).

14. The semiconductor memory device according to claim 9, wherein one of the plurality of second wirings and corresponding one of the plurality of gate electrodes are integrally formed.

15. A semiconductor memory device comprising:

a plurality of memory portions arranged in a first direction;

a plurality of semiconductor layers arranged in the first direction and electrically connected to the plurality of memory portions respectively;

a plurality of gate electrodes arranged in the first direction and opposed to the plurality of semiconductor layers respectively;

a plurality of gate insulating films disposed between the plurality of semiconductor layers and the plurality of gate electrodes respectively;

a first wiring extending in the first direction and directly connected to the plurality of semiconductor layers; and a plurality of second wirings arranged in the first direction and directly connected to the plurality of gate electrodes respectively, wherein the plurality of semiconductor layers are opposed to surfaces on one side and the other side of each of the plurality of gate electrodes in the first direction via the gate insulating film, and when a cross-sectional surface that is perpendicular to the first direction and includes a part of one of the plurality of gate electrodes is assumed to be a third cross-sectional surface, in the third cross-sectional surface, one of the plurality of gate electrodes surrounds an outer circumferential surface of the first wiring.

16. The semiconductor memory device according to claim 15, comprising:

a plurality of first electrodes arranged in the first direction and connected to the plurality of semiconductor layers in a third direction intersecting with the first direction respectively;

a second electrode opposed to the plurality of first electrodes; and a first insulating film disposed between the plurality of first electrodes and the second electrode.

17. The semiconductor memory device according to claim 15, wherein the plurality of memory portions are a plurality of capacitors.

18. The semiconductor memory device according to claim 15, wherein each of the plurality of semiconductor layers contains an oxide semiconductor.

19. The semiconductor memory device according to claim 15, wherein each of the plurality of semiconductor layers contains at least one element of gallium (Ga) and aluminum (Al), and contains indium (In), zinc (Zn), and oxygen (O).

20. The semiconductor memory device according to claim 15, wherein
one of the plurality of second wirings and corresponding one of the plurality of gate electrodes are integrally formed.

* * * * *